(12) United States Patent
Swanson

(10) Patent No.: US 6,590,517 B1
(45) Date of Patent: *Jul. 8, 2003

(54) ANALOG TO DIGITAL CONVERSION CIRCUITRY INCLUDING BACKUP CONVERSION CIRCUITRY

(76) Inventor: Eric J. Swanson, 850 Jerry's La., Buda, TX (US) 78610

( * ) Notice: Subject to any disclaimer, the term of this patent is extended or adjusted under 35 U.S.C. 154(b) by 0 days.

This patent is subject to a terminal disclaimer.

(21) Appl. No.: 10/061,791

(22) Filed: Feb. 1, 2002

Related U.S. Application Data

(63) Continuation-in-part of application No. 09/945,926, filed on Sep. 4, 2001, now Pat. No. 6,414,619, which is a continuation of application No. 09/442,026, filed on Nov. 17, 1999, now Pat. No. 6,288,664, said application No. 10/061,791, is a continuation-in-part of application No. 09/429,001, filed on Oct. 29, 1999, now Pat. No. 6,369,740.
(60) Provisional application No. 60/161,099, filed on Oct. 22, 1999.

(51) Int. Cl.⁷ ............................................. H03M 1/12
(52) U.S. Cl. ................................... 341/155; 341/139
(58) Field of Search ............................... 341/155, 139, 341/132, 172, 110

(56) References Cited

U.S. PATENT DOCUMENTS

| | | | |
|---|---|---|---|
| 3,187,323 A | 6/1965 | Flood et al. | 340/347 |
| 4,016,557 A | 4/1977 | Zitelli et al. | 340/347 |
| 4,070,709 A | 1/1978 | Roberts et al. | 364/602 |
| 4,077,035 A | 2/1978 | Yee | 340/347 |
| 4,129,863 A | 12/1978 | Gray et al. | 340/347 |
| 4,129,864 A | 12/1978 | Carpenter et al. | 340/347 |
| 4,200,863 A | 4/1980 | Hodges et al. | 340/347 |
| 4,385,286 A | 5/1983 | Haque | 340/347 |
| 4,455,676 A | 6/1984 | Kaneda | 381/106 |

(List continued on next page.)

OTHER PUBLICATIONS

Allen and Holberg, *CMOS Analog Circuit Design*, Oxford University Press, (pp. 490–497; 529–544) 1987.
Ohri and Callahan, "Integrated PCM Codec," IEEE JSSC, vol. SC–14, No. 1, (pp. 38–46) Feb. 1979.
Tan, Kiriaki, De Wit, Fattaruso, Tsay, Matthews, and Hester, "Error Correction Techniques for High–Performance Differential A/D Converters," IEEE JSCC, vol. SC–25, No. 6 (pp. 1318–1327) Dec. 1990.
Linear Technology Data Sheet LTC1100, "Precision, Chopper–Stabilized Instrumentation Amplifier" pp. 1–8 1994.
Fotouhi, Bahram, "High–Resolution Successive–Approximation Analog–to–Digital Conversion Techniques in MOS Integrated Circuits," Dissertation from The University of California, Berkeley, (pp. 86–95; 158–162) 1980.

(List continued on next page.)

*Primary Examiner*—Brian Young
(74) *Attorney, Agent, or Firm*—O'Keefe, Egan & Peterman, LLP

(57) ABSTRACT

An autoranging analog to digital conversion system is provided. The system may include a digitally programmable preamplifier for amplifying a difference between an analog input and an estimate of the analog input. The preamplifier may be coupled to an analog to digital converter for converting the preamplifier output to a digital signal. The system may also include digital domain predictor or estimation logic for determining an optimum gain and analog input estimate for a given analog input. Multiple signal input channels may be coupled to the analog to digital conversion system. The autoranging estimations may be performed on a sample by sample basis or a channel by channel basis. The conversion system may also include the use of a backup conversion path for use when the main conversion path overranges. The backup conversion path may utilize a dedicated backup converter. The backup conversion path may alternatively utilize the estimation converter to generate backup conversions or may utilize the main converter to generate backup conversions.

44 Claims, 30 Drawing Sheets

U.S. PATENT DOCUMENTS

| | | | |
|---|---|---|---|
| 4,542,304 A | 9/1985 | Swanson | 307/353 |
| 4,559,523 A | 12/1985 | Wakita | 340/347 |
| 4,570,080 A | 2/1986 | Swanson | 307/353 |
| 4,585,956 A | 4/1986 | Lie | 307/353 |
| 4,611,342 A | 9/1986 | Miller et al. | 381/36 |
| 4,616,210 A | 10/1986 | Ferber et al. | 340/347 |
| 4,628,279 A | 12/1986 | Nelson | 330/257 |
| 4,709,225 A | 11/1987 | Welland et al. | 340/347 |
| 4,733,217 A | 3/1988 | Dingwall | 340/347 |
| 4,748,418 A | 5/1988 | Kerth | 330/9 |
| 4,815,118 A | 3/1989 | Acharya et al. | 378/19 |
| 4,939,516 A | 7/1990 | Early | 341/143 |
| 4,943,807 A | 7/1990 | Early et al. | 341/120 |
| 5,006,853 A | 4/1991 | Kiraki et al. | 341/156 |
| 5,039,989 A | 8/1991 | Welland et al. | 341/143 |
| 5,053,771 A | 10/1991 | McDermott | 341/156 |
| 5,075,633 A | 12/1991 | Bowers | 330/69 |
| 5,134,401 A | 7/1992 | McCartney et al. | 341/143 |
| 5,155,431 A | 10/1992 | Holcomb | 324/121 |
| 5,157,395 A | 10/1992 | Del Signore et al. | 341/143 |
| 5,177,453 A | 1/1993 | Russell et al. | 330/284 |
| 5,194,865 A | 3/1993 | Mason et al. | 341/132 |
| 5,220,589 A | 6/1993 | Gard | 378/19 |
| 5,233,309 A | 8/1993 | Spitalny et al. | 330/84 |
| 5,247,210 A | 9/1993 | Swanson | 307/355 |
| 4,939,516 A | 10/1993 | Early | 341/143 |
| 5,268,651 A | 12/1993 | Kerth | 330/307 |
| 5,319,319 A | 6/1994 | Kerth | 330/295 |
| 5,446,371 A | 8/1995 | Eccleston et al. | 324/121 |
| 5,541,600 A | 7/1996 | Blumenkrantz et al. | 341/139 |
| 5,600,317 A | 2/1997 | Knoth et al. | 330/139 |
| 5,621,339 A | 4/1997 | Kerth et al. | 327/65 |
| 5,668,551 A | 9/1997 | Garavan et al. | 341/120 |
| 5,696,508 A | 12/1997 | Gross, Jr. et al. | 341/118 |
| 5,714,956 A | 2/1998 | Jahne et al. | 341/155 |
| 5,764,175 A | 6/1998 | Pan | 341/161 |
| 5,796,310 A | 8/1998 | Ariyosi et al. | 330/307 |
| 5,892,472 A | 4/1999 | Shu et al. | 341/139 |
| 6,144,331 A | 11/2000 | Jiang | 341/172 |
| 6,271,780 B1 | 8/2001 | Gong et al. | 341/139 |
| 6,288,664 B1 | 9/2001 | Swanson | 341/155 |
| 6,414,619 B1 * | 7/2002 | Swanson | 341/155 |

OTHER PUBLICATIONS

Holloway, Peter, "A Trimless 16b Digital Potentiometer," IEEE, ISSCC Digest, (pp. 66–67; 320–321) Feb. 22, 1984.

Donald Kerth and Douglas Piasecki, "An Oversampling Converter for Strain Gauge Transducers," IEEE JSSC, vol. SC–27, No. 12 (pp. 1689–1696) Dec. 1992.

Hae–Seung Lee and David Hodges, "A Self–Calibrating 15 Bit CMOS A/D Converter," IEEE JSSC, vol. SC–19, No. 6 (pp. 813–819) Dec. 1984.

Wait, Huelsman and Korn, *Introduction to Operational Amplifier Theory and Applications*, McGraw–Hill (pp. 31–40, 64), 1974.

Cirrus Logic, Inc., "16–Bit, 100 kHz/20 kHz A/D Converters CS5101A/CS5102A;" (pp. 1–46) Mar. 1995.

* cited by examiner

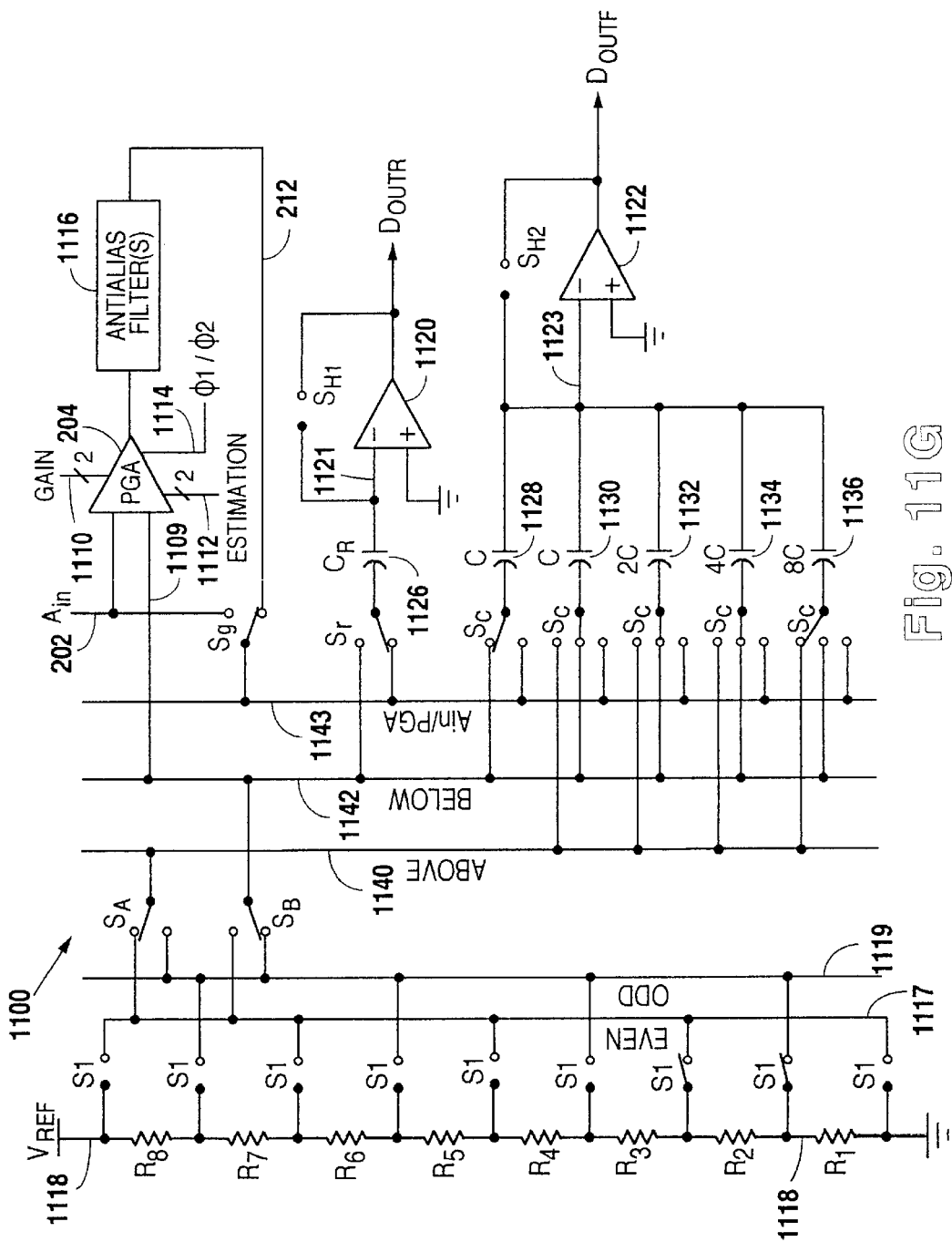

ANALOG TO DIGITAL CONVERSION CIRCUITRY INCLUDING BACKUP CONVERSION CIRCUITRY

This application is a continuation-in-part application of U.S. Ser. No. 09/945,926 filed Sep. 4, 2001 now U.S. Pat. No. 6,414,619 entitled "Autoranging Analog To Digital Conversion Circuitry" by Eric J. Swanson, which is a continuation of U.S. Ser. No. 09/442,026 filed on Nov. 17, 1999 now U.S. Pat. No. 6,288,664 entitled "Autoranging Analog To Digital Conversion Circuitry" by Eric J. Swanson, which claims priority to U.S. Provisional Application Serial No. 60/161,099 filed on Oct. 22, 1999 entitled "Programmable Gain Preamplifier" by Eric J. Swanson. This application is also a continuation-in-part of U.S. application Ser. No. 09/429,001 filed on Oct. 29, 1999 now U.S. Pat. No. 6,369,740 entitled "Programmable Gain Preamplifier Coupled To An Analog To Digital Converter" by Eric J. Swanson, the disclosures all of which are being incorporated herein by reference.

TECHNICAL FIELD

This invention relates to analog to digital conversion systems and more particularly autoranging analog to digital conversion systems.

BACKGROUND

Analog to digital converters (ADCs) may be used to convert a variety of types of analog input signals to digital outputs. Often, the analog signal requires some analog preprocessing before converting the analog signal to a digital signal. For example, the analog signal may first be amplified by a preamplifier. A common application for preamplifiers is to amplify low voltage level signals which are to be processed by ADCs that operate at higher voltage levels. For example, a preamplifier may be used to amplify a transducer output (a thermocouple output, strain gauge output, thermistor output, etc.) prior to processing the transducer output in the ADC. Transducer signals often are amplified because most transducers produce only low voltage outputs while the ADC may operate at a significantly higher voltage range. For example, a thermocouple may provide an output signal having a range of 2.5 mV while an ADC utilized to convert the thermocouple output into a digital signal may operate at a 2.5V full scale voltage. Therefore, a preamplifier may be utilized to amplify the transducer output prior to processing the output signal with the ADC. Because the ADC may have a relatively high noise density, the use of a preamplifier reduces the ADC's output noise when that noise is input-referred to the preamplifier input (i.e., the noise at the signal processing circuitry output is divided by the gain). However, the use of a preamplifier typically has a dynamic range drawback since improved low end dynamic range is provided at the expense of high end dynamic range. It is thus desirable to provide a preamplifier configuration which avoids high end dynamic range loss.

The amount of amplification required to be provided by the preamplifier may vary depending upon the transducer output characteristics. Thus, a programmable preamplifier which may be programmed to different gain values is desirable so that a single preamplifier may be used with a variety of input voltage signals. FIG. 1 illustrates a typical prior art analog to digital conversion system which includes an analog input 100, a programmable preamplifier 110, an ADC 112 and a digital output 104. In such a system the gain of the preamplifier 110 may be user programmable by supplying a user defined gain setting input 111 depending upon what type of analog source is utilized. The system of FIG. 1 may be implemented monolithically with a serial control port provided to receive the gain setting input. Such serial control ports generally do not operate synchronously with the ADC sampling frequency and also operate at a lower word rate than the sampling frequency.

The analog to digital conversion systems may also be configured to be coupled to a plurality of different analog sources. For example, the preamplifier input may be switchably coupled to a plurality of different transducer inputs and each transducer may have a different output voltage characteristic. In such circumstances it is desirable to adjust the preamplifier gain depending upon the signal level presented at the preamplifier input. Whether one analog source or a plurality of sources are coupled to the preamplifier, the prior art techniques generally require the user to know the range of the analog input signal and user intervention to set the gain is required.

Typical preamplifier configurations are comprised of operational amplifiers (opamp) and resistors. FIG. 1A illustrates a typical preamplifier configuration. As shown in FIG. 1A, the preamplifier 1 is comprised of an opamp 3 and resistors R1–R4. By selectively closing one of the switches Sa, Sb, and Sc, the gain of the preamplifier may be programmably set. Ideally the closed switch would provide negligible resistance and the gain at the opamp output Vopamp/Vin would be independent of the switch resistance. However, because the switch is not ideal and adds some gain error due to its resistance, the preamplifier output may chosen at the nodes Vout1, Vout2 or Vout3 so that any error caused by the switch resistance is negated. Thus, it can be shown that for equal values for resistors R1–R4 if Sa is closed Vout1/Vin=2, if Sb is closed Vout2/Vin=3, and if Sc is closed Vout3/Vin=4 (i.e., the gain equals X, where the number of resistors between Vout and the inverting input of the opamp is X−1).

Monolithic implementations of circuits such as that shown in FIG. 1A may have gain drifts with temperature in excess of 4 or 5 ppm (parts per million) per degree Celsius. The predominate mechanism producing such drift may be the ratio drift of the gain setting resistor strings. One approach to minimize the ratio drift of the resistor string is to remove from resistor string contacts from the resistor string current path. Such a technique is shown in U.S. Pat. No. 5,319,319 to Kerth, the disclosure of which is incorporated herein by reference. The preamplifier of U.S. Pat. No. 5,319,319 is not, however, easily adapted to provide a preamplifier configuration which avoids high end dynamic range loss as discussed above.

A variety of types of analog to digital converters ("ADCs") are commonly employed for converting analog input signals to a digital output. One type of ADC is a successive approximation ADC. A switched capacitor array is one type of successive approximation ADC. Switched capacitor array ADCs are known in the art as shown in U.S. Pat. No. 4,129,863 to Gray et al., in U.S. Pat. No. 4,709,225 to Welland et al., in U.S. Pat. No. 5,006,853 to Kiriaki, and in Lee et al., "A Self-Calibrating 15 Bit CMOS A/D Converter," IEEE JSSC, December 1984, p. 813–819. Switched capacitor approaches generally provide good temperature drift and aging characteristics.

Another type of successive approximation ADC is a switched resistor capacitor array ADC. Switched resistor capacitor array ADCs are known in the art as shown in Fotouhi, "High-Resolution Successive Approximation Analog To Digital Conversion Techniques In MOS Integrated Circuits" Dissertation, University of California, 1980, p. 86–93. The switched resistor capacitor array ADC, however, suffers from inaccuracies in the resistor array, resistor temperature drift, and resistor aging drift, all of which may be substantial.

SUMMARY OF INVENTION

The present invention provides a solution to one or more of the disadvantages and deficiencies described above. In one broad respect, an autoranging analog to digital conversion system is provided. The system may include a digitally programmable preamplifier for amplifying a difference between an analog input and an estimate of the analog input. The preamplifier may be coupled to an analog to digital converter for converting the preamplifier output to a digital signal. The system may also include digital domain predictor or estimation logic for determining an optimum gain and analog input estimate for a given analog input. Multiple signal input channels may be coupled to the analog to digital conversion system. The autoranging estimations may be performed on a sample by sample basis or a channel by channel basis or both.

In another broad aspect, the system includes a backup conversion technique. Backup conversions may be obtained by utilizing separate backup converters, utilizing the estimation converter, or by utilizing the main system converter. The backup conversions may be obtained utilizing a backup conversion technique that includes the use of estimation signals. Alternatively the backup conversions may be obtained utilizing backup conversion techniques that are non-predictive in nature. The backup conversions may provide robustness to the conversion system by providing digital outputs when the main data conversion path may have errors such as occur with a converter overrange event. Utilizing backup conversions may accommodate less accurate estimation techniques and allow for greater preamplifier gain settings.

BRIEF DESCRIPTION OF THE DRAWINGS

FIGS. 11A–11H illustrate the operation of a switched resistor array and capacitor array ADC for use with the present inventions.

DETAILED DESCRIPTION OF THE INVENTION

According to the present invention, a variety of different analog input levels may be supplied to an analog to digital conversion system. Based upon the analog input signal (Ain), the system automatically adjusts a programmable preamplifier gain to generate an amplified analog signal. The gain that may be applied to the analog input is maximized by first subtracting an estimate Ain' from the Ain analog input signal and then applying the gain to the difference Ain–Ain'. An amplified signal G(Ain–Ain') is then applied to an analog to digital converter. By subtracting the estimate signal Ain', the gain G that can be applied for a given analog input may be increased without overranging the analog to digital converter. Further, the range of the amplified analog signal is optimized so as to provide improved ADC output noise and dynamic range characteristics. Thus, an autoranging analog to digital conversion system is provided. Based upon an analog input signal, the autoranging system automatically generates an estimate analog signal and a gain so that an optimized range for the signal provided to the ADC may be automatically provided. The various elements of the system may be calibrated and relatively stable so as to provide a highly accurate output.

Figure 2:
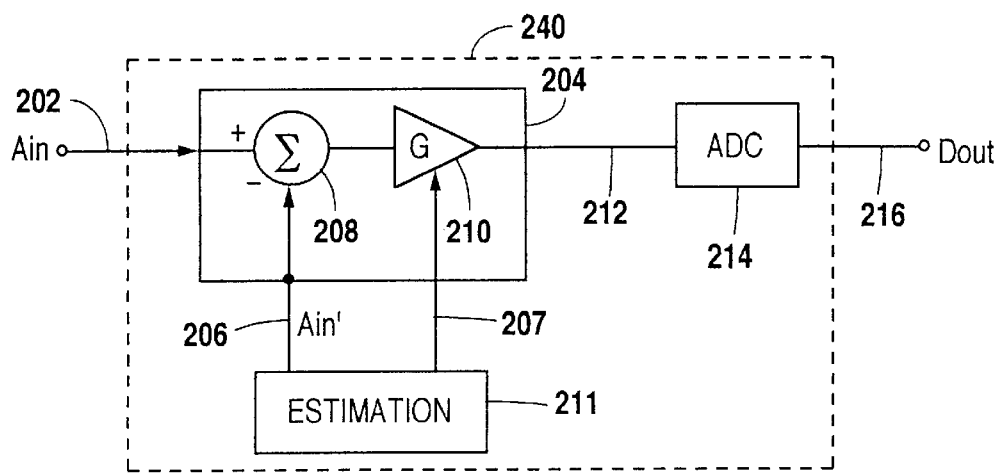
FIGS. 2, 2A, 2B, 2C and 2D are exemplary analog to digital conversion systems for utilizing the autoranging techniques disclosed herein.

FIG. 2 illustrates one embodiment of an analog to digital conversion system 240 according to the present invention. As shown in FIG. 2, an analog to digital conversion system 240 is provided for processing an analog input 202 (Ain) through a programmable gain preamplifier block 204 which in turn provides an amplified signal 212 to an analog to digital converter 214 which has a digital output 216 (Dout). Such a system may be utilized, for example, when converting an analog input signal of a transducer to a digital output signal. It will be recognized that as used herein, the coupling of the preamplifier to the analog to digital converter may include no intermediate elements or may include filters or other analog processing blocks, and in either case the preamplifier will be considered to be coupled to the analog to digital converter. Further, some intermediate blocks such as filters may be considered to be a portion of the preamplifier, the analog to digital converter or both. It will be recognized that many types of preamplifiers and many types of ADCs may be utilized with the system, including for example the programmable preamplifiers and ADCs discussed below. Other types of circuits may also be used, for example the ADC may be a delta-sigma ADC, flash ADC, successive approximation ADC, resistor-capacitor array ADC, switched weighted capacitor ADC etc.

As shown in FIG. 2, the programmable gain preamplifier may be conceptualized as a subtraction block 208 and a gain block 210. The subtraction block 208 subtracts the Ain' 206 input from the Ain 202 input. Thus the output of the entire preamplifier block is G(Ain–Ain'), where G is the gain of gain block 210. The Ain' 206 signal may be an estimation of the Ain 202 signal. An estimation control block 211 provides the estimation signal 206 and a gain control signal 207. As used herein an estimation signal may be a signal that is an actual estimation of another signal or may be a signal that has a known relationship to the actual estimation of another signal. The known relationship may be a mathematical function, may be the result of correlation tables, or may be the result of other mapping functions.

Figure 2A:
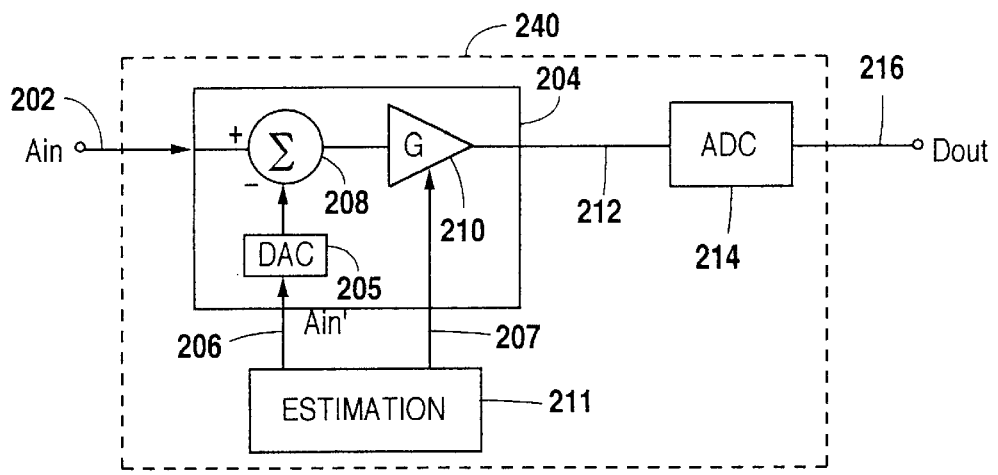

The Ain' 206 estimation signal may be generated by any of a variety of methods that provide an analog estimate (or some known function of the estimate) of the Ain 202 signal. The estimation signal 206 may be supplied from the estimation control block 211 as either an analog signal or a digital signal. If the estimation control block 211 supplies a digital Ain' signal to the preamplifier, the preamplifier block 204 may include a digital to analog converter (DAC) 205 as shown in FIG. 2A. Though shown in FIG. 2A within the preamplifier block 204, the DAC 205 may be construed to be a portion of the preamplifier block 204, may be construed to be a portion of the estimation control block 211 or may be construed to be a stand alone DAC. Compared to the resolution of the system, the resolution of the DAC used to provide the estimate signal may be relatively low, however, the relatively few DAC levels should be highly stable and calibrated to the full accuracy of the conversion system. Thus, in one exemplary a 20 bit analog to digital conversion system, the benefits of applying a gain to Ain–Ain' may be obtained with only a six bit Ain' signal provided to a six bit DAC. Further, the unpredictability and/or the speed of changes in Ain may result in error or inaccuracies in the estimation Ain' that may control the overall system performance more than an increased resolution in the DAC. The programmable gain preamplifier 207 may be a digitally programmable gain preamplifier, and thus, signal 207 may be a digital input to the preamplifier.

Figure 2B:
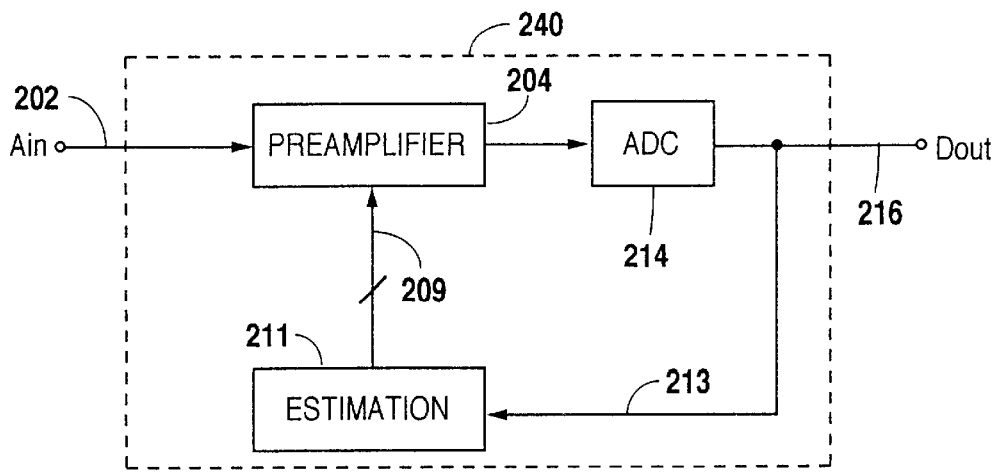

As shown in FIG. 2B, the estimation control block 211 may receive an input 213. In the embodiment of FIG. 2B, the input 213 is provided from the digital output 216. The estimation control block 211 may create the estimation control signals 209 based at least in part on previous sample data at Dout line 216. The estimation generation techniques may be performed in the digital domain. For example, the estimation control signals 209 may digitally control the preamplifier block 204 to generate the appropriate gain and estimation input Ain' to achieve the G(Ain–Ain') function within the preamplifier circuit. The operation of an exemplary digitally programmable preamplifier which may accomplish this function is described below in more detail. Other programmable preamplifiers, however, may be utilized.

Figure 2C:
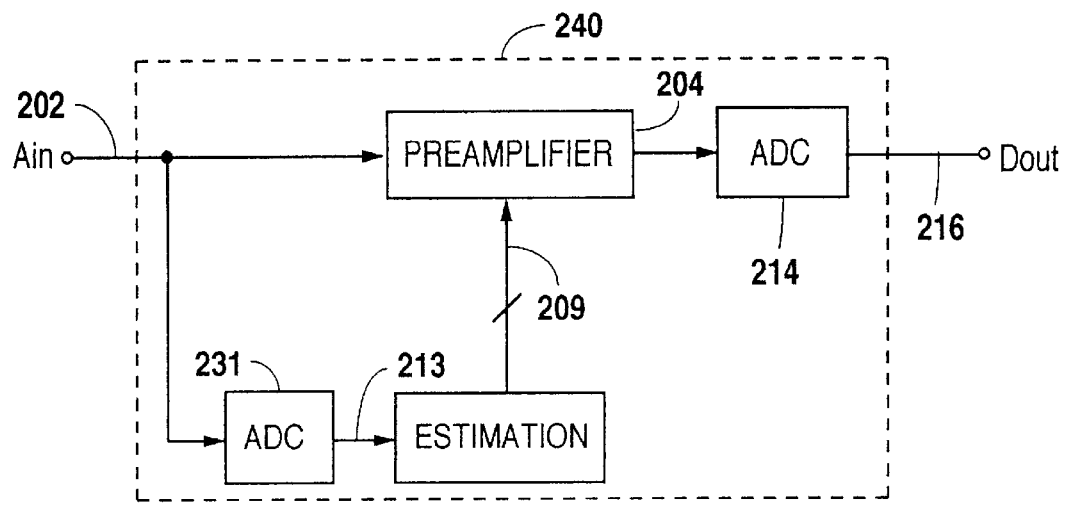

In another embodiment, the input 213 to the estimation control block may be generated from the analog input 202. As shown in FIG. 2C, the analog input 202 may be provided to an analog to digital converter 231 that generates a digital signal that is provided as the estimation control block input 213. As is described in more detail below, the ADC 231 may be an estimation ADC having a lower resolution than the main ADC 214.

The estimation signal Ain' may be generated by any of a number of estimation or predictor techniques. In one approach, the digital input 213 provided to the estimation control block may merely be reconverted back to an analog signal through the use of a digital to analog converter (DAC) to generate the Ain' signal. As mentioned above, the DAC may be constructed as part of the estimation control block 211 or may be implemented within the preamplifier. The technique of merely reconverting the digital output may be particularly suitable for generating the estimation signals if the analog input Ain 202 only varies slowly. If this technique is used with the configuration of FIG. 2B, the previous output for a given signal channel provides an estimation Ain' for the next sample. Alternatively, more advanced prediction methods such as statistical methods, linear prediction methods, etc. may be utilized. Such methods may utilize complex digital domain algorithms based on an input's previous history to estimate or predict the next input sample. The most desirable method chosen for generating the gain and the estimated input Ain' 206 be user application specific depending upon the nature and characteristics expected at the Ain 202 signal input. If the estimation of the Ain 202 signal is relatively accurate, subtracting the estimated signal will allow for increased gain in front of the ADC, and thus, result in an improved dynamic range at the ADC output.

Figure 2D:
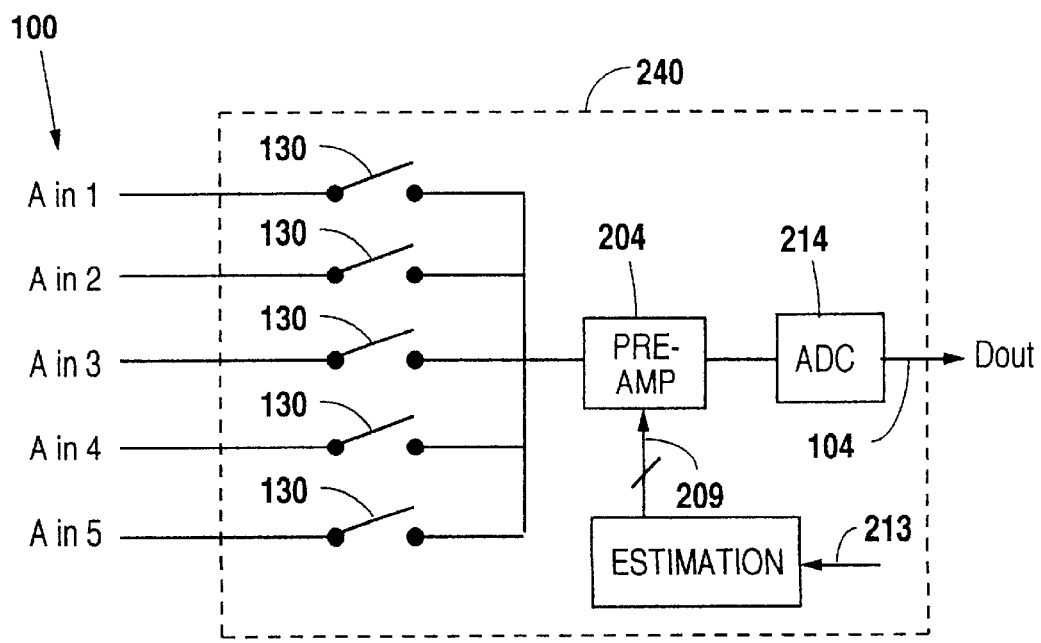
Figure 2E:
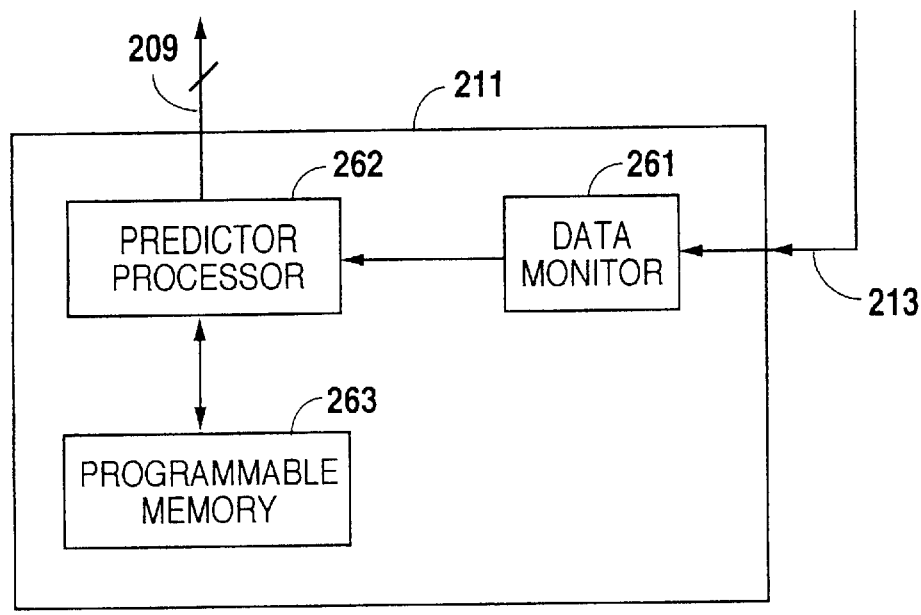
FIG. 2E is a conceptual block diagram for implementing estimation control logic.

The estimation control logic 211 may receive the input 213 as shown in FIG. 2E. The estimation control logic 211 may include a data monitor control block which couples the data to a predictor processor 262 (the estimation logic may also be referred to as a predictor or predictor logic). The predictor processor 262 provides the estimation control signals 209 and may be implemented as a microprocessor, microcontroller, an embedded RISC processor, etc. Programmable memory 263 (for example, flash memory, EEPROM, fuse programmable memory, etc.) may be associated with the predictor processor 262. The estimation or prediction algorithm may be implemented in the predictor processor under software control. This software control may allow a user the flexibility to implement the user's own product specific estimation or prediction algorithms. Additional product specific flexibility may be implemented through the programmable memory 263. For example, the programmable memory may set system defaults such as default gain when a prediction can not be obtained, default gain for a specific channel, etc.

The analog to digital conversion system 240 of FIGS. 2–2C may be implemented in a single monolithic integrated circuit. The single monolithic integrated circuit may include some or all of the system components discussed herein including digital domain estimation circuitry, channel multiplexers, switching circuitry to select external/internal gain and estimation sources, preamplifiers, main conversion ADCs, estimation ADCs, backup ADCs calibration ADCs etc. Alternatively, some of the circuitry and functions may be performed off chip from the rest of the analog to digital conversion system. For example, some of the functions of the estimation control logic 211 may be performed off chip. In such a case, a high speed digital input port may be provided to the integrated circuit to provide the digital domain estimation inputs (Ain' and gain).

By completely integrating the conversion system 240 or integrating most of the circuitry and providing the estimation data through a high speed digital input port, the gain and Ain' estimation may be updated on a sample by sample basis. Thus, whereas prior art programmable gain systems may be limited to relatively slow changes to the gain settings, the system disclosed herein may be utilized on a sample by sample basis. Providing high speed updates to the estimation and gain settings (whether from an internal integrated source or from an external source) enables the analog to digital conversion system disclosed herein to maximize the ADC dynamic range benefits described herein.

The high speed digital input port for providing external estimation control signals may operate at the same rate as and synchronously with the sampling frequency of the analog to digital converter. For example, typical 16 bit or more converters may sample the input at frequencies of 1 MHz or less. The digital input port may provide 12 bits of data (6 gain bits and 6 Ain' estimate bits) at this same frequency. For converters operating at higher frequencies, the data at the digital input port may be provided at a correspondingly higher data rate.

The analog to digital conversion system may be coupled to a single analog input source or may be coupled to multiple analog input sources through a multiplexer or switching circuit. The analog input sources may have varying input voltage ranges. Moreover, the input voltage range of any one analog input source may change over time. As shown in FIG. 2D, a plurality of different analog inputs 100 (Ain1–Ain5) may be multiplexed to the preamplifier 204 through switches 130. As used herein, each analog input may be considered to be a separate signal channel. As shown in FIG. 2D, the switches 130 may be integrated within the analog to digital conversion system 240. Alternatively, the switches 130 may be implemented outside of the integrated conversion system and a single analog input may be provided to the system. In either case, the analog to digital conversion system 240 may still operate to convert data from multiple channels.

As mentioned above, multiple signal channels may be multiplexed to the analog to digital conversion system 240. Any given estimation algorithm may be implemented across the multiple channels in a variety of manners. For example, each channel may treated separately such that the prior history analyzed to estimate the next sample for a given channel is only the history for that channel. Thus, as the analog to digital conversion system is multiplexed between different signal channels, the history for each channel may be separately collected and stored. When a given channel is selected again as in input, the estimation signal may then be based upon the past history of that channel. The history utilized may be merely the last sample for the given channel or a collection of multiple past samples. Alternatively, the estimation for a given channel may be based upon the last sample provided from any channel or a history of a collection of samples irrespective of which channel the data is collected from. Such a technique may be suited for systems in which a relationship exists between the channels. In one such system, multiple channels may monitor the same signal generating source (for example if multiple temperature transducers monitor the same temperature source). Thus, the estimation system may operate on a sample by sample basis or a channel by channel basis or a mixture of both.

Thus, the prediction techniques may be based merely on the last sample or a last sample predictor technique. Further the next sample prediction may be based upon the historical data for multiple prior samples. For example, the next sample prediction may be based upon a linear combination of past samples (a linear prediction technique). In another example, a statistical analysis of the historical data may rely upon the mean, standard deviation, rejection of data outside of three sigma limits, etc. to statistically predict the next sample value (a statistical prediction technique). For example, statistical methods may be utilized when the analog input signal contains a significant amount of noise such as white gaussian noise. Though a prediction of the actual value of a next sample may be unattainable due to the noise, a statistical prediction may provide a relatively accurate range within which the next sample will fall. The estimation signal and gain applied to the preamplifier for the next sample may be set accordingly so that an overranging condition of the ADC will not occur for any input signal within the predicted range. The benefits in noise reduction characteristics and dynamic range characteristics of the autoranging technique may still be obtained by providing an estimation signals based on an estimated range. Thus, even in circumstances where an accurate and exact estimate is hard to obtain, estimation signals may still be provided and the benefits of the techniques disclosed herein may still be obtained. As further noted above, any of the estimation/prediction techniques utilized may be implemented upon a channel by channel basis or independent of channels depending upon the specific user application and the nature of the signal channels. Based upon the analog input data, therefore, the gain applied to the analog signal may be automatically adjusted to provide the optimal range input voltage range to the ADC so that the conversion characteristics may be improved.

The autoranging system may also receive external user supplied estimation or prediction inputs. For example, the integrated circuit solution described above may include external estimation inputs provided at an external estimate input pin. The system may be configured so that the estimation signals utilized are selectable between the externally supplied estimation signals or the internally generated estimation signals. Moreover, the system may be configured such that no internal estimation or prediction logic is utilized and all the estimation signals are determined by an external source and supplied to the remaining integrated circuitry through the external prediction inputs.

If a highly accurate estimation or prediction algorithm can be established (for example if the signal pattern is well known), the estimate Ain' may be generated directly from the previous sample data. In other circumstances, it may be beneficial to produce an estimation conversion of the analog input data and use the estimation conversion output directly or in combination with a prediction algorithm to generate the Ain' estimate.

In one embodiment, the Ain' estimate may be generated by first performing an estimation conversion on the analog input signal Ain. Then, using the estimation conversion digital output of the Ain input signal an estimation signal Ain' may be determined by using a digital domain predictor (if the analog input signal is slow moving, the Ain' estimate may merely be the digital output of the estimation conversion). The estimation signal Ain' may then be utilized to perform a second conversion (or main conversion) of the G(Ain–Ain') preamplifier output to provide the ADC digital output.

A wide range of ADC techniques may be utilized to perform the estimation conversion (or first conversion) and the main conversion (or second conversion). For example, the same ADC may be used for both the estimation and the main conversions. The estimation conversion may be implemented at the full resolution of the ADC as is implemented for the main conversion. However, utilizing the full resolution of the ADC for the estimation conversion will limit the throughput of the system as the time necessary to perform two full conversions will be required. Further, performing a full resolution estimation conversion allows the analog input Ain additional time to move away from the estimation.

In another approach in which the same ADC is still utilized for both conversions, the estimation conversion may be performed at less than the full ADC resolution. Thus, the estimation conversion may be performed only to a resolution of some limited number of MSBs. This estimation conversion may then be utilized to determine the Ain' estimate. In one example, if a 16 bit ADC is utilized for the estimation and main conversions, the estimation conversion may be performed to only the 6 MSBs resolution. Thus, the throughput may be increased as the time for full resolution conversion of the estimate conversion will not be required. An exemplary ADC for use in such circumstances may be a successive approximation ADC. Successive approximation ADCs such as switched capacitor array ADCs and resistor and capacitor array ADCs are described below. The successive approximation ADC may utilize both rough and fine comparators as further discussed below, and the estimation conversion may be performed to a resolution that only uses the rough comparator or could be performed to a resolution that uses both the rough and fine comparators.

The estimation and main conversions need not be performed with the same preamplifier gain. Thus, the estimation conversions of the analog input signal Ain may be performed with a preamplifier gain G=1 (i.e., the preamplifier may be bypassed). The preamplifier may then be digitally programmed for the appropriate gain and estimation input voltage settings. The second or main conversion may then be performed utilizing the gain and estimation input voltage settings to provide a full resolution analog to digital conversion representing a conversion of G(Ain−Ain').

Rather than utilizing the same ADC for both the estimate and main conversions, an extra estimation ADC may also be utilized. Though additional circuitry is required, a dedicated estimation ADC may allow for increased throughput as compared to the use of a single ADC and offer an overrange backup conversion at the same time. The estimation ADC may be implemented to a full resolution of the main conversion ADC or may be implemented to only a resolution of some set of the MSBs similar to as described above. Thus, an estimation ADC having a lower resolution than the main conversion ADC may be provided. The estimation ADC may be continually operating to provide the MSBs necessary to set the preamplifier gain and the Ain' estimate. Such a technique improves the throughput over the approach of using the same ADC for both the estimate and the main conversions. Because the estimation ADC is operated at the lower gain level, the estimation ADC may also perform the overrange backup function described above. Therefore, the additional ADC may perform both estimation and backup functions simultaneously.

The separate estimation ADC may be an ADC that provides fast conversions in order to improve the system throughput. The faster the estimation converter is, the less time that will elapse between the sampling of the estimation ADC and the application of the estimation to the Ain analog input (i.e., the Ain−Ain' calculation). Further, the less time that elapses between estimation sample and the generation of the Ain' estimate, the less time that the analog input Ain has to move away from the Ain' estimate. A flash ADC may provide speed improvements as flash ADCs provide higher throughputs than successive approximation ADCs. A flash ADC, may however, require more power.

The use of a no gain conversion for the estimation conversion provides additional benefits relating to overranging conditions. If the estimate generated is inaccurate, the gain selected for the main conversion may overrange the ADC. When an overrange is detected, the output of the main conversion can be set to default back to the value of the estimate conversion. Though the estimate conversion may be a lower resolution, the output data of the estimate conversion may still be more accurate than the main conversion since an overrange condition occurred during the main conversion.

The use of an estimation conversion thus also generates a backup conversion that may be utilized in case the high gain conversion system overranges. This may be conceptualized as a high gain analog to digital conversion system operating concurrently with a low gain backup analog to digital conversion system. As mentioned above, the same ADC that provides the main conversions may be utilized with no gain applied to the input signal (gain G=1) to provide a lower resolution estimate. Similarly the same ADC that provides the main conversions may be utilized with no gain applied to the input to provide a lower resolution backup. Alternatively, a separate backup ADC may be utilized or as described below a separate estimate/backup ADC may be utilized. With a separate backup ADC utilized, the MSBs of the backup conversion may provide the estimate conversion. The separate backup ADC may convert the MSBs and provide that result to the estimation circuitry and then proceed with completing the conversion of the LSBs to obtain the full backup conversion. Thus, three types of conversions may be provided, an estimate conversion, a backup conversion and the main conversion. Three separate converters may be utilized to perform these operations or lesser number of physical converters may be utilized, with some converter performing multiple types of conversions (for example one converter performing both the estimate and backup conversions or one converter performing the estimate and main conversions, etc.).

As with the estimation conversion, the backup conversion may be at a lower resolution then the main conversion. Though the backup converter may be the same resolution as the main conversion, such high backup conversion resolution may unnecessarily utilize power and circuit area. In one embodiment, the main conversion may be performed at a 20 bit resolution and if the attempt to obtain a 20 bit resolution overranges, then the system may utilize a 16 bit resolution backup conversion. Even with the decreased resolution, the backup conversion system may provide an overall relatively accurate system as long as the number of overranging incidents are kept relatively low. For example, if the 20 bit main conversion system having a 16 bit backup conversion has an overranging rate of approximately 1%, the bit resolution of the overall conversion system will drop by approximately 1 bit to a 19 bit resolution system. Thus, two ADCs of different resolution may be operating to perform backup and main conversions. The two ADCs may be implemented successively or concurrently and may be just different portions of the same ADC circuitry. Each portion of the ADC may be selected to give a different resolution. As is described in more detail below, it may be desirable to provide for amplifier headroom in the presence of gained amplifier offsets and estimation errors by limiting the range of the ADC VOUT so as to limit the probability of overranging.

As discussed above, three types of conversions may be provided, an estimate conversion, a backup conversion and the main conversion. FIG. 2G illustrates one embodiment of a conversion system utilizing three separate converters. As shown in FIG. 2G, an estimation conversion sub-system 294, a main conversion sub-system 295 and a backup conversion sub-system 296 are provided.

The estimation conversion sub-system 294 may include an ADC 231. In one embodiment the ADC 231 may be a flash ADC so as to provide a fast conversion result. An output 287 of the flash ADC may be provided to estimation circuitry 286, for example a digital estimation processor. The digital estimation circuitry 286 may utilize any of the various estimation techniques described herein or other techniques as would be understood by those skilled in the art. The output 287 of the ADC 231 is thus utilized to obtain digital estimation signals 288 and 290. Thus, similar to the system as described above with reference to FIG. 2C, a conversion system 240 may use an additional ADC 231 that generates a digital signal from the analog input Ain 202 for generating a digital input for use in the estimation process.

The main conversion sub-system 295 may include DAC1 205, subtraction block 208, gain block 210 having a gain G, and main ADC 214. The DAC1 205 receives a digital estimation signal 288 from the digital estimation circuitry 286. The elements of the main conversion sub-system may thus operate in the manner described elsewhere herein to provide a main conversion result 272 by utilizing estimation techniques. The backup conversion may include DAC2 292, subtraction block 293, gain block 278 having a gain G', and backup ADC 280. The DAC2 292 receives a digital estimation signal 290 from the digital estimation circuitry 286. The elements of the backup conversion sub-system may thus operate in the manner described elsewhere herein to provide a backup conversion result 276 by utilizing estimation techniques. In the example shown, both the backup ADC 280 and the main ADC 214 are 16 bit ADCs. Other embodiments may be utilized, however, in which the bit accuracy of the main ADC 214 and the backup ADC 280 are not identical.

As shown in FIG. 2G, both the main conversion sub-system 295 and the backup conversion sub-system 296 utilize estimation techniques. Thus, the overall system of FIG. 2G provides a system having a main conversion path that utilizes estimation (or predictive) techniques and a backup conversion path that utilizes estimation (or predictive) techniques.

When considering noise implications it can be approximated that high resolution DACs and amplifiers with gains greater than 100 require higher estimation accuracy with little noise benefit. In one embodiment, a system having a maximum gain=32 in gain block 210 and a five bit DAC 205 may be utilized. In this case, because only five bits need to be provided from the ADC 231, a flash ADC may be well suited for ADC 231.

In some applications a single analog to digital converter may be time-multiplexed to provide the functions of both main ADC 214 and backup ADC 280. In other applications, increased throughput may be realized with separate main and backup ADC structures. Development costs and risks may be reduced if the backup ADC 280 replicates the same proven design and layout as the main ADC 214.

In order to prevent the backup ADC 280 from also overranging, it is generally assumed that the gain G' of the backup gain block 278 will be less than the gain of the gain block 210. For example, the gain G' may be set to be a set factor less than the gain G, for example G'=G/2 may generally be suitable if the main converter overranges 0.1% of the time. The gain G' may be programmable or the gain may be merely set at fixed value. The gain G' may even be selected to a value of one, and in such case the backup gain block 278 may not be necessary. The need for a higher backup G' may be reduced by ensuring higher estimation accuracy or reducing the main gain G so that overrange events occur less often. However, reducing the main gain G results in poorer noise performance and even improved estimation predictions may not accommodate random unpredictable input events.

In order to provide the same analog delay time between the analog input Ain 202 and the main ADC 214 and between the analog input Ain 202 and the backup ADC 280, the gain block 278 may be designed to provide the necessary delay. Alternatively, the any delay differences may be digitally calibrated using digital correction techniques such as shown in U.S. Pat. No. 6,271,780 issued Aug. 7, 2001 to Gong et al.

Providing a high bit resolution backup conversion path reduces the conversion system requirements for the accuracy of the estimation prediction technique. Further, a relatively high gain may be chosen for the main conversion gain block. In one example, a gain may be selected that results in use of the backup ADC for approximately 0.1% of the conversions. In addition, a programmable gain may be utilized for the main conversions such that gain is reduced after an over-ranging event but then the gain may be gradually increased to a higher value while using the backup ADC as protection against another overrange event if the gain increase results in another overrange event.

The embodiment of FIG. 2G illustrates just one technique for obtaining a backup conversion result. FIGS. 2H, 2I, and 2J illustrate other backup techniques and it will be recognized that still other configurations may be utilized.

FIG. 2H illustrates an embodiment of a conversion system 240 that implements the additional ADC 231 to provide both estimation results and backup conversion results. As shown in FIG. 2G, the ADC 231 may be a flash ADC. The output 270 of the ADC 231 may be provided to a DAC 205 as shown. Similar to as described with reference to FIG. 2A, the DAC 205 may be construed to be a portion of the preamplifier block 204, may be construed to be a portion of an estimation control block or may be construed to be a stand alone DAC. In FIG. 2H, the DAC 205 provides an estimation signal Ain' 206 to the preamplifier block 204.

As described above, the ADC 231 may be a flash ADC so as to provide a fast conversion that results in less time elapsing between the sampling of the estimation ADC 231 and the application of the estimation to the Ain analog input (the Ain–Ain' calculation). However, flash ADC quantization is generally too crude to utilize as a backup converter for high-resolution applications. If more accurate converters are utilized for ADC 231, the estimation conversion of the ADC 231 may also be utilized to provide a backup conversion that may be utilized in situations where the main conversion path overranges. As shown in FIG. 2H, a backup digital output Doutbackup 272 is provided from the ADC 231. It will be recognized, however, that the more accurate estimation conversions may result in a decrease in the speed of the estimation conversion.

FIG. 2I illustrates another example of a conversion system utilizing a separate backup converter. As shown in FIG. 2I, a digital estimation input 274 is provided to the DAC 205. The estimation input 274 may be received from a flash ADC such as ADC 231 of FIG. 2G. The estimation input 274 may alternatively be generated in any one of the manners described herein for generating estimation. As shown in FIG. 2I, the analog input Ain 202 may be provided for main conversions through preamplifier block 204 and main conversion ADC 214. However, the analog input Ain 202 may also be provided to a backup gain block 278 having a gain of G'. The backup gain block 278 may provide an output to a backup ADC 280. The backup ADC 280 may provide the backup digital output 276. As shown in FIG. 2I, the backup conversion path does not utilize an estimation technique. Thus, FIG. 2I illustrates a system having a main conversion path that is predictive and a backup conversion path that is non-predictive.

FIG. 2J illustrates yet another embodiment in which both the main conversion path and the backup conversion path may utilize the estimation techniques disclosed herein. As shown in FIG. 2I, a second preamplifier block 286 (similar to preamplifier block 204) may be utilized. Thus, a conversion system is provided in which both the main conversion path and the backup conversion path utilize predictive estimation techniques. In this manner a plurality of predictive conversion paths are provided.

Preamplifier blocks 204 and 286 of FIG. 2J may receive estimation signals Ain' 282 and Ain' 284. In one embodiment, estimation signals Ain' 282 and Ain' 284 may be the same estimation signal (derived using any of the estimation techniques described herein). In such an embodiment, the gain of the backup gain block 278 may set lower than the gain of the main conversion gain block 210. Using this approach, the backup conversion path would be less likely to result in an overranging event. Further, the embodiment of FIG. 2I is not limited to two predictive conversion paths and more predictive paths could be utilized. For example, 6 predictive conversion paths may be utilized having different gain values, for example, G=1, 2, 4, 8, 16 and 32. The predictive conversion path allowing the highest gain (without overranging) may be selected for main conversion use and the predictive conversion paths having lower gain values may be utilized as backup paths. Which predictive conversion path is utilized may be selected on a sample by sample basis, or more preferably, on a longer term basis such as by monitoring the results of a group of samples, for example 1000 samples.

By In another embodiment utilizing the conversion system of FIG. 2J, the gain values utilized in the main conversion path and the backup conversion path may be the same, however, the estimation signals Ain' 282 and Ain' 284 may be different. In this case, utilizing two different estimation techniques may reduce the likelihood of both conversion paths overranging at the same time. Again, this technique is not limited to only two predictive conversion paths and more predictive conversion paths may be utilized. In yet another embodiment, both the gain values and the estimation signals may be different between the main conversion path and the backup conversion path.

No matter what embodiments of the plurality of predictive conversion paths illustrated in FIG. 2J are utilized, the embodiments may be combined with yet another non-predictive conversion path. The non-predictive conversion path may be yet another backup conversion path similar to the backup conversion path of FIG. 2I. Thus, if all the predictive estimation conversion paths overranged, the third non-predictive path may be utilized for backup conversions.

As described herein, a wide range of estimation techniques are provided and a wide range of backup conversion techniques are provided. The specific combinations of estimation techniques and backup conversion techniques illustrate herein are not meant to be limiting and it will be recognized with the benefit of this disclosure that other combinations may be utilized. For example, the various features described with regard to one of the backup embodiments of FIGS. 2G–2J may be combinable with some or all of the features described with regard to the other of the embodiments of FIGS. 2G–2J.

The autoranging techniques disclosed herein may be implemented with a wide variety of preamplifier and ADC circuits. Exemplary preamplifiers and ADC circuits that may be particularly suited for use with the autoranging techniques are shown below. However, other preamplifiers and ADC circuits may be utilized.

Also discussed below are a variety of calibration system techniques for calibrating the various components of the analog to digital conversion system. As noted below, the calibration may be performed by correcting the final output data of the system. This post conversion correction may be accomplished by identifying the errors of the various components calibrated, and knowing these errors, adjusting the system output accordingly so as to compensate for the errors. Thus, post conversion calibration tables may be established to digitally post conversion correct the overall system. As is discussed below, the analog path (i.e., the specific resistors, switches, opamps, etc. utilized to achieve the desired gain and Ain' estimation) through the system may vary depending upon the Ain' estimate and gain G utilized. Depending upon the analog path that is taken through the system, the required post conversion corrections will vary. In order to provide improved results over that provided by the integrated calibration system, a user may want to track what analog path was utilized for a specific conversion. To accomplish this tracking, additional digital tag bits may be added to the digital output of the analog to digital conversion system. Thus, the integrated circuit output pin may include a digital data sample and tag bits that identify the system configuration used to generate that sample. The system user may generate enhanced calibration tables that further calibrate the system output depending upon the tag bit data. Thus, a unique tag bit word may be assigned to each analog path through the conversion system and this word may be provided at an output of the integrated conversion system. The mapping of the analog paths to the individual tag bits of a tag bit word may be performed in a variety of manners and is arbitrary. The user may then create additional calibration tables correlated to specific analog paths and their associated errors.

In addition to post conversion corrections, the output of the analog to digital conversion system may be provided in a volt format. Typical analog to digital conversion systems provide a multiple bit output where 000 . . . 000 represents 0V and 111 . . . 111 represents the full scale reference voltage. Note that over the full analog input voltage of the converter, every possible digital output word is produced. However, the digital output of the present system may be converted as part of the post conversion processing to a voltage format such as an IEEE floating point standard format or a data format where one bit is a sign bit, another bit a 2V digit, another bit a 1V digit, another bit a 0.5V digit, another bit a 0.25V digit, etc. Thus, rather than having an output that is normalized to the ADC reference voltage, the output may be directly provided as a base-2 representation of the input voltage. When using a 2.5V reference voltage, a 2.5V analog input will produce a base-2 output of 101000 . . . 000, resulting in many unutilized output codes (those between 1010000 . . . 000 and 1111111 . . . 111), but this disadvantage is offset by the advantage of providing output in conventional units. The post conversion logic for calibrations and voltage conversions may be considered to be logic within the ADC block 214 of the figures or may be considered to be additional logic located between the ADC block and the digital output 216.

Figure 2F:
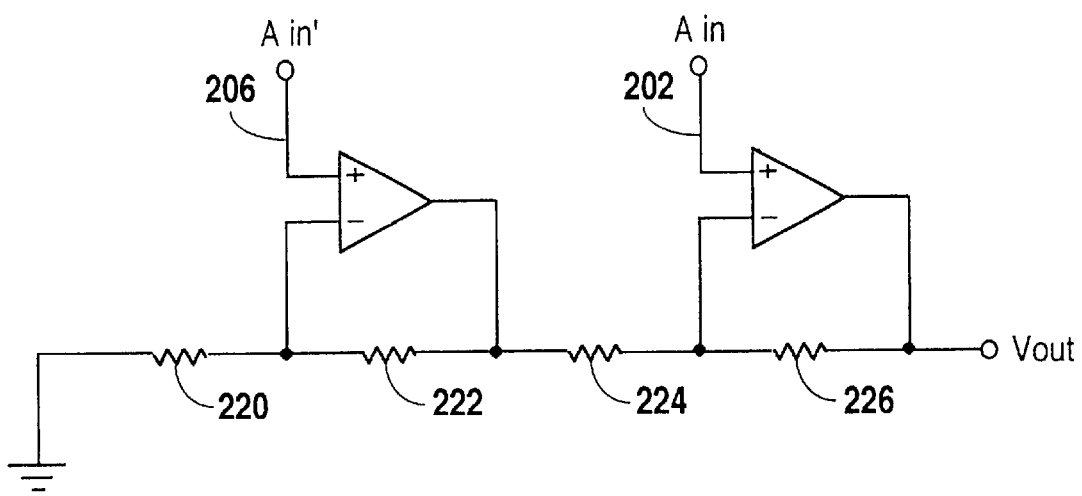
FIG. 2F is a conceptual circuit design for implementing a programmable gain preamplifier.
Figure 2G:
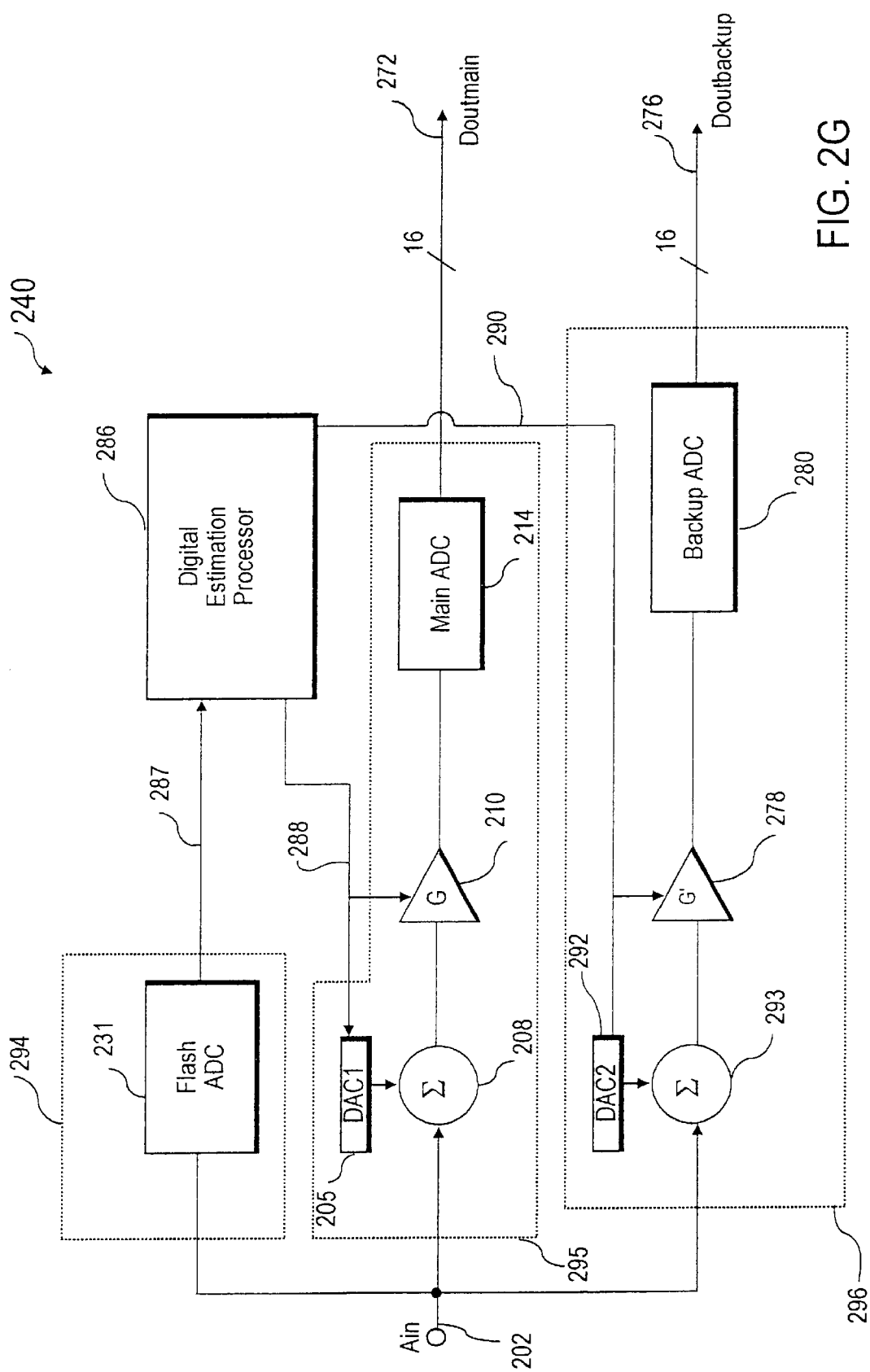
FIGS. 2G–2J are exemplary analog to digital conversion systems utilizing the backup conversion techniques disclosed herein.
Figure 2H:
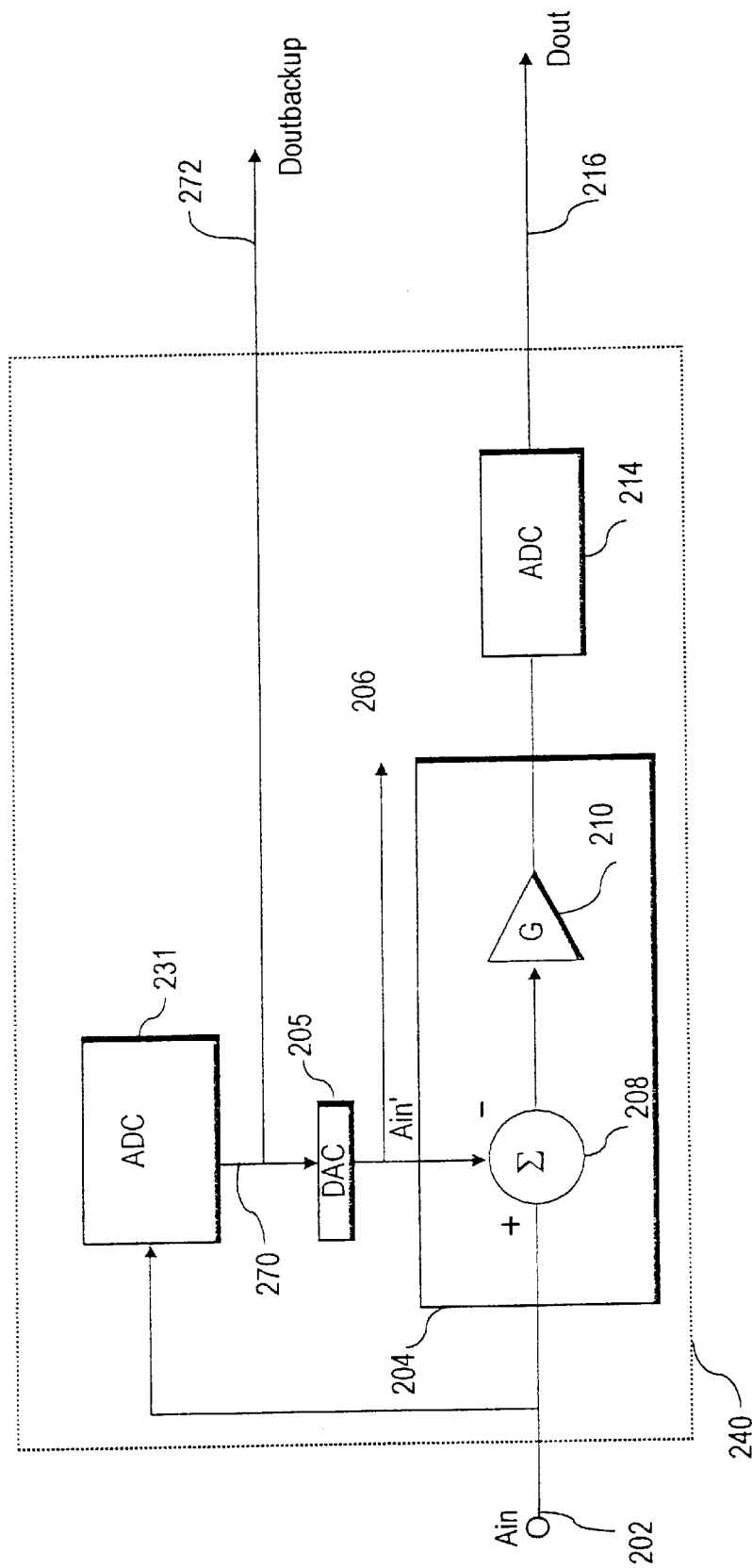
Figure 2I:
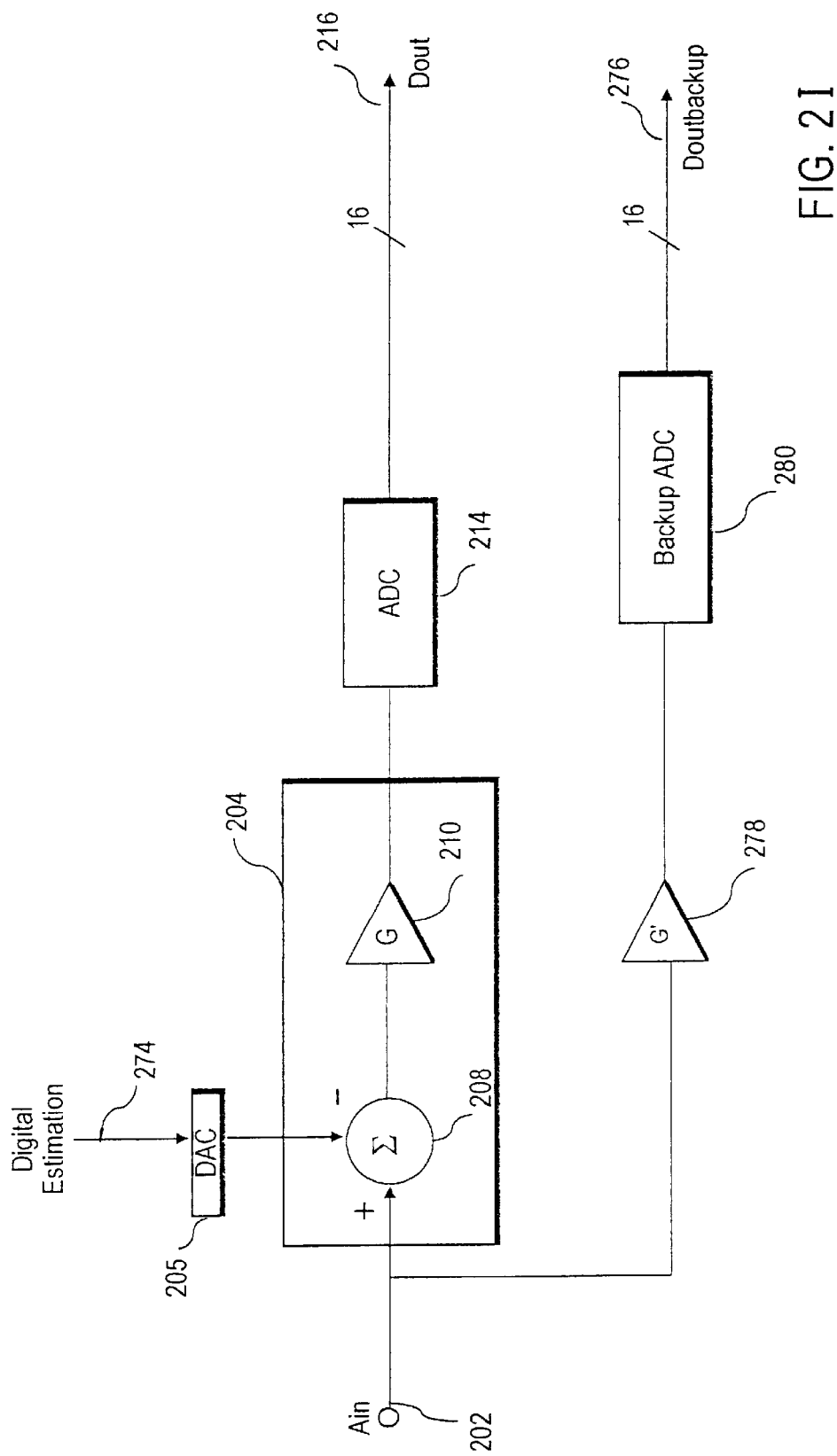
Figure 2J:
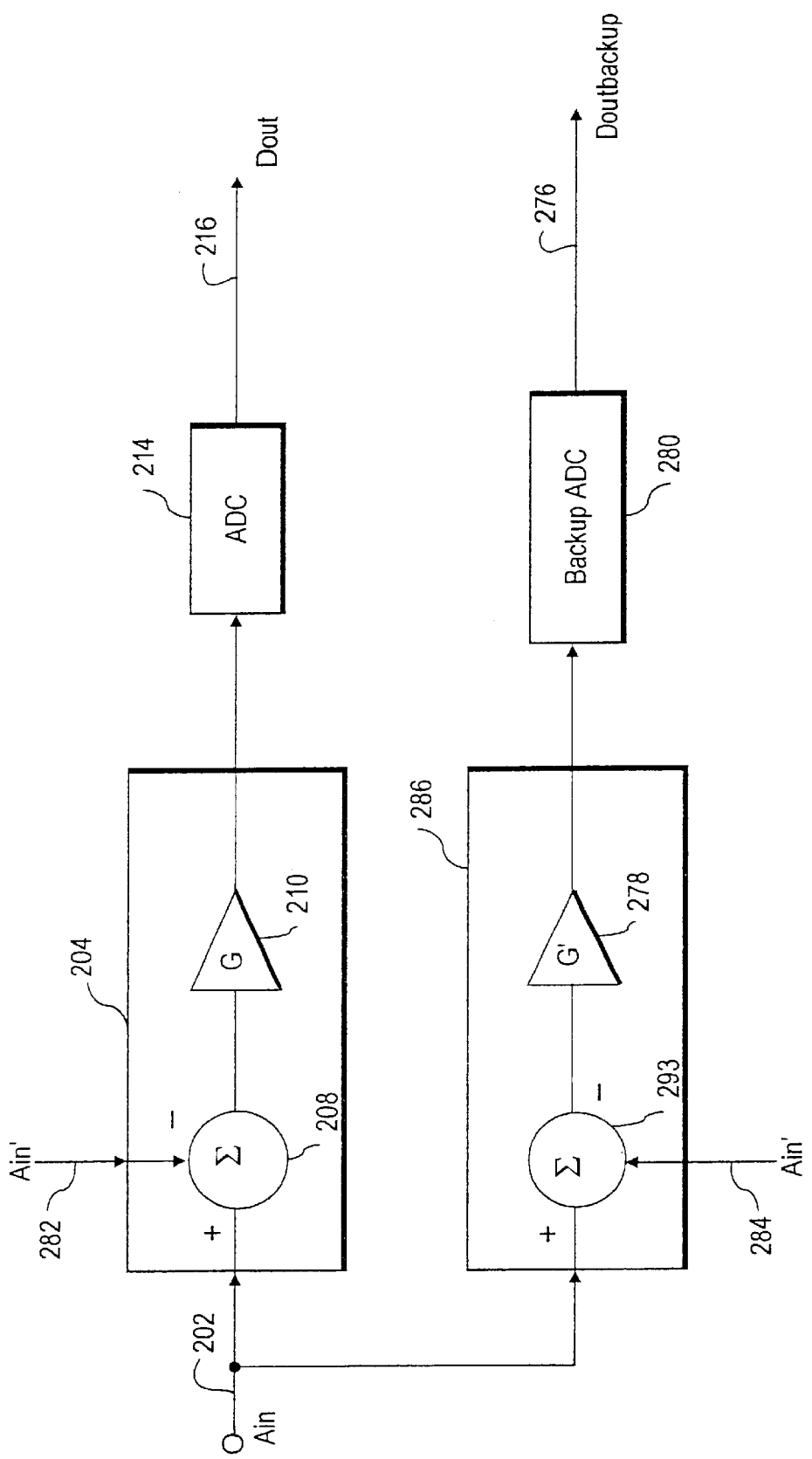

A circuit for implementing the programmable gain preamplifier block 204 of FIG. 2A is shown in FIG. 2F. The circuit of FIG. 2F operates as a differential amplifier in which two opamps are provided with each opamp's noninverting input utilized as an input to the differential amplifier. Thus, the Ain 202 and Ain' 206 signals are provided to the noninverting inputs as shown. The resistors 220, 222, 224, and 226 may be programmably set at the appropriate values to achieve the desired gain. The configuration of FIG. 2F provides a differential amplifier having two opamps coupled in series with the inputs to the differential amplifier provided at the noninverting inputs of each opamp. The output of the first opamp is coupled to the inverting input of the second opamp (through a resistor) and the output of the differential amplifier is provided at the output of the second opamp.

Figure 3A:
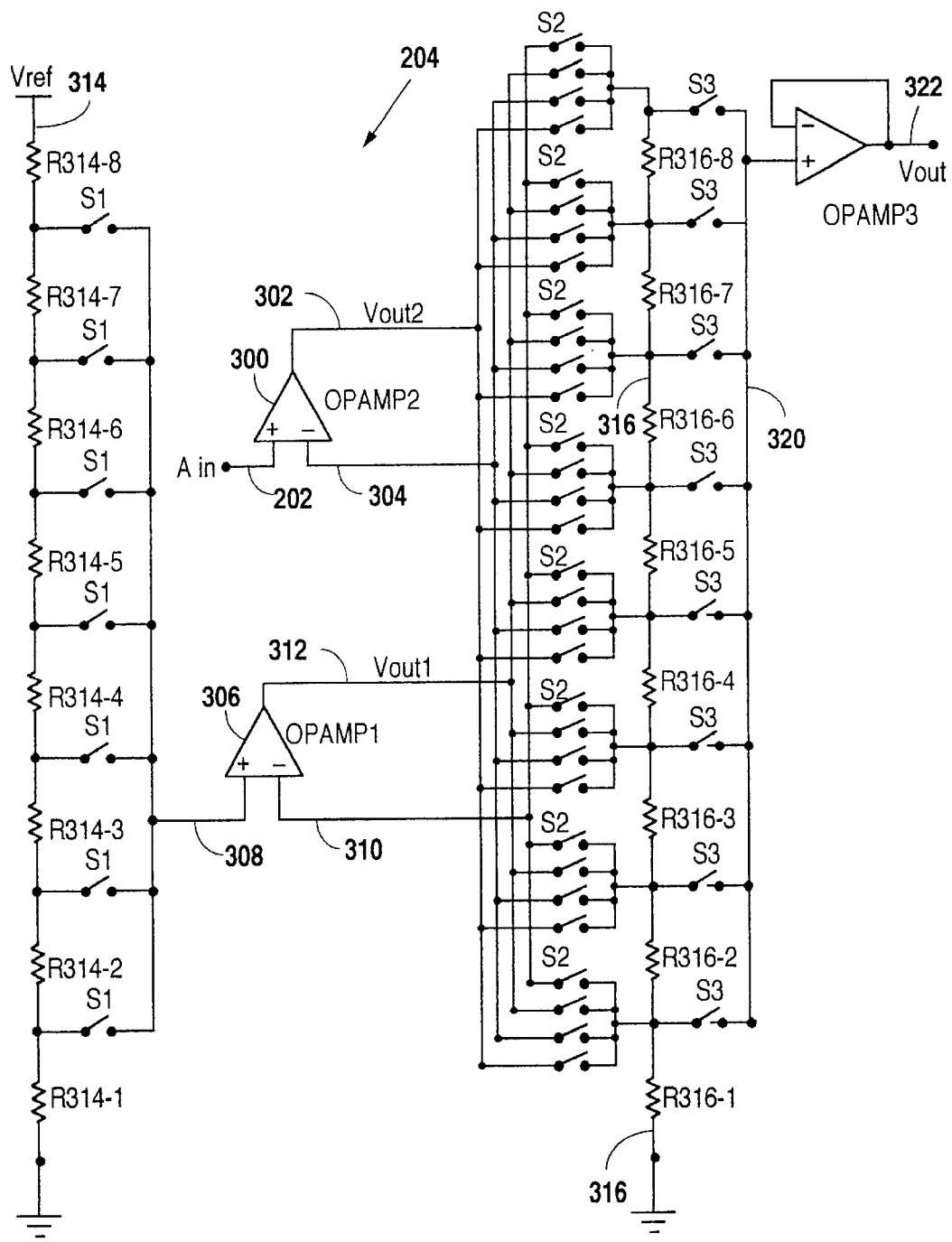
FIGS. 3A–3F illustrate one circuit design for implementing the programmable gain preamplifier disclosed herein.

A programmable circuit for providing the functionality of the circuit of FIG. 2F is shown in more detail in FIG. 3A. As shown in FIG. 3A, the Ain 202 signal is provided to the opamp 300 (OPAMP2) at the noninverting input of the opamp. Opamp 306 (OPAMP1) is provided with an input voltage 308 at its noninverting input. The noninverting input voltage 308 acts to implement the estimated signal Ain', although as will be described below, the input voltage 308 is only a function of the desired or actual estimated signal due to the manner in which the circuit of FIG. 3A is operated. OPAMP is configured as an output buffer to provide the preamplifier block output VOUT 322.

The noninverting input voltage 308 to OPAMP1 is provided from a first resistor string 314. The resistor string 314 includes a plurality of resistors R314-1–R314-8 which are connected between a reference voltage Vref and ground. The resistor string 314 is coupled to the noninverting input voltage 308 through a plurality of switches S1. The output 302 (Vout2) of OPAMP2, the inverting input 304 of OPAMP2, the output 312 (Vout1) of OPAMP1, and the inverting input 310 of the OPAMP1 may all be switchably coupled to a second resistor string 316 through a plurality of switches S2. The resistor string 316 includes a plurality of resistors R316-1–R316-8 as shown. For ease of illustration, the resistor strings 314 and 316 are shown as being comprised of eight resistors. However, it will be recognized that resistor strings of other lengths may be utilized. In one embodiment, both resistor strings may be composed of 64 resistors. All the resistors of both strings may be configured to have the same resistance and ideally both resistor strings may have similar layouts which are found empirically to minimize systematic errors in the fabrication of the resistor strings.

As will be described in more detail below, resistor string 314 and switches S1 form a digital to analog converter with an output on line 308. By selectively closing one of the switches S1, a selected voltage may be provided to the noninverting input of the OPAMP1. In this manner a voltage to implement the effect of subtracting the estimated Ain' signal is provided to the differential amplifier configuration. Thus, the first resistor string provides a voltage related to the estimated input. The second resistor string 316 is utilized to achieve a digitally programmable gain by selectively closing switches S2 as described below. In the 64 resistor embodiment mentioned above, gain values from 1 to 32 may be digitally programmed by selectively closing switches S2. Switches S3 connect the appropriate tap of the second resistor string 316 to line 320 so that the desired output voltage will be provided to the buffer amplifier OPAMP3, as also described below.

Figure 3B:
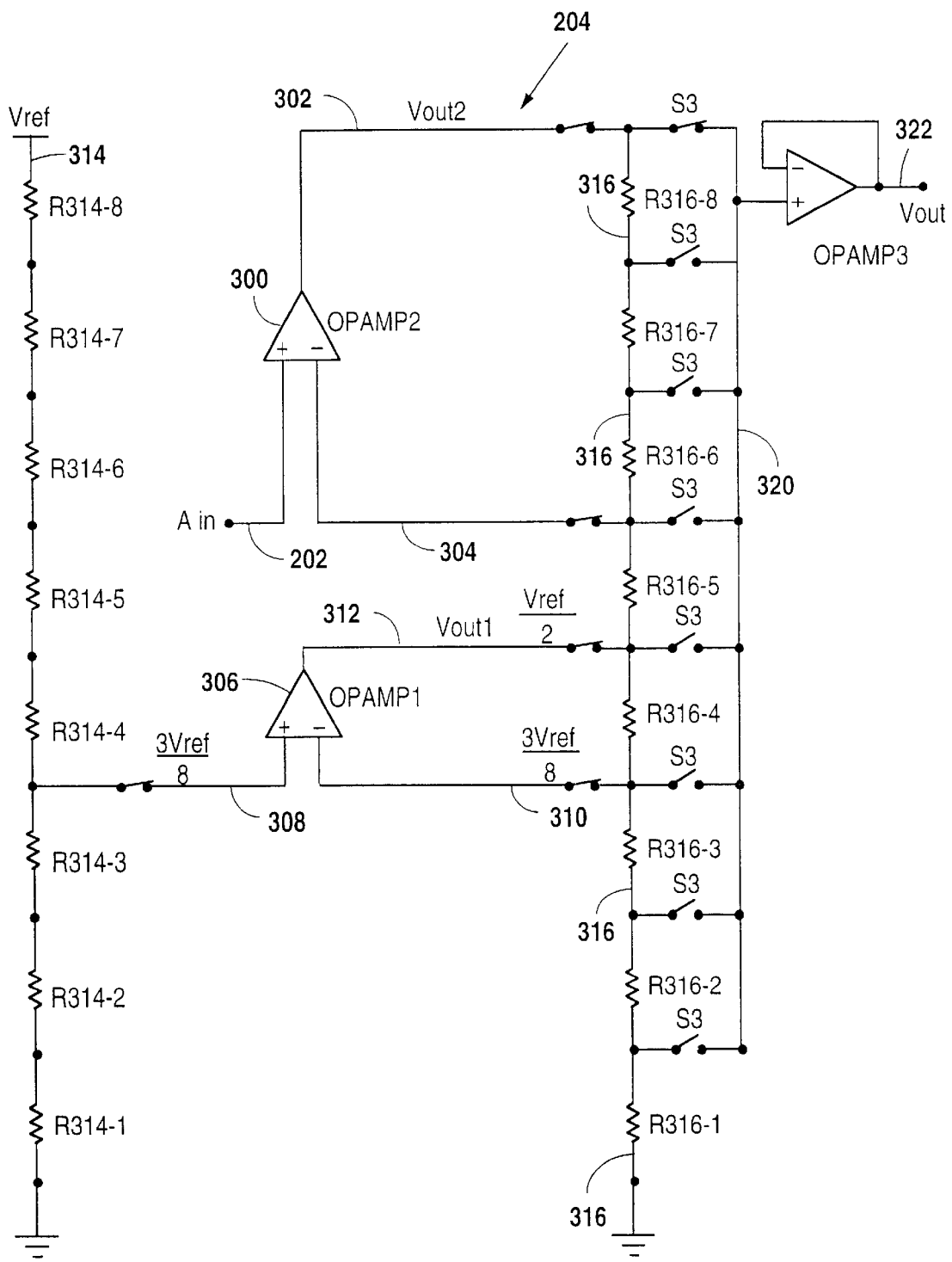

FIGS. 3B–3F provide illustrative examples as to how the preamplifier block of FIG. 3A is configured to provide a desired gain and Ain' estimation effect. The gain may be set by selectively coupling X–1 resistors between the output Vout2 of OPAMP2 and the inverting input 304 of OPAMP2, where the gain G=X. In the examples of FIGS. 3B–3F, the illustrative gain utilized is G=4. Thus, as shown in FIG. 3B, resistors R316-8, R316-7, and R316-6 are coupled between the output Vout2 of OPAMP2 and the inverting input 304 of OPAMP2. Similarly, three resistors are coupled between the output Vout2 of OPAMP2 and the inverting input 304 of OPAMP2 in FIGS. 3C–3F.

Figure 3C:
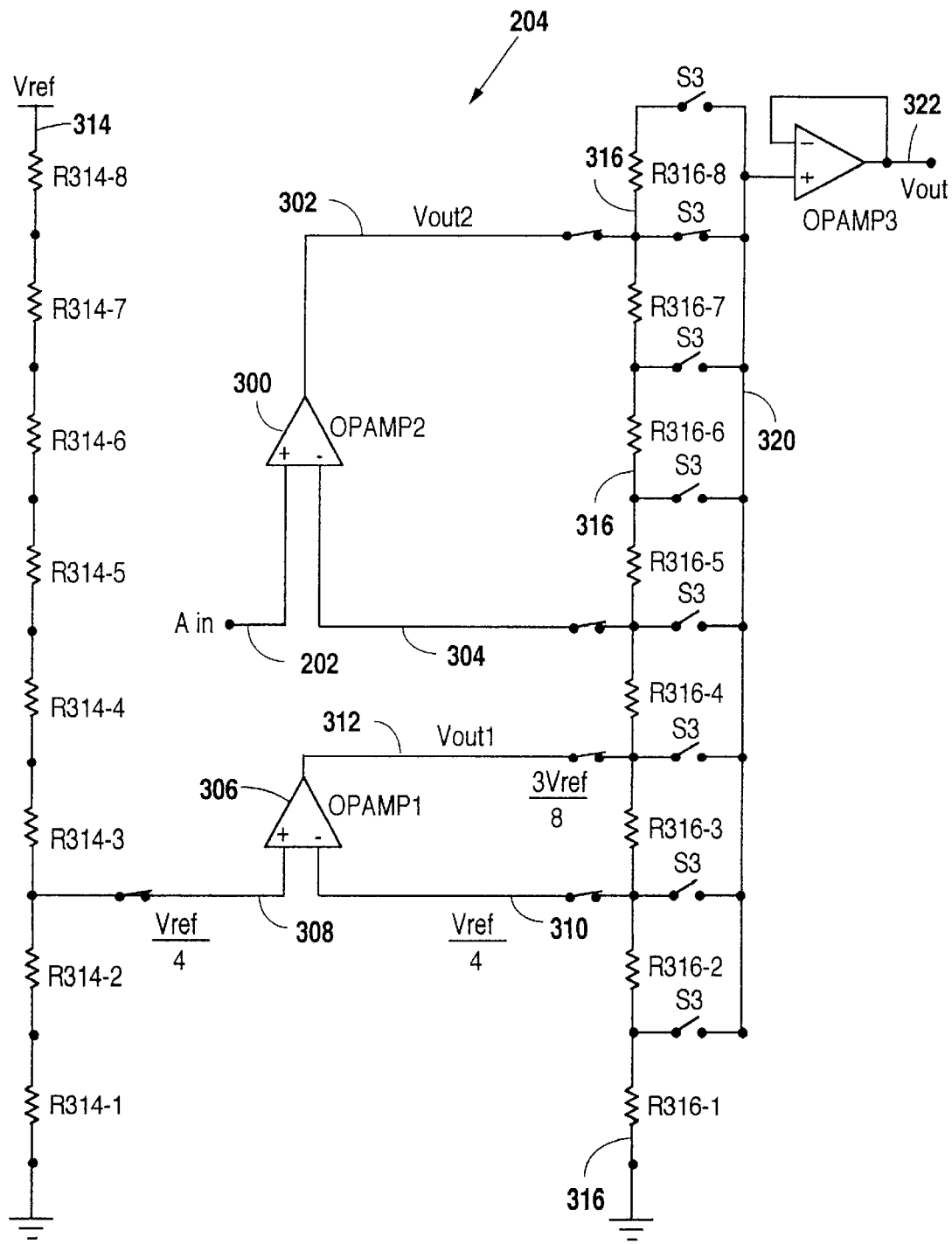
Figure 3D:
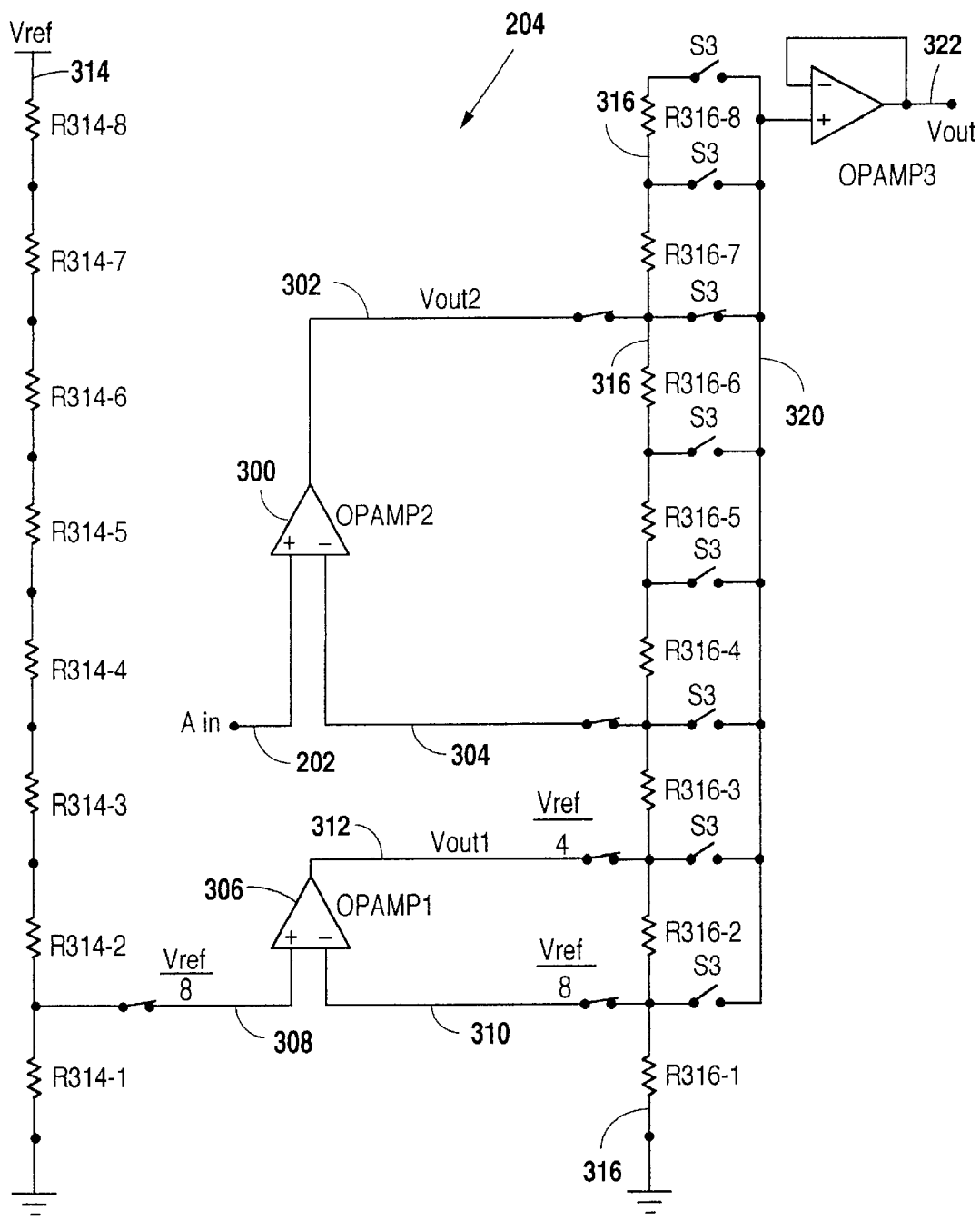
Figure 3E:
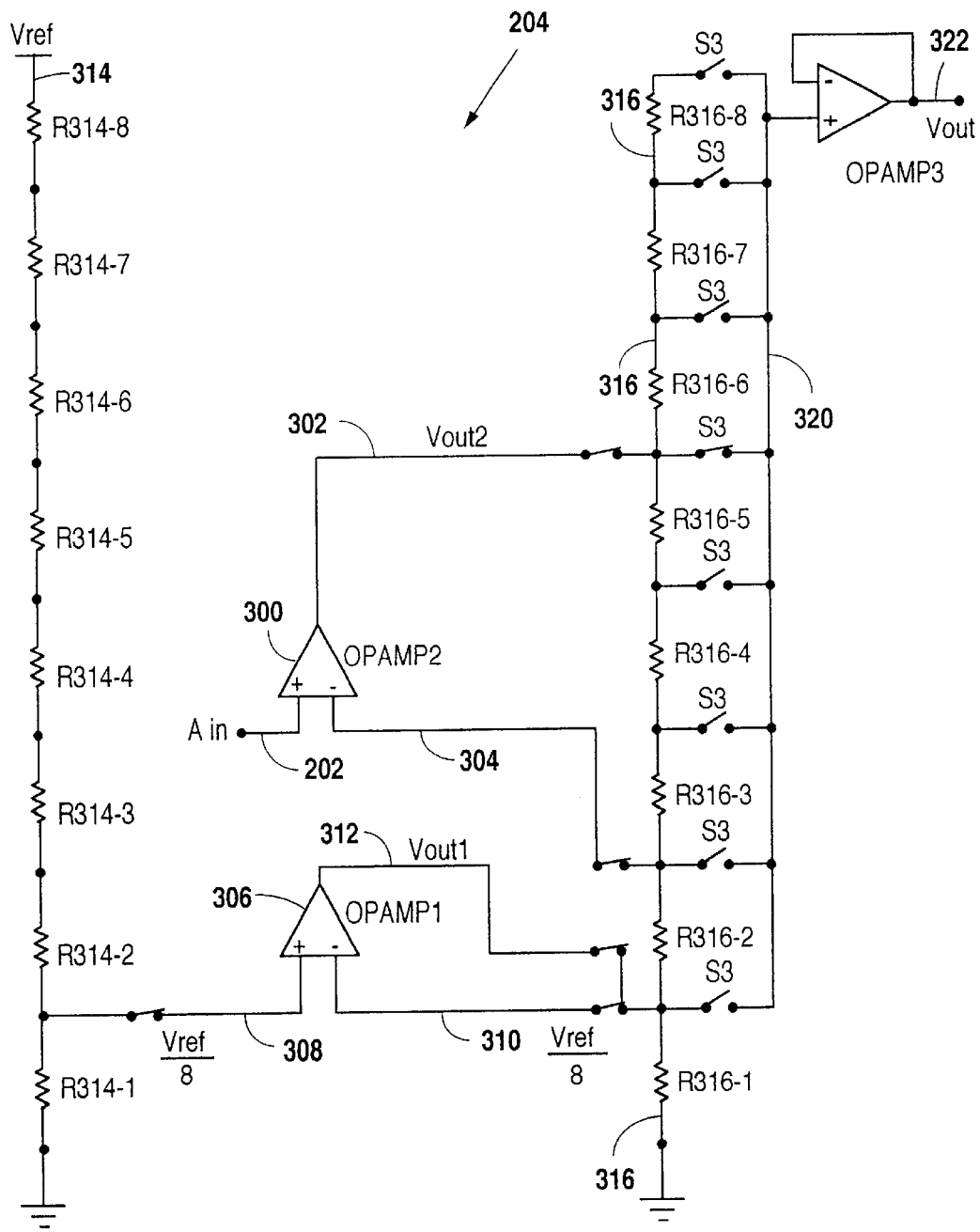
Figure 3F:
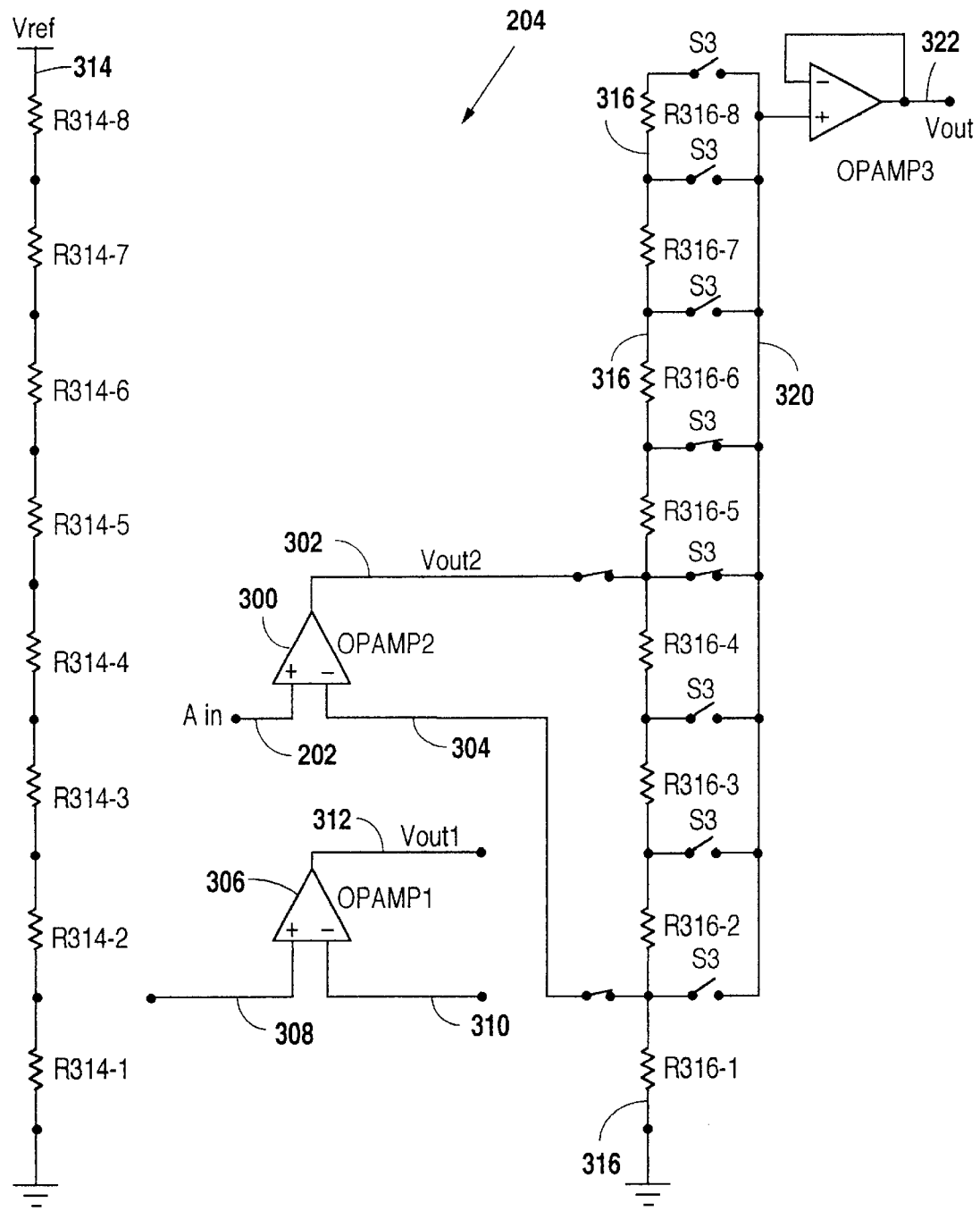

In each configuration of FIGS. 3B–3E, the noninverting input 308 is selectively coupled to one tap of the resistor string 314 depending upon the estimated value for Ain'. Thus, for different Ain' estimations, a different tap of the resistor string 314 may be provided to the noninverting input 308. The inverting input 310 of OPAMP1 is then coupled to the equivalent tap of resistor string 316. The configurations for different Ain' estimations are shown in FIGS. 3B–3F. Thus as shown in FIG. 3B, the tap above resistor R314-3 is coupled to the noninverting input 308 of OPAMP1 (a voltage level of 3Vref/8) and likewise the inverting input 310 of OPAMP1 is coupled to the tap above resistor R316-3. As shown in FIG. 3C, the tap above resistor R314-2 is coupled to the noninverting input 308 of OPAMP1 (a voltage level of 1Vref/4). As shown in FIGS. 3D and 3E, the tap above resistor R314-1 is coupled to the noninverting input 308 of OPAMP1 (a voltage level of 1Vref/8). In each configuration the corresponding tap of resistor string 316 is selectively coupled to the inverting input 310 of OPAMP1 as shown. In the embodiment of FIG. 3F, Ain' is near zero, and the OPAMP1 output is not used.

In each case shown in FIGS. 3B–3E, the output Vout1 of OPAMP1 is, selectively coupled to the resistor string 316 at a location of one resistor above the location that the inverting input 310 is coupled. The inverting input 304 of OPAMP2 is then coupled to the resistor string 316 at a location of one resistor above the location that the Vout1 of OPAMP1 is coupled. The output Vout2 of the OPAMP2 is then selectively coupled through a switch S2 to the resistor string 316 at the appropriate number of resistors above the inverting input 304 that is required to achieve the desired gain. A small voltage drop will result through switch S2, however as explained in more detail below, the voltage at the resistor string 316 will be independent of the switch S2 resistance by virtue of negative feedback. As mentioned above, the illustrative gain of FIGS. 3B–3F is G=4, and thus, three resistors are placed between the output Vout2 and the inverting input 304. In each configuration of FIGS. 3B–3F, one of the switches S3 is closed so that the voltage at the resistor string 316 may be coupled to line 320 (the noninverting input of OPAMP3). The overall preamplifier output (VOUT) is merely the voltage at the noninverting input of OPAMP3.

The equations below show the transfer function for each of the configurations of FIGS. 3B–3F. It will be noted that the gain in these embodiments was configured for G=4.

FIG. 3b: $VOUT = 4\left(Ain - \frac{3}{8}Vref\right)$

FIG. 3C: $VOUT = 4\left(Ain - \frac{9}{32}Vref\right)$

FIG. 3D: $VOUT = 4\left(Ain - \frac{3}{16}Vref\right)$

FIG. 3E: $VOUT = 4\left(Ain - \frac{3}{32}Vref\right)$

FIG. 3F: $VOUT = 4Ain$

When compared to the generalized equation VOUT=G(Ain–Ain'), the equations above demonstrate the effective Ain' that is obtained by using the configurations of FIGS. 3B–3F. A correlation or mapping table may be established to correlate the appropriate tap to be selected for a given gain level to achieve the desired effective Ain' estimation voltage. It is noted that the voltage at the noninverting input 308 is not the actual Ain' estimation voltage, but rather the effective Ain' voltage that is obtained is dependent upon the gain level selected and the voltage at the noninverting input 308. The general equation which characterizes the preamplifier is:

$$VOUT = GAin - (G-1)Vref\left(\frac{1+n}{N}\right)$$

where N is the number of resistors in the resistor string 314 and n is the tap number that is coupled to the noninverting input 308 of OPAMP1 (i.e., in FIG. 3B the tap coupled to the noninverting input is the tap above resistor R314-3 and thus n=3).

The preamplifier circuit of FIG. 3A may be readily calibrated to calculate the gain and offset of the amplifier topology. Because the resistor strings 314 and 316 will have some resistance variations and errors, the resistor strings may first be calibrated to a relatively high precision (for example 20 bit precision). The resistor string 314 may be calibrated with a dc accurate delta sigma ADC. For example, a 6 bit resistor string (64 resistors) may be calibrated with a 20 bit delta sigma ADC. The calibrated resistance values of the resistor string 314 may then be used in the resistor string 316 calibration. Using the calibrated resistor values of the resistor string 314, the preamplifier calibration may then be performed by recognizing that VOUT is a linear function of Ain for a given Ain' and that this equation may be described by a gain variable and an offset variable. Two different known values of Ain (provided by the resistor string 314) may then be used to generate two different VOUT values (VOUT being measured accurately, for example with the same 20 bit delta sigma ADC used to calibrate the resistor string 314). Knowing VOUT for two different Ain values allows the linear equation to be solved to obtain the gain and offset values. Each preamplifier network topology (i.e., all allowable combinations of tap connections) may have unique gain and offset calibration values. Thus, the calibration may be performed for every combination of gain G and the allowable input opamp tap connections.

In order to provide for amplifier headroom in the presence of gained amplifier offsets and estimation error, it may be desirable to limit the swing of VOUT. Thus, for example, VOUT may be limited to a range of Vref/4 to 3Vref/4 (half of the ADC range). The corresponding limits on the input Ain are thus:

$$\text{Lower Limit } Ain = \frac{Vref}{4G} + \left(\frac{G-1}{G}\right)Vref\left(\frac{1+n}{N}\right)$$

$$\text{Upper Limit } Ain = \frac{3Vref}{4G} + \left(\frac{G-1}{G}\right)Vref\left(\frac{1+n}{N}\right)$$

It will be recognized that the swing limits shown above for VOUT are merely exemplary and other limits may be utilized, for example only ¼ of the ADC range may be allocated for offsets.

Figure 4A:
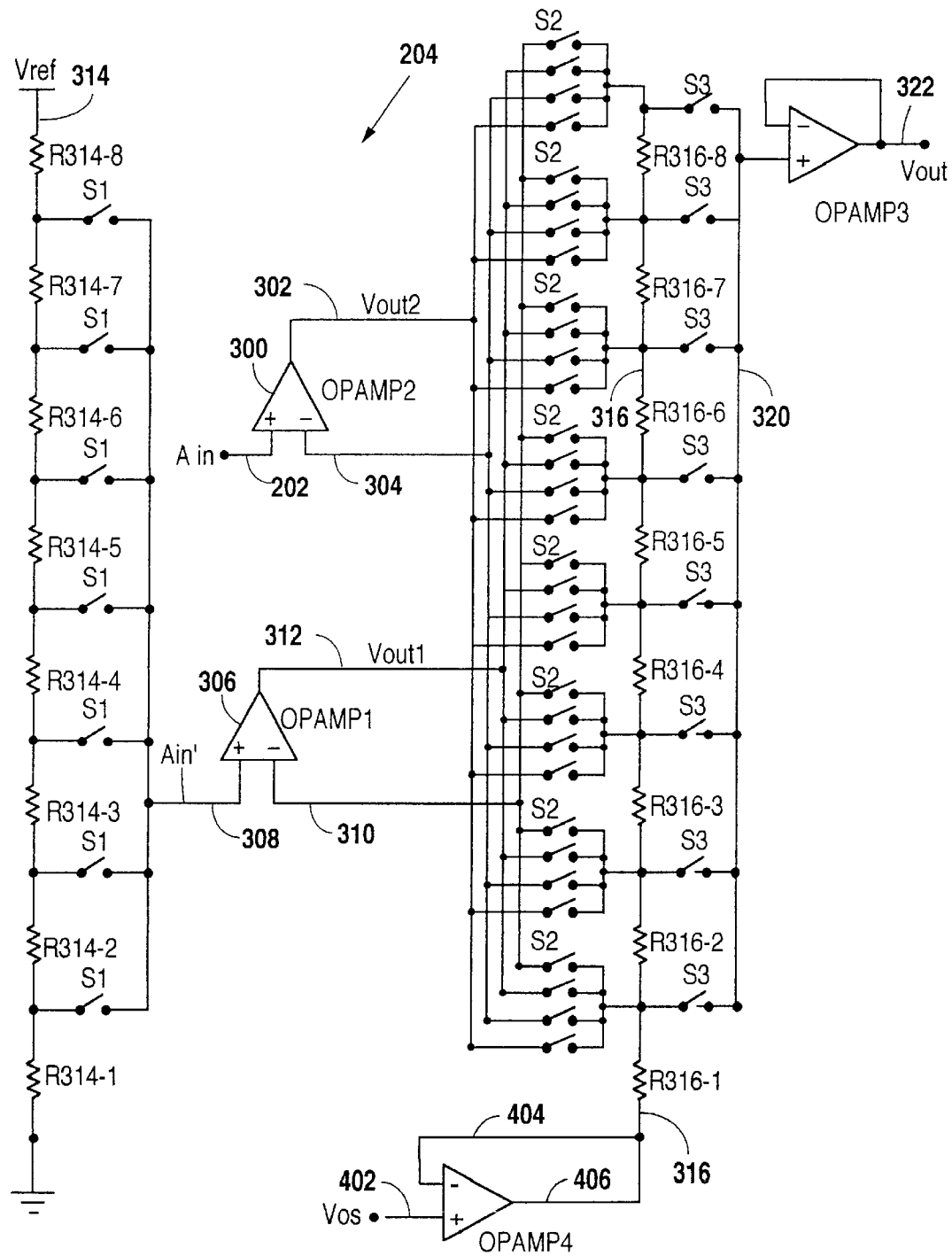
FIGS. 4A–4B illustrate another circuit design for implementing the programmable gain preamplifier disclosed herein.
Figure 4B:
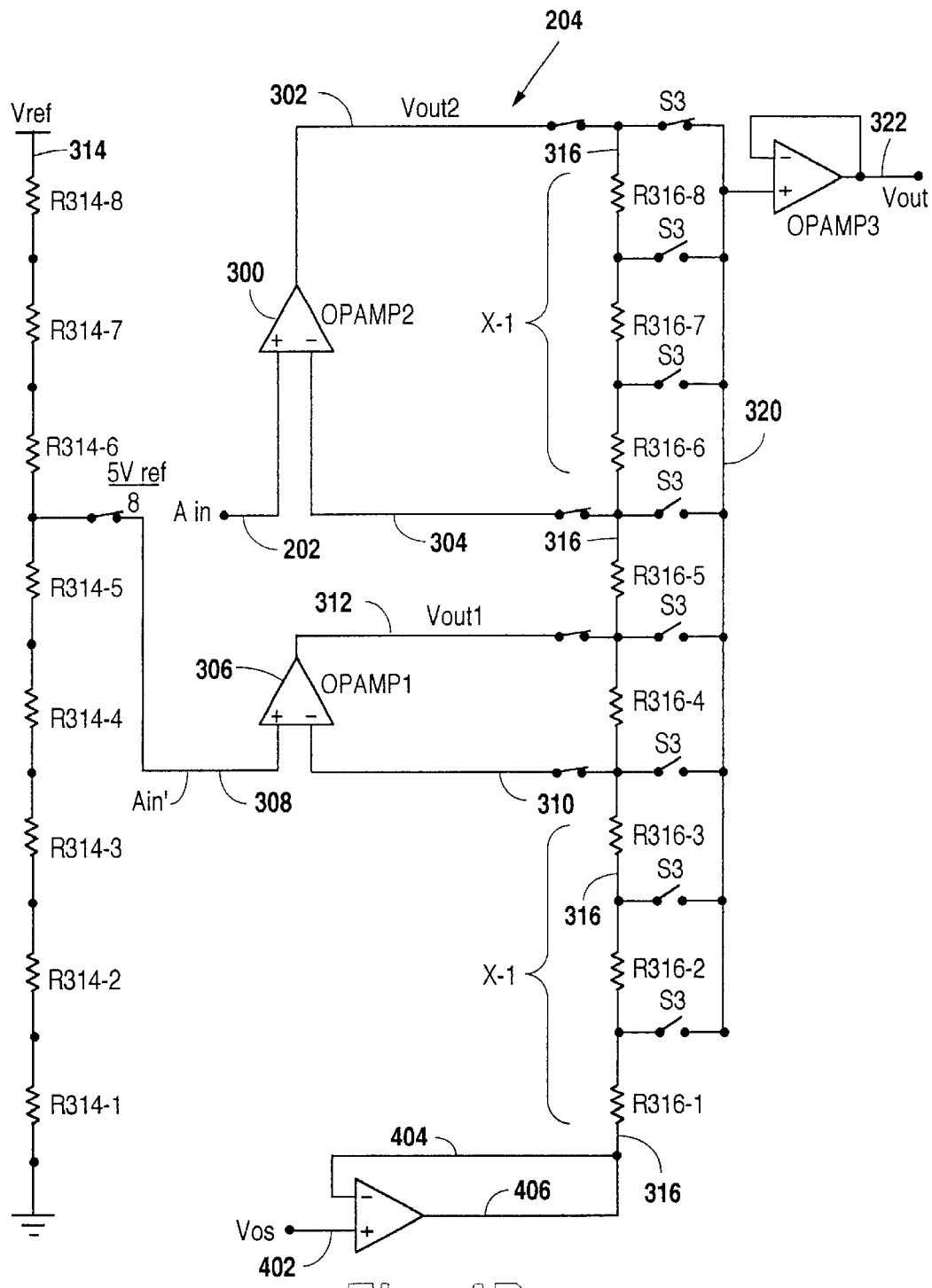

An alternative preamplifier configuration which may be utilized to obtain the generalized functionality of VOUT= G(Ain−Ain') is shown in FIGS. 4A–4B. The embodiment of FIG. 4A is similar to the embodiment of FIG. 3A except for the addition of OPAMP4 which has its output 406 and inverting input 404 coupled to the bottom of resistor string 316. The noninverting input 402 of the OPAMP4 is coupled to an offset voltage Vos. The OPAMP4 connection to the bottom of resistor string 316 may also use a force/sense arrangement similar to that described in FIG. 5D below. In operation the configuration of FIG. 4A is switched differently than the configuration of FIG. 3A. In particular, the configuration of FIG. 4A is operated with the switch S2 settings being independent of the switch S1 settings (as opposed to the configurations of FIGS. 3B–3E in which the corresponding tap from resistor string 314 and resistor string 316 are coupled to the noninverting input 308 and the inverting input 310 of the OPAMP1 respectively). As described with respect to FIG. 4B, the configuration of FIG. 4A allows for a more ideal separation of the Ain' and G effects within the preamplifier.

In the configuration of FIGS. 4A and 4B, the Ain' estimate is provided to the noninverting input 308 of OPAMP1. In the example of FIG. 4B, the Ain' estimate is (5/8)Vref The switches S2 are configured so that for a desired gain G=X, X−1 resistors are coupled between the OPAMP2 output Vout2 and the OPAMP2 inverting input 304. Similarly, the switches S2 are configured so that X−1 resistors are coupled between the OPAMP1 output Vout1 and the OPAMP4 input 404. A single resistor is coupled between the OPAMP1 output Vout1 and the OPAMP2 inverting input 304. The example shown in FIG. 4B demonstrates a configuration having resistor strings comprised of 8 resistors and a gain=4. As with the configurations of FIGS. 3A–3F, the resistor string length is shown for illustrative purposes and an actual implementation may utilize other numbers of resistors. For example, a preamplifier which is to operate with gains of 1 to 32 may be configured with a resistor string 316 which has 64 resistors. It will be recognized that other resistor string lengths may be utilized to achieve more or less gain options or voltage levels for the noninverting input 308. Moreover, the lengths of the resistor strings 314 and 316 are not required to be the same.

The generalized equation that characterizes the circuitry of FIGS. 4A and 4B is:

$$VOUT=Vos+G(Ain-Ain')$$

The optimum Vos value may be Vref/2 if the ADC coupled to the preamplifier converts from 0 to Vref. In order for the OPAMP1 of FIGS. 4A and 4B to operate properly, the output of OPAMP1 should be greater than a minimum, Vmin, where Vmin allows some output stage headroom (typically 100–150 mV) above the negative supply rail. Solving the relationship between Vout1 and Ain' demonstrates that:

$$Ain' > \frac{Vref}{2N} + Vmin\left(\frac{N-1}{N}\right)$$

The calibration techniques discussed above may also be utilized for calibrating the circuitry of FIGS. 4A and 4B.

It will be recognized from the discussion above and FIGS. 4A and 4B that the inputs Ain and Ain' may be switched such that the Ain signal is coupled to OPAMP1's noninverting input 308 and the Ain' estimation signal is coupled to OPAMP2's noninverting input 202. Switching the inputs of FIG. 4A results in a change in the sign of the preamplifiers' gained difference (the G(Ain−Ain') component of the preamplifier output). The advantages and benefits of the disclosed preamplifier structures and techniques will still be obtained.

The choice between the use of the preamplifier configurations of FIGS. 3A–3F and the preamplifier configurations of FIGS. 4A–4B need not be a mutually exclusive selection. For example, a preamplifier may be configured as shown in FIGS. 3A–3F when low gains are desired while the preamplifier may be switched to the configuration of FIGS. 4A–4B when high gains are desired. The type of preamplifier configuration (FIG. 3A–3F type vs. FIG. 4A–4B type) may also be programmable. In the example mentioned above, the type of preamplifier configuration utilized may be programmed based upon the desired gain. However, other factors may also be considered when selecting which preamplifier configuration to utilize, including characteristics of the analog input signal, relative magnitudes of opamp and resistor noise, the type of signal processing performed downstream of the preamplifier, etc. Further, other types of preamplifier configurations may be programmably used with any of the preamplifier configurations shown herein. For example, the preamplifiers shown herein may be utilized for some gain and/or estimate levels while other preamplifiers may be used for other gain and/or estimate levels.

A variety of circuit and layout techniques may be utilized to optimize the performance and characteristics of the preamplifiers disclosed herein. These circuit and layout techniques may relate to the types of opamps utilized, the arrangement of the resistor strings, the implementation of the switches, temperature compensation, etc. Some circuit and layout techniques which may be utilized to implement the programmable gain preamplifier are discussed below, however, the programmable gain preamplifier disclosed herein is not limited to the specific implementation described. Moreover, the improvement techniques disclosed herein may be used together or independently of each other.

Any of a wide variety of opamps may be utilized to implement OPAMP1, OPAMP2, and OPAMP3. For example, OPAMP1 and OPAMP3 may be implemented with standard voltage feedback opamps since these opamps are not used to provide a wide gain range. OPAMP2, however, is configured to operate over a wider gain range (for example 2 to 32). Because of this gain range, OPAMP2 may be implemented as a current feedback opamp. Current feedback opamps are known in the art, for example as shown in U.S. Pat. No. 4,628,279 to Nelson. Such opamps provide a −3 dB bandwidth that is relatively independent of the closed loop gain. This provides a relatively constant noise bandwidth as a function of gain and thus may lessen the variation in antialiasing filter requirements downstream of the preamplifier.

The opamps utilized in the programmable gain preamplifier may also be CMOS chopper stabilized opamps. Chopper stabilized opamps reduce the poor 1/f noise and offset characteristics of non-chopper CMOS opamps. Chopper stabilized opamps are well known in the art, for example as shown in Allen and Holberg, *CMOS Analog Circuit Design*, Oxford University Press, p. 490–497, (1984), the disclosure of which is incorporated herein by reference. The use of chopper stabilized opamps is particularly beneficial if the signal processing circuitry downstream of the preamplifier is an ADC circuit. In an ADC application, the ADC may perform one conversion with all the opamps in the first chopper phase of a chopper signal and then the ADC may perform the next conversion with all the opamps in the second chopper phase of a chopper signal. The two ADC conversion results may then be averaged to remove offset and noise. Thus, a given final ADC digital output may be an output obtained as an average of at least two ADC conversions. Half of the ADC conversions being averaged may be performed on an analog input provided from the preamplifier while the preamplifier is in the first chopper phase and the other half of the ADC conversions may be performed on an analog input provided from the preamplifier while the preamplifier is in the second chopper phase. All of the opamps in FIGS. 3A and 4A may be chopped in this manner.

Thus, a preamplifier having chopper stabilized opamps is provided and the chopping may be performed synchronously with at least some operations of the downstream signal processing circuitry, for example synchronously with ADC conversion cycles. The chopping need not be performed at all times. For example, a user supplied chopping control signal may enable chopping. Further, chopping may be applied for high preamplifier gains but not at low gain values. Chopping and its attendant loss of ADC throughput is also unnecessary in ac-coupled applications not sensitive to offset and low frequency noise. Thus, at low gain or with the preamplifier not utilized (bypassed), an increased system throughput may be obtained since chopping is not utilized.

The accuracy and temperature drift of the resistor strings 314 and 316 will significantly impact the performance of the programmable gain preamplifiers disclosed herein. In order to improve the accuracy of the resistor strings, laser trimming of the resistors may be utilized or the resistors may be digitally calibrated or both. As mentioned above, the temperature drift of the resistor string is also important. For example, if the resistors are formed in polysilicon, the resistor ratios may demonstrate a temperature drift of ppm/° C. (individual resistances have resistance value drifts of order 600 ppm/° C.) over the temperature range of 25° C. to 125° C. Thus, the preamplifiers disclosed herein are particularly suited for techniques that minimize the ratio drift of resistor strings. One such technique relates to the location of the contacts between the polysilicon resistors and the metallization layers that connect to the resistors. In order to decrease the temperature drift of the resistor structure it is desirable to place the contacts and taps to the resistor string outside the current path of the resistor string.

Figure 5A:
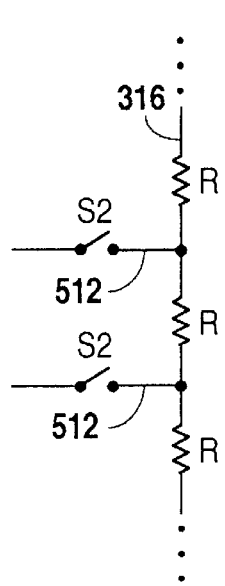
FIGS. 5A–5D illustrate a technique for providing contacts to the resistor strings of the programmable gain preamplifiers disclosed herein.
Figure 5B:
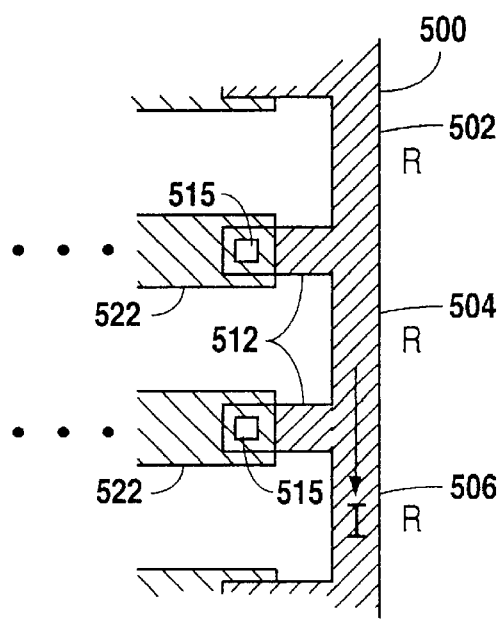
Figure 5C:
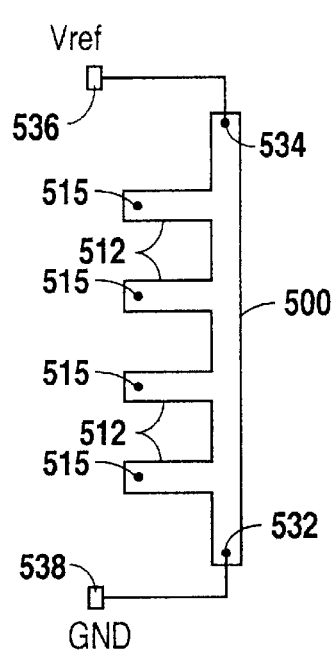
Figure 5D:
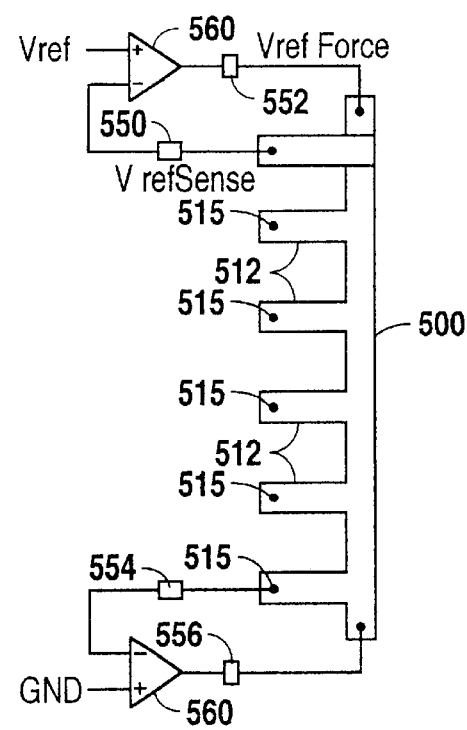

FIGS. 5A and 5B illustrate a technique for placing the contacts to the resistor strings outside of the current path of the resistor string. FIG. 5A illustrates a portion of the resistor string 316 of FIGS. 3A and 4A. As shown in FIG. 5A, taps 512 are coupled between the resistors and switches S2. This resistor string circuit may be implemented in an integrated circuit by use of the structure shown in FIG. 5B. As shown in FIG. 5B, the resistors are formed in a polysilicon layer 500. Each resistor corresponds to a length or segment of polysilicon such as segments 502, 504, and 506. Metallization layers 522 couple the taps 512 of the resistor string to the switches S2 (not shown). As can be seen from FIG. 5B, the contacts 515 which electrically connect the polysilicon and metallization layers are all located outside of the current path I of the resistor string. Ideally all of the contacts to the resistor string taps may be placed substantially outside of the current path of the resistor and sense connections can be provided at the top and bottom of the strings. Additional exemplary resistor string configurations having all the tap contacts out of the resistor string current path are shown in FIGS. 5C and 5D. As shown in FIG. 5C, the resistor layer 500 (for example polysilicon) has a series of taps 512 that each have a contact 515 placed out of the resistor string current path. One end of the resistor string is shown coupled through a contact 534 to an external source 536 for providing Vref (Vref may alternatively be generated within the integrated circuit). The other end of resistor string is coupled through a contact 532 to another supply 538 (for example an external ground connection). Inherently the voltage source contacts 534 and 532 will be within the resistor string current path, and as used herein, removing all the resistor string tap contacts from the current path does not require such source contacts to be removed from the path. FIG. 5D illustrates another method of coupling a reference voltage and ground to the resistor string which as used herein also illustrates all tap contacts being located out of the current path (i.e., all but the supply contacts). As shown in FIG. 5D, a force/sense scheme with opamps 560 may be utilized. The opamps may be external to the preamplifier integrated circuit and connected through Vref sense pin 550, Vref force pin 552, GND sense pin 554 and GND force pin 556. Alternatively, the opamps may be internal to the preamplifier integrated circuit. It will also be recognized that the benefits of the present disclosure may still be realized if only a substantial majority of the tap contacts are located outside of the resistor string current path.

By providing contacts to the resistor strings that are outside of the current path of the resistor string, the individual resistors of the resistor string may exhibit low temperature drifts relative to each other. Thus, though it may be acceptable for the absolute temperature coefficient drift of each resistor to be large (for example 600 ppm/° C.), it is desirable for the difference in the drift between nominally identical resistors to be small. For example, utilizing the resistor string techniques discussed herein, a resistor string comprised of resistors with an absolute temperature drift of 600 ppm/° C. may have a relative drift between any two resistors that is less than 1% of the individual absolute temperature drift of the single resistor. Resistor strings having resistors with a relative drift between resistors of less than 1% the drift of a single resistor may be characterized as low drift resistor strings. More preferably, a low drift resistor string will have a relative drift between resistors of less than 0.1% of the individual drift. Thus, for example, the techniques discussed herein may provide a low drift resistor string in which the relative drift between resistors is on the order of 0.3 ppm/° C. even though the resistor string is comprised of resistors which have an individual absolute drift of 600 ppm/° C.

Though shown in FIGS. 5A and 5B with respect to the second resistor string 316, this technique for placement of the contacts to the resistor string may also be utilized with the first resistor string 314. Thus, a homogeneous resistor string formed of a common resistive material having taps is provided. As mentioned above, the resistor values for the resistor strings may all be set to the same values, thus providing matching resistor strings. Other tap and contact layouts may also be utilized in addition to the layout shown in FIG. 5B in order to achieve the desired placement of contacts outside the resistor string current path. For example, the layout in U.S. Pat. No. 5,319,319 provides another resistor string having the taps and contacts located outside the current path.

Figure 1:
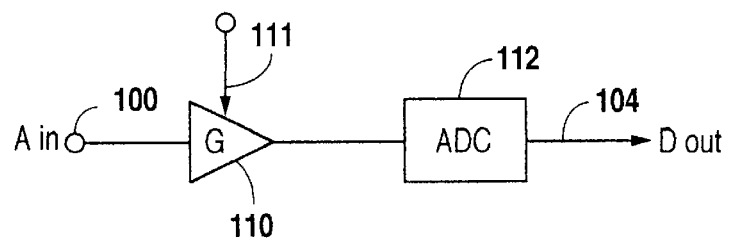
FIG. 1 is a prior art system for converting an analog signal to a digital signal.
Figure 1A:
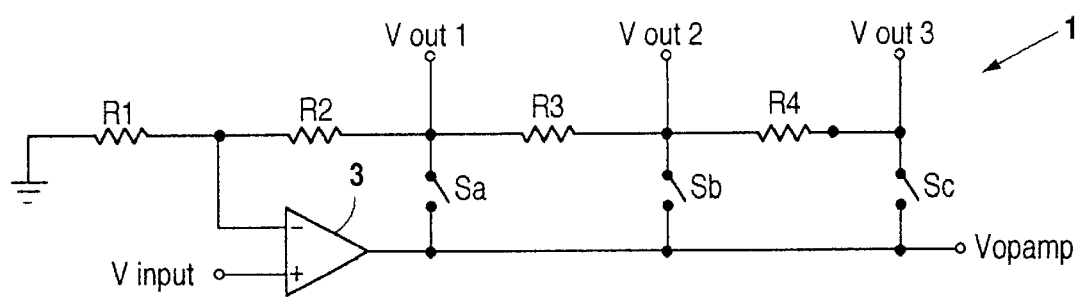
FIG. 1A shows an exemplary prior art programmable gain preamplifier.
Figure 5E:
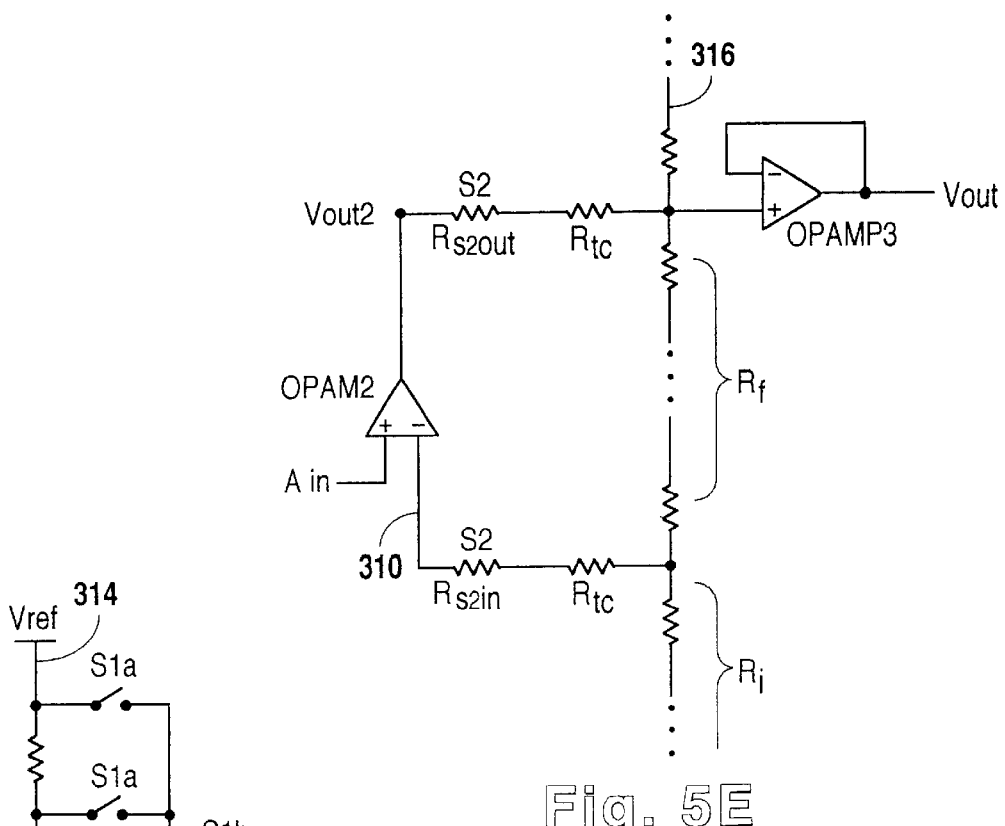
FIG. 5E illustrates a portion of a programmable gain preamplifier which may utilize the techniques for providing contacts out of a resistor string current path.

The placement of the resistor string tap contacts out of the current path is particularly advantageous when it is recognized that the output of the preamplifier may be independent of the switch resistance of the switches utilized to couple the opamps to the resistor strings (as mentioned above with reference to FIG. 1). More particularly, FIG. 5E illustrates a portion of the preamplifier circuit of FIGS. 3A and 4A. As shown in FIG. 5E, OPAMP2 is coupled to the resistor string 316 through closed switches S2. The switch S2 coupled between the OPAMP2 output Vout2 and the resistor string 316 has a resistance $R_{S2OUT}$ and the switch S2 coupled between the OPAMP2 inverting input 310 and the resistor string 316 has a resistance $R_{S2IN}$. The resistance of the tap and contact connecting the switches S2 to the resistor string 316 is shown as Rtc. Because no current flows into the OPAMP2 input, there is no voltage drop across the switch having the resistance $R_{S2IN}$ or the associated tap/contact resistance Rtc. Further, although current flows through the switch coupled to the OPAMP2 output and Vout2 is dependent upon the resistance of that switch and its associated tap and contact ($R_{S2OUT}$ and Rtc), it can be shown that the voltage VOUT at the resistor string is dependent only upon the input voltage, the resistance Rf, and the resistance Ri since:

$$VOUT = Ain\left(1 + \frac{Rf}{Ri}\right)$$

Thus, VOUT (and the preamplifier gain) may be independent of the temperature drift of the switch resistances and independent of the temperature drift of the tap and contact resistances. Thus, VOUT (and gain) will be independent of the series resistance of the tap connected to the switch and the associated resistance of the contact at that tap as long as the contacts are located out of the current path of the resistor string.

The preamplifier configurations shown herein, therefore, provide an output that applies a gain to the difference between the Ain signal and Ain' estimation signal and that gain is highly stable with very low temperature drift. The gain may be highly stable since the resistor strings that provide the Ain' estimation signal and that set the gain may be formed such that the resistor taps and associated contacts are all placed out of the resistor string current path (in a location such that drift in the contact resistance will not change either the Ain' estimation or the preamplifier gain).

Figure 6A:
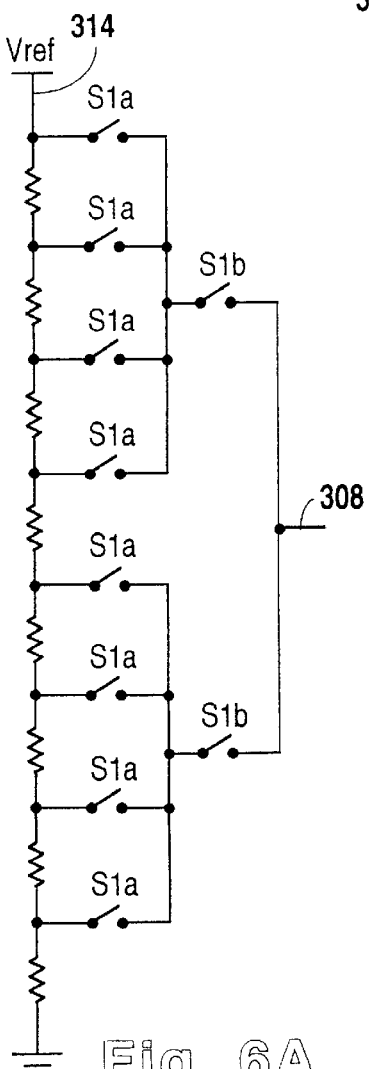
FIGS. 6A and 6B illustrate switching networks which may be utilized with the programmable gain preamplifiers disclosed herein.

The arrangement of the networks of switches S1, S2, and S3 may also impact the performance of the preamplifier circuitry. For example, the network of switches shown in FIG. 3A provide a single switch S1 between each tap of the first resistor string and the noninverting input 308. However, tree type multiplexer switch networks having two or more layers of switches may provide faster switching for a given switch size. FIG. 6A shows a tree type multiplexer switching network for coupling the resistor string 314 to the noninverting input 308. As shown in the figure, any given resistor tap is selected by closing one first layer switch S1a and the corresponding second layer switch S1b. The tree type multiplexer switching network approach may also be utilized for switches S2 and S3. Moreover, more than two layers of switches may be utilized in the tree switching network. In addition, the tree type multiplexer switching networks for switches S1 and S2 may also incorporate the chopper switches utilized if the opamps are operated as a chopper stabilized opamps. Exemplary chopper switches may be seen in U.S. Pat. No. 5,039,989 to Welland et al. in FIG. 7 (switches 232, 234, 236, and 238), the disclosure of which is incorporated herein by reference. Through the use of a tree type multiplexer switching network, the chopper switches may be merged into the S1 and S2 switching networks, blurring the resistor string tapping and the chopper functions.

Figure 6B:
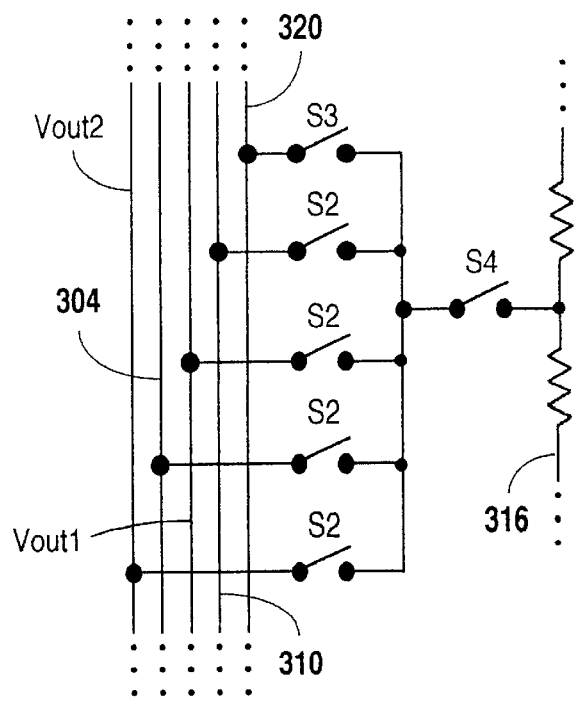

As shown conceptually in FIGS. 3A and 4A, each tap of the resistor string 316 that is coupled to the switches S2 and S3 may be coupled to a plurality of switches S2 because a given tap may be connected to an OPAMP1 input, OPAMP2 input, OPAMP3 input, OPAMP1 output or OPAMP2 output. However due to leakage considerations, it may be desirable to provide only one switch at each location where the resistor string is being tapped as shown in FIG. 6B. Thus, the resistor string 316 may be coupled through a switch S4 to the line 320 (OPAMP3 noninverting input), line 310 (OPAMP1 inverting), line Vout1 (OPAMP1 output), and line Vout2 (OPAMP2 output). In this manner only a single switch (S4) is directly connected to the resistor string 316 while the remaining switches S3 and S2 are coupled to the resistor string 316 through the switch S4. Ideally, switch S4 should have as high a value of switch resistance as thermal noise considerations will allow, since high switch resistance corresponds to a small switch size and lower parasitic leakage currents. When utilizing the circuit of FIG. 6B it is desirable to utilize the switching technique shown in FIG. 7 for coupling the noninverting input of OPAMP3 to the resistor string 316 as described in more detail below.

It will be noted that the circuitry of FIGS. 3A, 3B, and 6B show a single bus line for the OPAMP1 inverting input 310 and a single bus line for the OPAMP2 inverting input 304. When chopper opamps are utilized, a separate bus line may be provided to the network of switches S2 for each of the chopped inputs (i.e., two bus lines for each inverting input). However, the bus line configuration shown in the figures may still be more desirable when chopper opamps are utilized.

Figure 7:
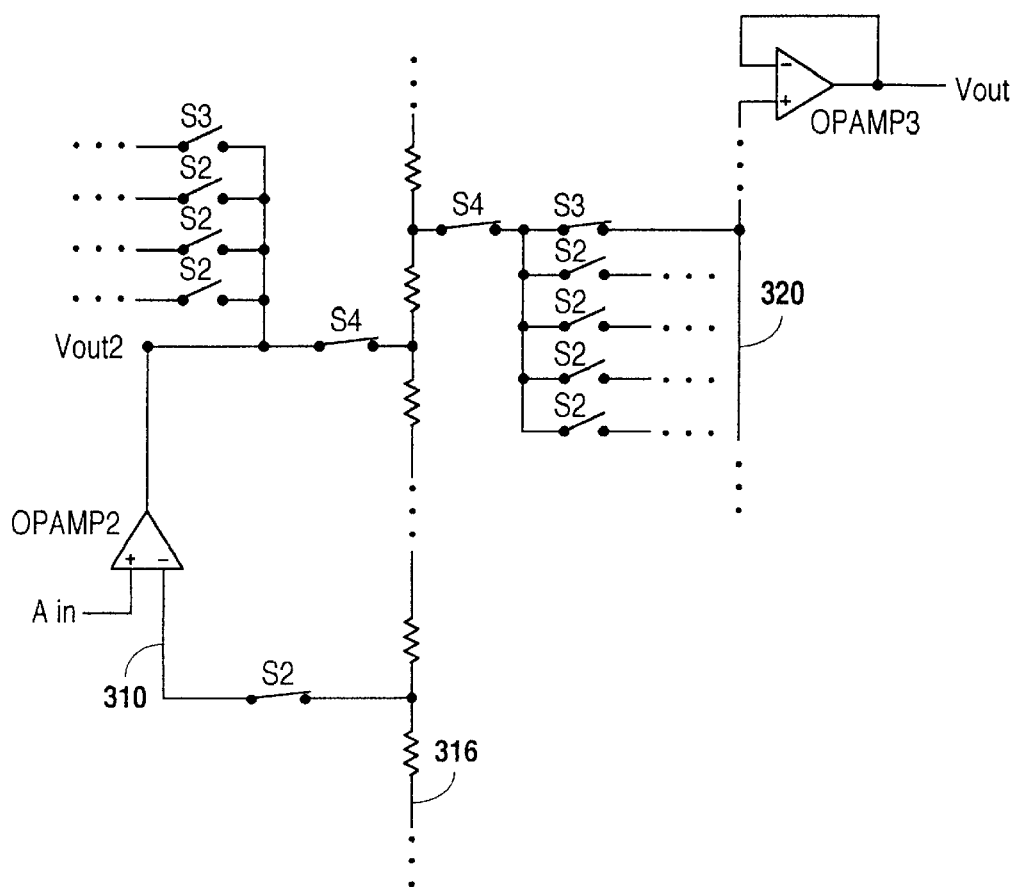
FIG. 7 illustrates a technique for coupling opamps to one of the resistor strings of the programmable gain preamplifiers disclosed herein.

Leakage characteristics may also be improved by adjusting which tap is coupled to the switch S3. As shown in FIGS. 3B–3F and FIG. 4B, the same node along resistor string 316 that is connected to a closed switch S2 (coupled to the OPAMP2 output Vout2) and is also connected to a closed switch S3 (coupled to noninverting input of OPAMP3). By providing two switches at a single node, the leakage at a given node is doubled. However, an alternative configuration is shown in FIG. 7. In FIG. 7, rather than placing the closed switch S3 at the same node as the closed switch S2, the closed switch S3 is tied to a node one resistor above the location of the OPAMP2 output Vout2. The configuration of FIG. 7 will decrease the leakage since no current flows in the resistor string 316 above the OPAMP2 output (every tap above the OPAMP2 output will settle to the same voltage as the OPAMP2 output). Leakage through the switch S3 will, therefore, be decreased as compared to the configurations of FIGS. 3B–3F and FIG. 4B. The switching technique of FIG. 7 is also desirable when using switching connections such as shown in FIG. 6B. More particularly, the FIG. 7 technique helps to prevent nonlinearities and temperature dependent voltage drops which result from current flow in the switch coupling the output of OPAMP2 to the resistor string 316 from being coupled to the OPAMP3 input.

The programmable preamplifier techniques described herein provide a preamplifier having excellent stability and temperature coefficients. However since any amplifier topology will have some offset and gain temperature coefficients, it may be desirable to provide a mechanism to compensate for any temperature coefficients that exist. Such compensation may be achieved by creating calibration tables for different temperatures of the preamplifier. In order to create such tables the preamplifier may provide a temperature output indicative of the temperature of the preamplifier circuitry. The temperature coefficients for gain and offset at various temperatures may then be tabulated. The temperature measured by the preamplifier circuitry need not be highly accurate but rather merely stable and repeatable. In operation, the temperature of the preamplifier may be monitored and compensation tables may then be utilized to appropriately compensate for temperature effects. The preamplifier temperature information may be processed off chip or the compensation information may be integrally processed with the downstream signal processing circuitry.

The temperature of the preamplifier circuitry may be obtained by utilizing circuitry generally existing in most high precision preamplifiers. More particularly, the bandgap reference circuitry of the preamplifier master bias generator may have a Proportional To Absolute Temperature (PTAT) voltage node as is well known in the art. The PTAT voltage may be multiplexed into the OPAMP3 input whenever an indication of the preamplifier temperature is desired, or a separate buffer may provide full-time temperature indication on a separate preamplifier output pin.

The various preamplifier components and techniques disclosed herein may be constructed in a monolithic circuit implementation on a single integrated circuit. The signal processing circuitry (an ADC for example) coupled to the preamplifier output may also be included within the integrated circuit. Alternatively, the signal processing circuitry and the various elements of the preamplifier may be located external to the preamplifier. For example, the resistor strings may be located external to the integrated circuit. The Ain input signal and the Ain' estimation may be provided at input pins to the integrated circuit. The Ain' estimation signal may be, however, generated within the integrated circuit itself.

Thus, a programmable gain preamplifier is provided which has a low temperature drift and good dynamic range characteristics. The programmable gain preamplifier is provided which provides a programmable gain of the difference between two input signals (Ain and Ain' for example). One of the input signals (Ain') may be an estimation of the other input signal (Ain). The estimation input signal (or a signal related to the estimated input) may be generated by the use of a reference voltage and a first resistor string. More particularly, the reference voltage and the first resistor string may operate as a digital to analog converter (DAC) that converts a digital estimation signal to an analog estimation voltage. The analog estimation voltage operates as an analog voltage that is a function of (or the same as) the analog Ain' estimation signal. The first resistor string may provide the estimation voltage without loading the resistor string. Thus, the first resistor string may be simultaneously utilized by other circuitry, such as for example, a downstream ADC. The programmable preamplifier gain may be set by the use of a second resistor string and digitally programmable switches. Contacts to the resistor strings may be placed outside of the current path of each resistor string to provide highly stable resistor strings having a very low temperature drift. In one preamplifier embodiment, some or all of the opamps may chopper stabilized opamps, at least one opamp may be a current feedback opamp, the resistor strings may be at least 64 resistors long and programmable gains from 1 to 32 may be provided.

Figure 8:
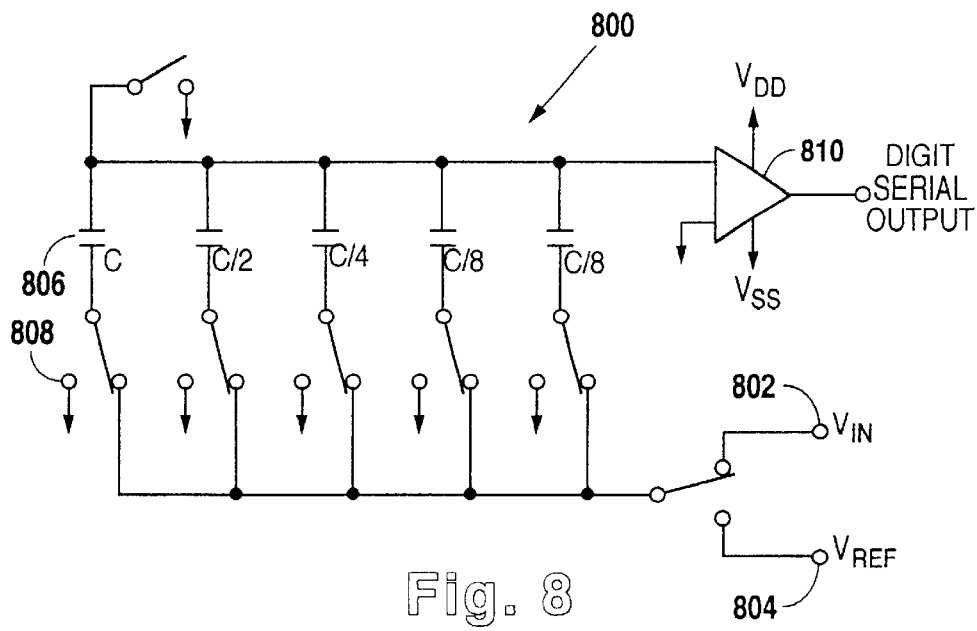
FIGS. 8 and 9 illustrate prior art switched weighted capacitor array ADCs.

As mentioned above, the signal processing circuitry coupled to the programmable gain preamplifier output may include a variety of types of circuits, including for example, ADC circuitry. In one example, the ADC may be a successive approximation ADC. One type of successive approximation ADC is a switched binary weighted capacitor ADC. Generally, in a switched binary weighted capacitor ADC an array of binary weighted capacitors and a comparator are provided. An analog input signal and a voltage reference are provided to the capacitor array. The capacitor array provides a successive approximation output which is coupled to an input of a comparator. The comparator compares the capacitor array output to another reference (for example ground) to produce a digital output. An exemplary prior art switched weighted capacitor ADC is shown in FIG. 8. As shown in FIG. 8, the ADC 800 may include an analog input 802, a reference input 804, an array of capacitors 806, an array of switches 808, and a comparator 810 which receives as inputs the capacitor array output and ground. In operation, the analog input voltage 802 is sampled and the various switches are successively opened and closed and the capacitor array output is compared to ground to create a digital number. The operation of a switched capacitor array is described in more detail in U.S. Pat. No. 4,129,863 to Gray et al., the disclosure of which is incorporated herein by reference.

Figure 9:
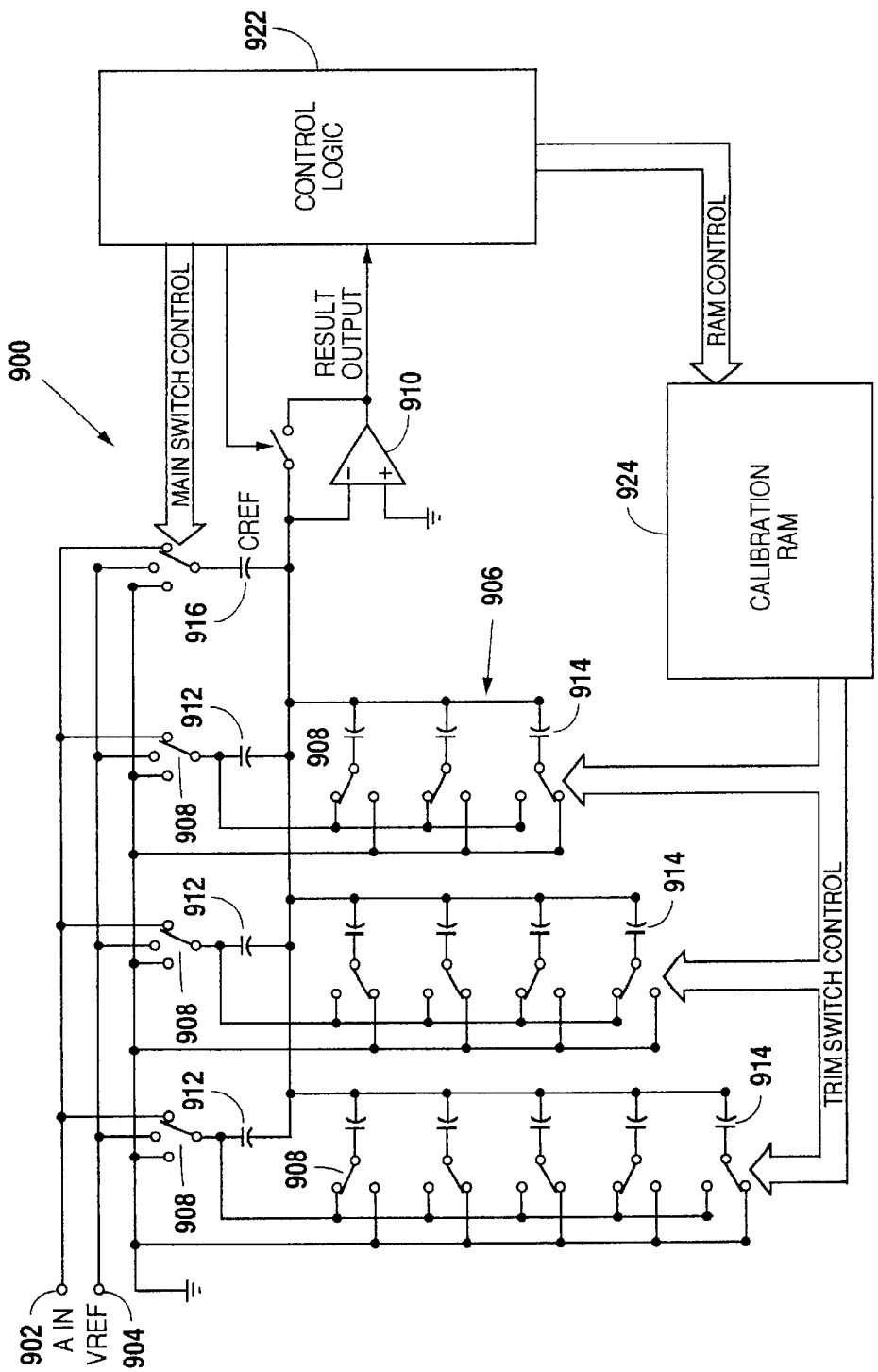

The accuracy of the switched capacitor array ADC 800 of FIG. 8 is affected by the accuracy of the capacitance values of the capacitor elements. The capacitor elements may exhibit errors as originally fabricated and may exhibit errors that change over time and temperature. Thus, it is desirable to calibrate the capacitor array at repeated intervals and it is desirable that the ADC circuitry be self-calibrating. An exemplary prior art self-calibrating ADC circuit is shown in FIG. 9. As shown in FIG. 9, the ADC 900 may include an analog input 902, a reference input 904, an array of capacitors 906, an array of switches 908, and a comparator 910. The array of capacitors 906 may include primary capacitors 912, trim capacitors 914 and a reference capacitor 916. In calibration, the capacitance of each primary capacitor may be repeatedly compared to the capacitance of the reference capacitor 916. The capacitance of the trim capacitors may be added or subtracted to the capacitance of the primary capacitor as a result of the comparison to the reference capacitor under control of control logic 922 and a calibration ROM 924. The self-calibration of a capacitor array is described in more detail in U.S. Pat. No. 4,709,225 to Welland et al. and in Lee et al., "A Self-Calibrating 15 Bit CMOS A/D Converter," IEEE JSSC, December 1984, p. 813–819, the disclosures of which are incorporated herein by reference. In this manner, the capacitance values of a switched capacitor array may be repeatedly calibrated to provide a more accurate ADC.

Figure 10:
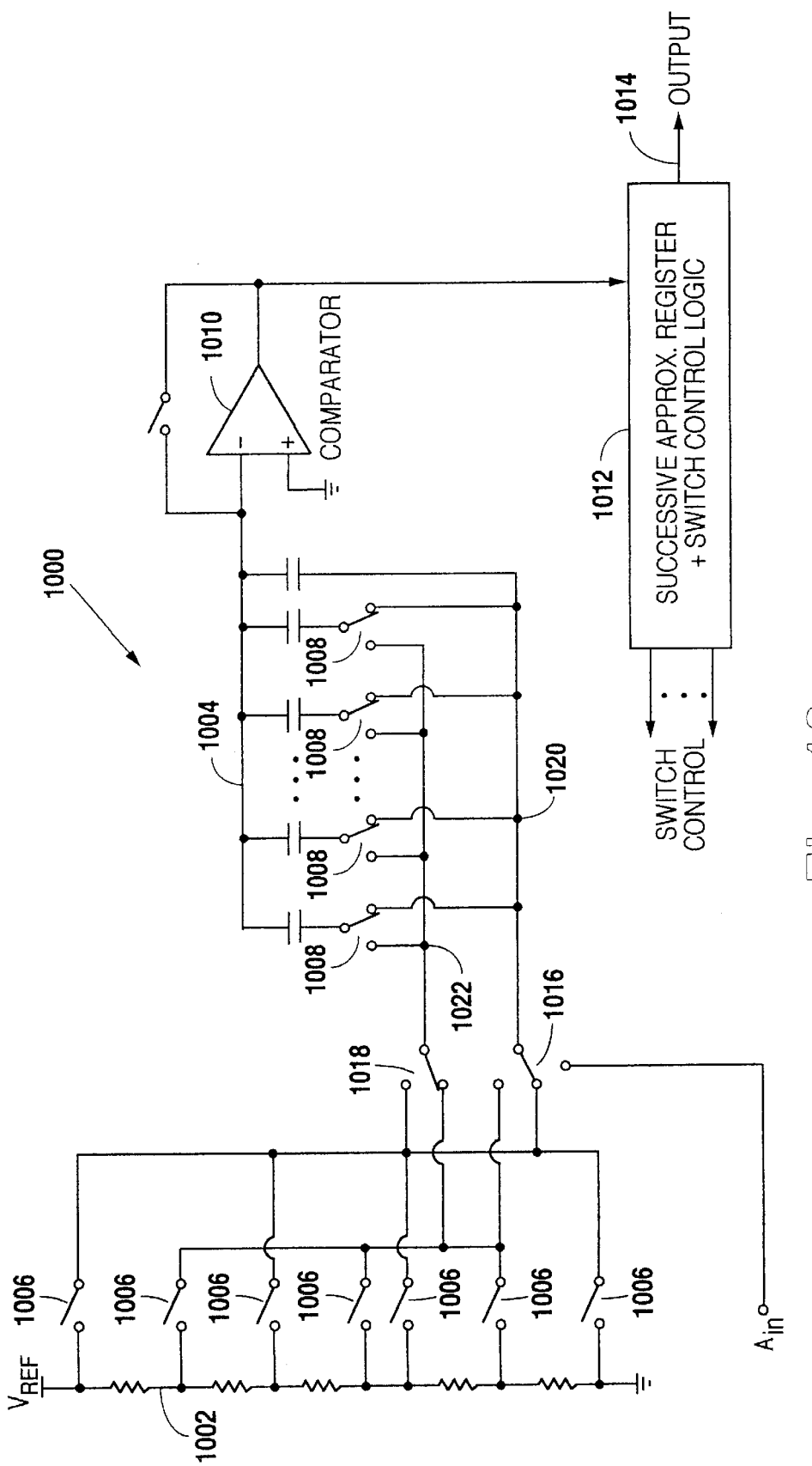
FIG. 10 illustrates a prior art switched resistor array and capacitor array ADC.

Another type of successive approximation ADC which may be utilized in the circuits of FIGS. 2A–2D in combination with the programmable gain preamplifier disclosed herein is a switched resistor and capacitor array ADC (an "R-C array ADC"). As shown in FIG. 10, a resistor and capacitor array ADC may include a resistor array such as the resistor string 1002 and a capacitor array 1004. A first set of switches 1006 and a second set of switches 1008 are provided between the two arrays. The resistor array may be used to obtain the MSBs and the capacitor array used to obtain the LSBs. An analog input Ain is also provided. A comparator 1010 provides a comparison output to a register and control logic block 1012 which provides a digital output 1014. In operation, the R-C array ADC 1000 is first configured to sample the Ain voltage by connecting switch 1016 to the Ain voltage and the capacitors to node 1020 so that the input voltage may be stored on the capacitor array. A successive approximation search may then be performed with the resistor array (resistor string 1002) to find the greatest resistor tap voltage not greater than the analog input voltage. This successive approximation search determines the MSBs of the digital output. The ends of the resistor segment defined by the previous step may then be coupled to nodes 1020 and 1022 through switches 1006, 1016 and 1018. The capacitor array may then be switched in a successive approximation sequence. The sequence of the comparator outputs corresponds to the digital code of the analog input. The operation of a R-C array ADC is described in more detail in Fotouhi, "High-Resolution Successive Approximation Analog To Digital Conversion Techniques In MOS Integrated Circuits" Dissertation, University of California, 1980, p. 86–93, the disclosure of which is incorporated herein by reference.

As mentioned above with reference to FIGS. 2A–2D, the systems of FIGS. 2A–2D may process an analog input 202 (Ain) to provide a digital output 216. A digital domain predictor may determine a gain level G and an analog input estimation Ain'. The digitally programmable preamplifier 204 may produce an output related to G(Ain–Ain'). An ADC may then convert the preamplifier output to a digital output 216. The ADC's described herein are meant to be exemplary circuits, and the system 200 may utilize other ADCs.

The closer the estimated analog signal Ain' is to the actual analog input Ain the smaller the difference Ain–Ain' will be, and thus, the more gain G that may be applied without saturating (or overranging) the ADC. By providing more gain to the signal difference, the difference may be raised more above the ADC noise level. Thus, if the estimation Ain' of the Ain 202 signal is relatively accurate, subtracting the estimated signal will allow for increased gain in front of the ADC, and thus, result in an improved dynamic range at the ADC output.

One method to obtain an accurate estimate of the analog input Ain signal is to perform a first conversion (or estimation conversion) of the Ain input signal. Then, using the estimation conversion of the Ain input signal an estimation signal Ain' may be determined. The estimation signal Ain' may then be utilized to perform a second conversion (or main conversion) of the G(Ain–Ain') preamplifier output. More particularly, in one embodiment an estimation conversion of the analog input signal Ain may be performed with the preamplifier gain G=1 (i.e., the preamplifier may be bypassed). The ADC may then convert Ain to determine a digital output Dout. Based upon the Dout value, a digital domain predictor may then produce an Ain' estimation. The preamplifier may then be digitally programmed for the appropriate gain and estimation input voltage settings. The second or main conversion may then be performed utilizing the gain and estimation input voltage settings to provide a full resolution analog to digital conversion representing a conversion of G(Ain–Ain').

Figure 11A:
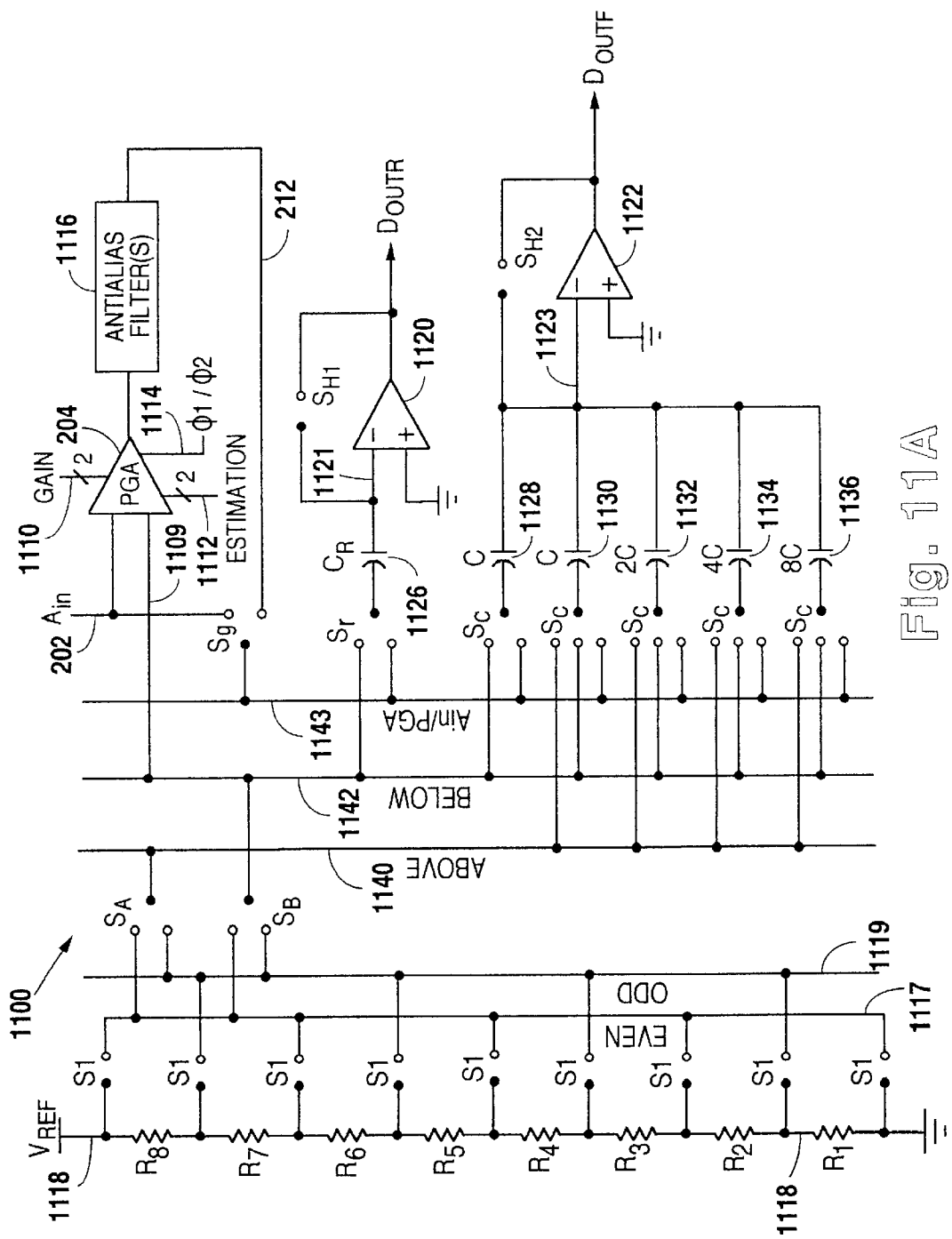

As mentioned above, a variety of ADCs may be utilized to convert the G(Ain–Ain') term. One such ADC is an R-C array ADC which has a rough and fine comparators. FIG. 11A illustrates one exemplary R-C array ADC having rough and fine comparators. As shown in FIG. 11A, a programmable gain preamplifier block 204 and the R-C array ADC 1100 are provided. The programmable gain preamplifier 204 may be an amplifier configured as disclosed above. The programmable gain preamplifier 204 may receive digital inputs including gain signals 1110 and estimation signals 1112 (utilized to configure the preamplifier switches to the desired gain and estimation values as described above). The programmable gain preamplifier 204 may also receive a two phase chopper signal 1114. An antialias filter 1116 receives the programmable gain preamplifier output. The techniques disclosed herein do not require an antialias filter between the preamplifier and the ADC, and alternatively, the filter may be considered to be functionally a part of either the preamplifier block or the ADC block.

The R-C array ADC 1100 includes a resistor array and a capacitor array. The resistor array may include the resistor string 1118. As discussed in more detail below, the resistor string 1118 may be a stand alone resistor string dedicated to the ADC 1100, or alternatively, may be a resistor string that is shared with the programmable gain preamplifier 204. Thus, for example, resistor string 1118 and resistor string 314 of the programmable gain preamplifier 204 may be the same resistor string. Though the resistor string may be shared, the discussion of the operation of the ADC herein will be with reference to figures such as FIG. 11A which shows the resistor string outside of the programmable gain preamplifier for clarity and understanding of the ADC functionality. The capacitor array may include capacitors 1126, 1128, 1130, 1132, 1134 and 1136. Capacitor 1126 may be a sampling capacitor having a capacitance Cr. Capacitors 1128–1136 may be binary weighted capacitors having capacitances of C, C, 2C, 4C, and 8C respectively as shown in the figure. A rough comparator 1120 has an inverting input 1121 provided from the rough sampling capacitor 1126 and provides a rough digital output Doutr. A fine comparator 1122 has an inverting input 1123 connected to the capacitors 1128–1136 and provides a fine digital output Doutf. For ease of illustration, the R-C array shown in FIG. 11A is a three bit resistor array and a two bit capacitor array. In one embodiment, the resistor string may be a six bit resistor string and the capacitor array may be a 10 bit capacitor array.

Switch Sg selectively provides either the analog input Ain 202 or an amplified output 212 as an input to the ADC 1100. Thus, both the programmable gain preamplifier 204 and the ADC 1100 may receive the analog input signal Ain 202. If no gain of the analog input signal Ain 202 is desired (i.e., gain G=1), the switch Sg may connect the Ain 202 signal to the Ain/PGA line 1143. If a gained input signal is desired to be provided to the ADC, the switch Sg may be configured to connect the amplified output 212 to the Ain/PGA line 1143.

The switches S1 are provided between the resistor string 1118 and two voltage bus lines 1117 and 1119. Switches S1 may be the same switches S1 as shown in FIGS. 3A–3F and 4A–4B. Switches Sa and Sb may selectively apply the voltage on lines 1117 and/or 1119 to an above voltage line 1140 and a below voltage line 1142. Switch Sr selectively connects the rough sampling capacitor 1126 to either the Ain/PGA line 1143 or the below line 1142. Switches Sc selectively connect the capacitors 1128–1136 to either the Ain/PGA line 1143, the below line 1142, and/or the above line 1140 as shown. Switches Sh1 and Sh2 provide feedback around the comparators 1120 and 1122 respectively. Switches Sh1 and Sh2 may be closed when a voltage is being sampled onto the capacitor array or the rough sampling capacitor.

The operation of the R-C array ADC 1100 will be described with reference to FIGS. 11B–11G and with reference to an input to the ADC provided from the amplifier PGA output 212 (switch Sg configured to provide the output 212 to the Ain/PGA line 1143). It will be recognized that the ADC operation described may also apply to the configuration which samples the Ain 202 input such as shown in FIG. 11H.

In operation, the R-C array ADC 1100 is first configured to sample the ADC input voltage provided on the Ain/PGA line 1143. After the acquisition of the input signal, the resistor string array is utilized to determine the MSBs using the rough comparator 1120. After the MSBs are determined with the resistor string and the rough comparator, a retest of the MSBs is performed with the fine comparator 1122 to confirm the MSB determination of the rough comparator. The retest cycle allows the MSBs to be reconfirmed or modified by the result of a comparator that has not experienced the large overdrives that the rough comparator may experience. After the retest, the even line 1117 and odd line 1119 may be coupled above and below the resistor that corresponds to the MSB voltage. The above and below voltages may then be utilized when the capacitor array is switched in a successive approximation sequence to determine the LSBs. The sequence of comparator outputs corresponds to the digital codes.

Figure 11B:
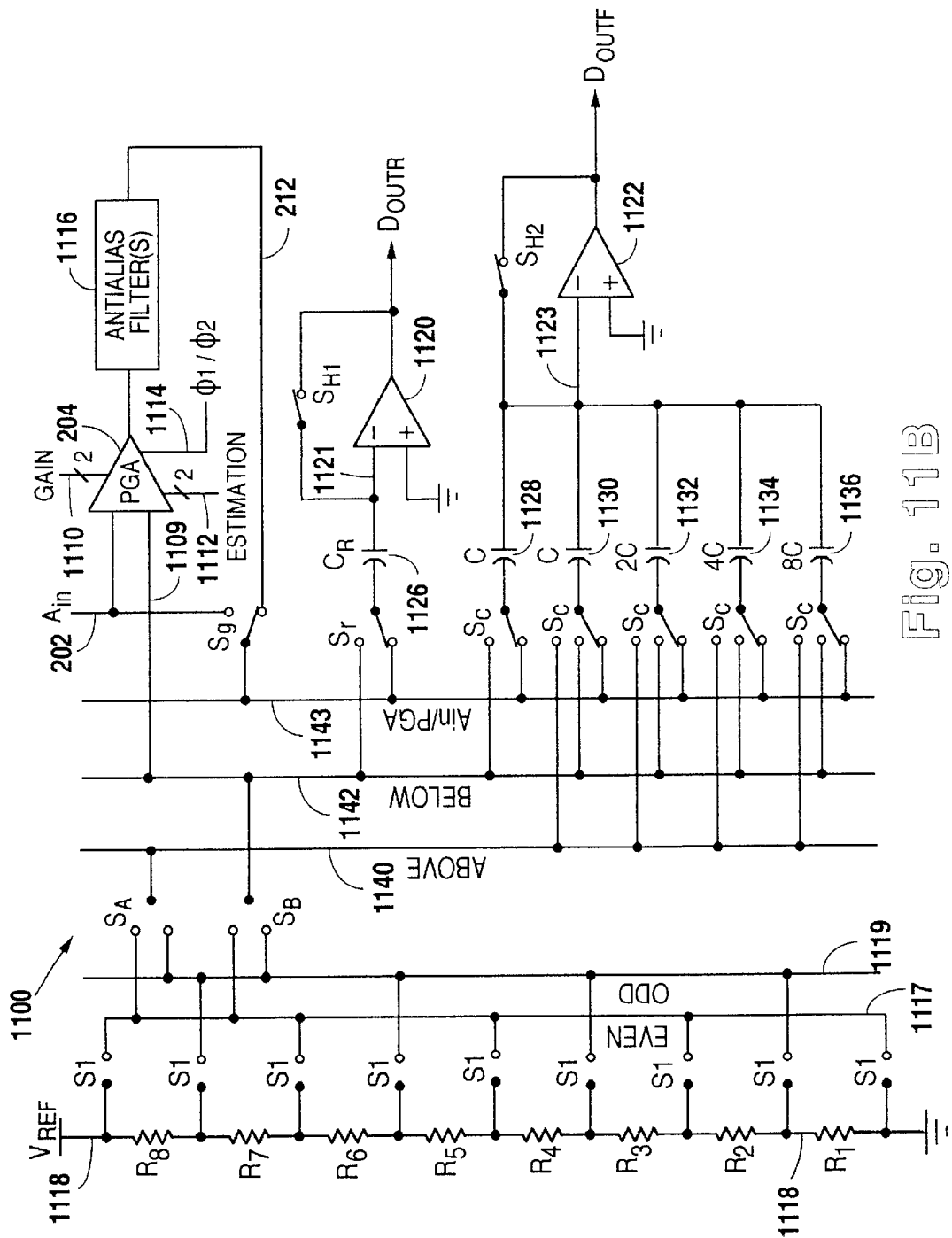
Figure 11C:
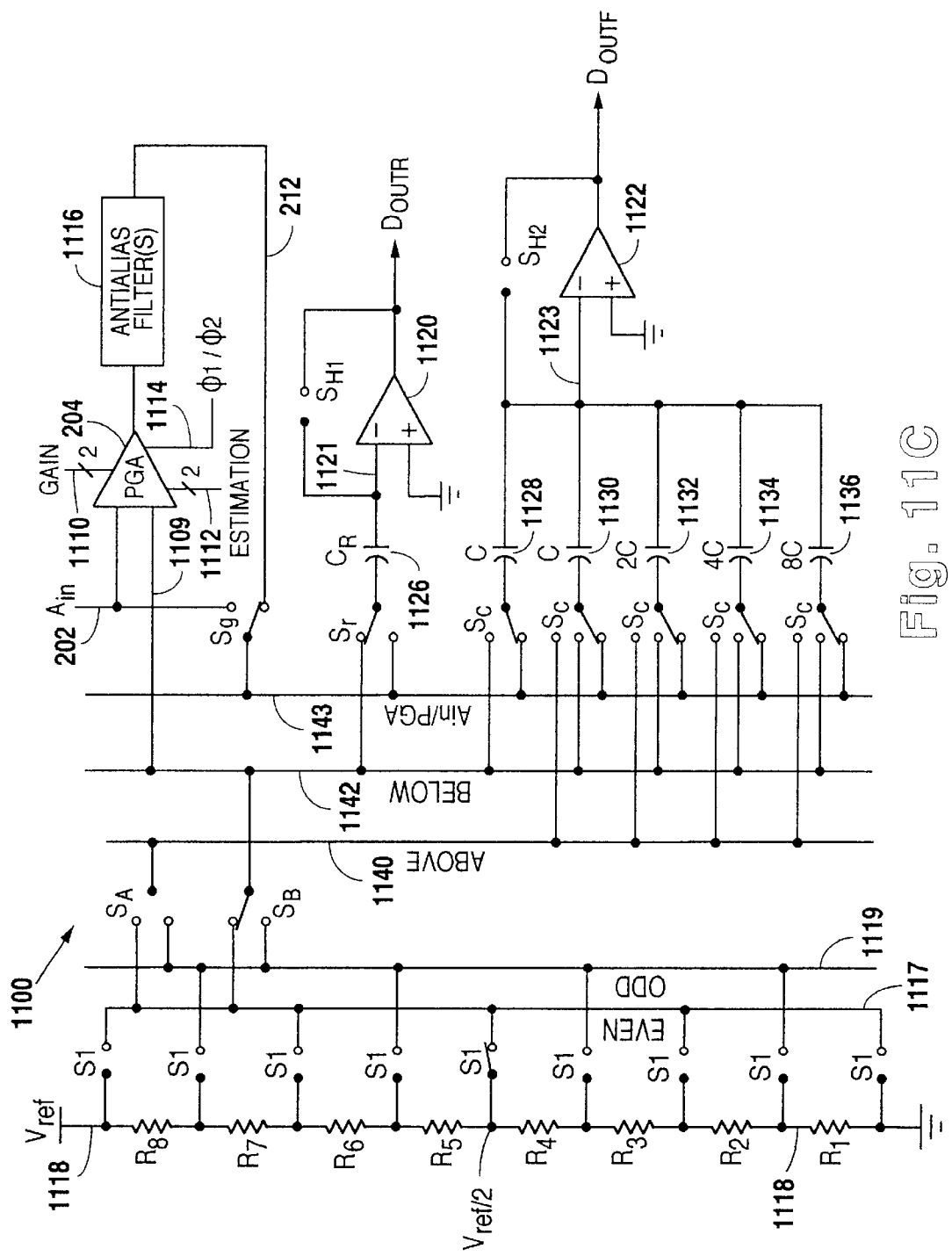
Figure 11D:
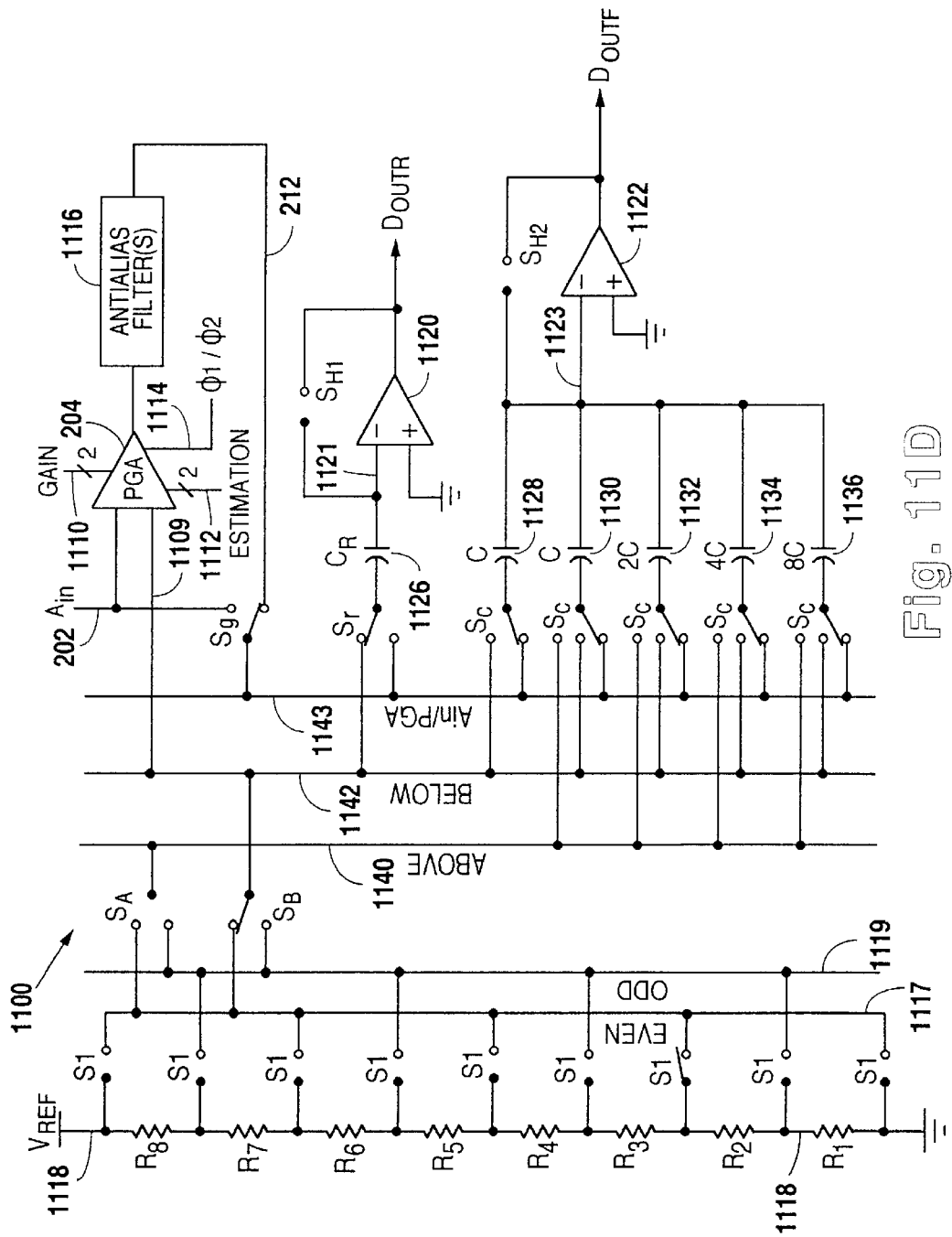
Figure 11E:
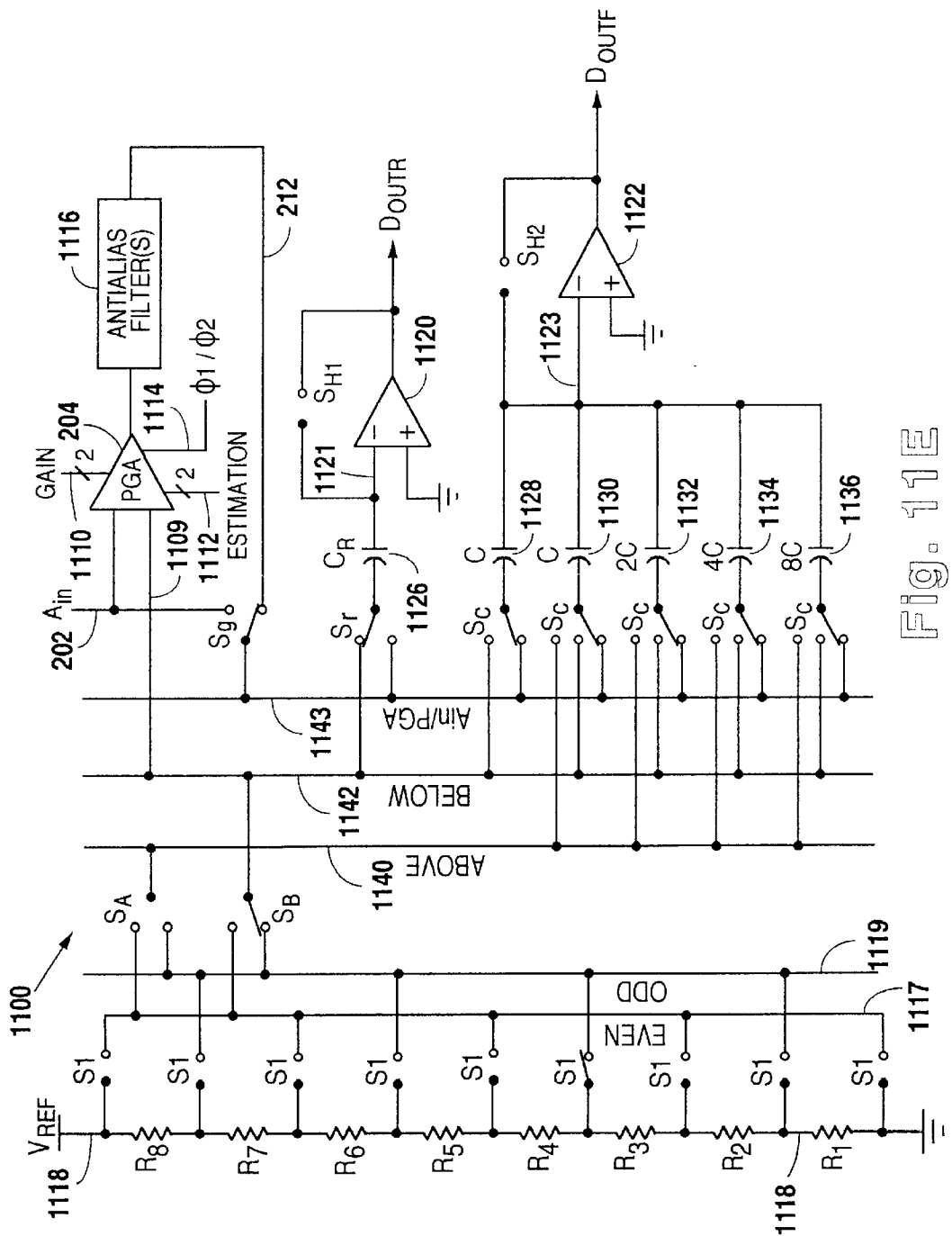

The operations described above are shown in an illustrative example in FIGS. 11B–11G. FIGS. 11B–11G illustrate a conversion in which the analog voltage to be converted lies at a voltage level between the top and bottom of the resistor R2 of the resistor string 1118 (an MSB code of 001 corresponding to a voltage below Vref/4 and above Vref/8). In order to demonstrate the retest concept, it will also be assumed that the ADC erroneously selects the MSB code 010 (i.e., a voltage corresponding to between the resistor R3 top and bottom taps). As shown in FIG. 11B, the amplified output 212 of the preamplifier is provided as the ADC input and is acquired onto the rough sampling capacitor 1126 and the fine capacitor array 1128–1136. Switches Sh1 and Sh2 open to sample the input and the ADC is configured to test the MSB with the rough comparator 1120 as shown in FIG. 11C. As shown in FIG. 11C, the MSB test is provided by testing the Vref/2 voltage of the resistor string 1118 and applying that voltage to the rough comparator 1120 through switches Sb and Sr. Since Vref/2 is above the voltage on the Ain/PGA line 1143, the inverting input of the rough comparator 1120 goes positive and the rough comparator output Doutr=0. The MSB-1 test is shown in FIG. 11D. The rough comparator output for such a test with the given input should be Doutr=0. As mentioned above, for demonstrative purposes it will be assumed that the rough comparator output is erroneously Doutr=1 (due to comparator memory or other errors). The configuration for the MSB-2 bit (the last of the MSBs determined with the resistor array) is shown in FIG. 11E and yields a rough comparator output of Doutr=0.

Figure 11F:
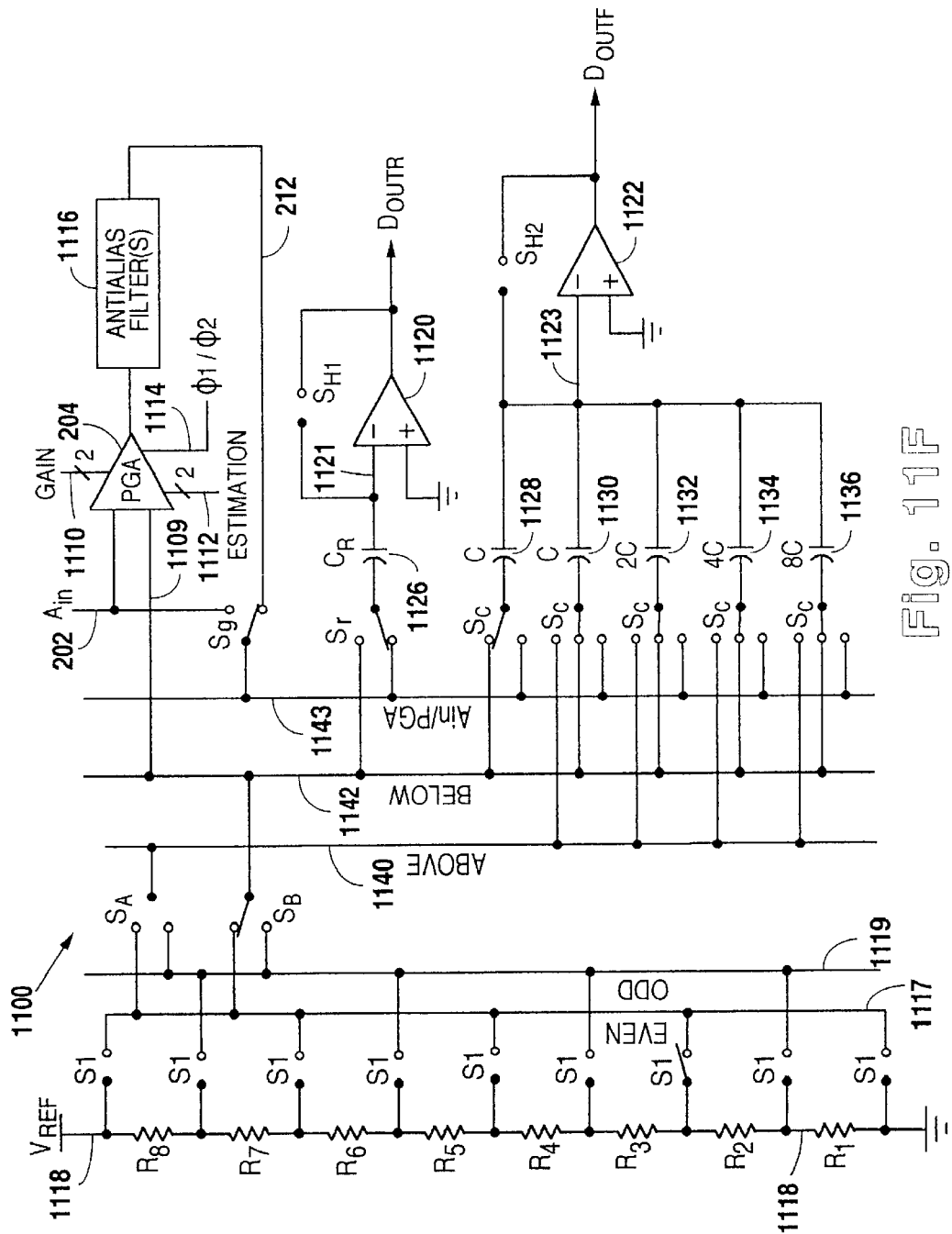
Figure 11H:
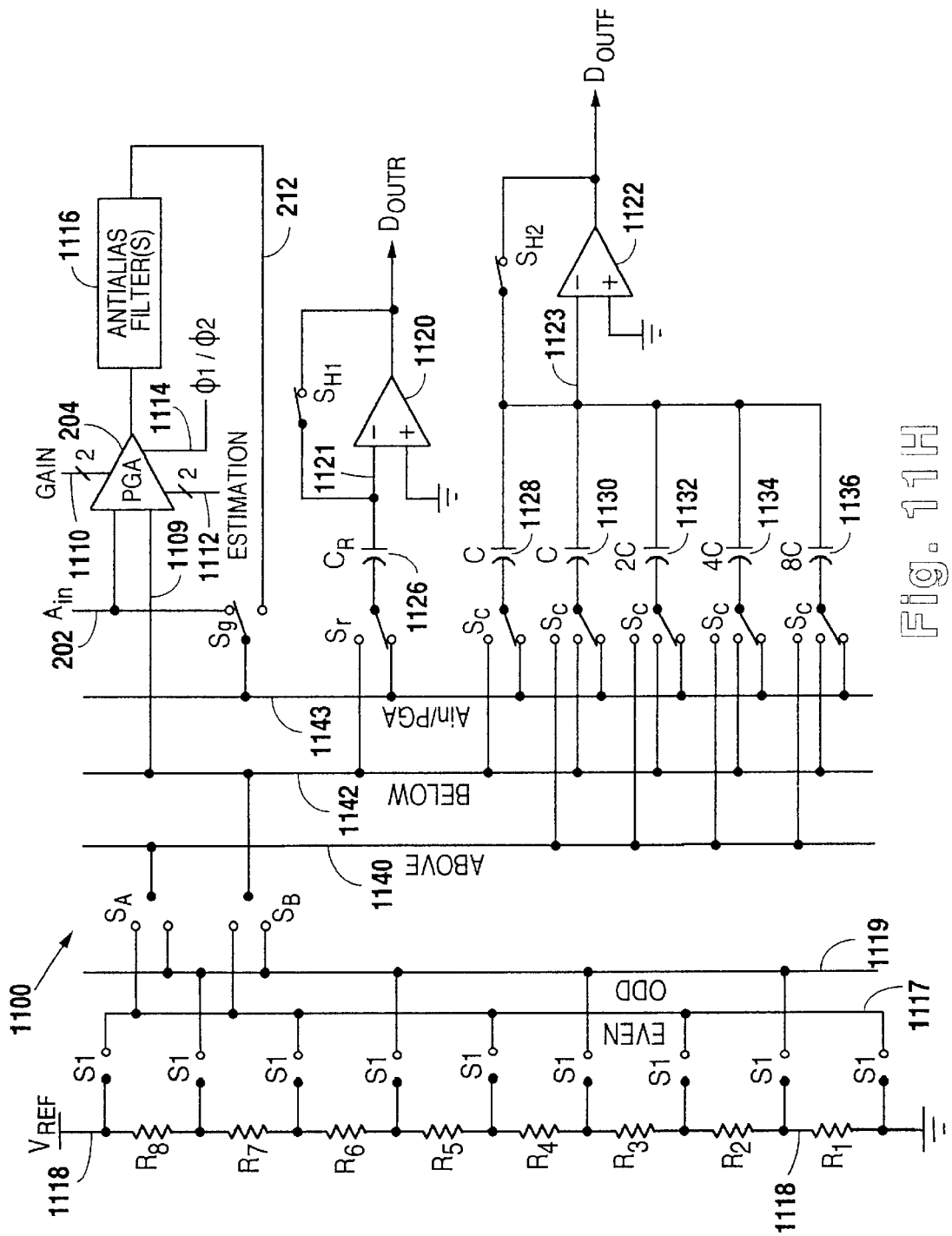

The retest configuration which tests the MSBs determined with the rough comparator 1120 is shown in FIG. 11F. As shown in FIG. 11F, only the fine comparator 1122 is utilized in the retest and during the retest (and all subsequent LSB tests) the rough comparator is returned to tracking the Ain/PGA line 1143. During the retest cycle, the voltage level that is determined to be just below the analog input being converted as determined with the rough comparator cycle is tested. As shown in FIG. 11F, the retest voltage is the voltage just below resistor R3 (corresponding to the voltage just below the erroneous 010 determination). The selected voltage of the resistor string is then applied through switches Sd and Sc to the capacitors 1128–1136 as shown. The output of the fine comparator 1122 will then be Doutf=0, indicating a mistake in the rough comparator operation. In the case of an error determination, the determined value of the MSBs may then be decremented to provide a retest value of the MSBs.

The voltages from the resistor string above and below the MSBs as determined by the retest may then be coupled to the capacitor array coupled to the fine comparator. As shown in FIG. 11G, the voltages above and below the resistor R2 may be provided to the above line 1140 and below line 1142 respectively through switches Sa and Sb. The LSBs may then be determined successively by successively switching the capacitors 1128–1136 with the configuration of FIG. 11G until the LSB is determined.

FIG. 11H shows the R-C array ADC 1100 coupled to the Ain 202 analog signal in order to sample the analog input without any gain. When it is desirable to convert the analog input with any gain, the remaining steps for operation of the ADC when an amplified input is provided will remain the same as described above with respect for a conversion of the Ain 202 input (except with the switch Sg coupled to the amplified output line 212). When the Ain 202 signal is being sampled directly (bypassing the preamplifier so gain G=1) for the purpose of determining an estimated signal Ain', the ADC operation may be modified. In particular, the estimated signal Ain' may be provided merely to determine the proper selection of a tap in the preamplifier resistor string 314 (a six bit resolution resistor string in the examples herein). Thus, the full sixteen bit accuracy of the ADC 1100 is not needed and only the six MSBs may be needed to determine which tap to select for the Ain' estimate. The conversion using the ADC 1100 may therefore be halted when the six MSBs (i.e., the number of MSBs corresponding to the resolution of the resistor string 314 of the preamplifier) are determined. It will be recognized that if the resistor string 314 which provides Ain' has a resolution higher than six bits then additional MSBs should be determined by the ADC 1100. When chopper stabilization techniques are utilized in the preamplifier, the ADC may be operated so that a full conversion is performed for each of the two chop phases and the ADC output digital words for each phase may be averaged to produce the final ADC output.

It will further be noted that the use of a rough and fine comparator is not limited to an R-C array ADC, but rather, may also be utilized with a capacitor array ADC such as discussed above with reference to FIGS. 8 and 9. In such a system using a capacitor array, a resistor string may be coupled to the preamplifier input (such as resistor string 314 of FIGS. 3A and 4A), a capacitor array may be utilized in the ADC circuitry, and the ADC circuitry may include both rough and fine comparators. An exemplary capacitor array ADC using rough and fine comparators is shown in U.S. Pat. No. 5,006,853 to Kiriaki, the disclosure of which is incorporated herein by reference.

As mentioned above, the resistor string 1118 of the R-C array ADC 1100 may be implemented as the same resistor string as resistor string 314 of the programmable gain preamplifier 204. Thus, the programmable gain preamplifier and the ADC may have a shared resistor string. In operation, the switches S1 and Sb may be configured to couple the resistor string 1118 to the programmable gain preamplifier input 1109 prior to the sampling of the amplified output 212 shown in FIG. 11H. A protection network may be built into the programmable gain preamplifier 212 so that after sampling occurs and as conversion process proceeds, the input 1109 of the preamplifier will not swing as the resistor string 1118 tap switches are changed.

The resistors utilized with the ADC (whether shared or not) may be implemented in a polysilicon layer or in a laser trimmable layer such as a ni-chrome layer. In either case, the contacts to the resistor string may be removed from the resistor string current path according to the techniques discussed above. In a polysilicon embodiment, the temperature coefficients of the resistor ratios may provide a sufficient accuracy (if calibrated as described below) such that over a temperature range of 25° C. to 125° C. the ADC integral nonlinearity (INL) error may be in the range of a few ppm of the ADC full scale.

Though the temperature drift of the resistors of the resistor strings disclosed herein (for example resistor strings 314, 316 and 1118) may be low, the actual resistor values may not be highly accurate. These inaccuracies will provide errors in the gain, estimation input, and/or the ADC INL error. Thus, it is desirable to calibrate the resistor strings with a calibration system. One calibration method is to utilize a highly linear ADC to calibrate the resistor strings. The ADC may be, for example, a metal-metal capacitor delta sigma modulated ADC, such as shown for example in U.S. Pat. No. 4,943,807 to Early et al., the disclosure of which is incorporated herein by reference. Metal-metal capacitors provide improved linearity and the large parasitic capacitance associated with such capacitors negated since the calibration delta sigma ADC is relatively slow and insensitive to parasitics. The delta sigma modulator may be autozeroed or chopped to provide improved long-term stability, offset and 1/f noise, and the modulator's digital filter may be designed to reject interference coupled into the delta sigma ADC at ac line frequencies and their harmonics.

Figure 12:
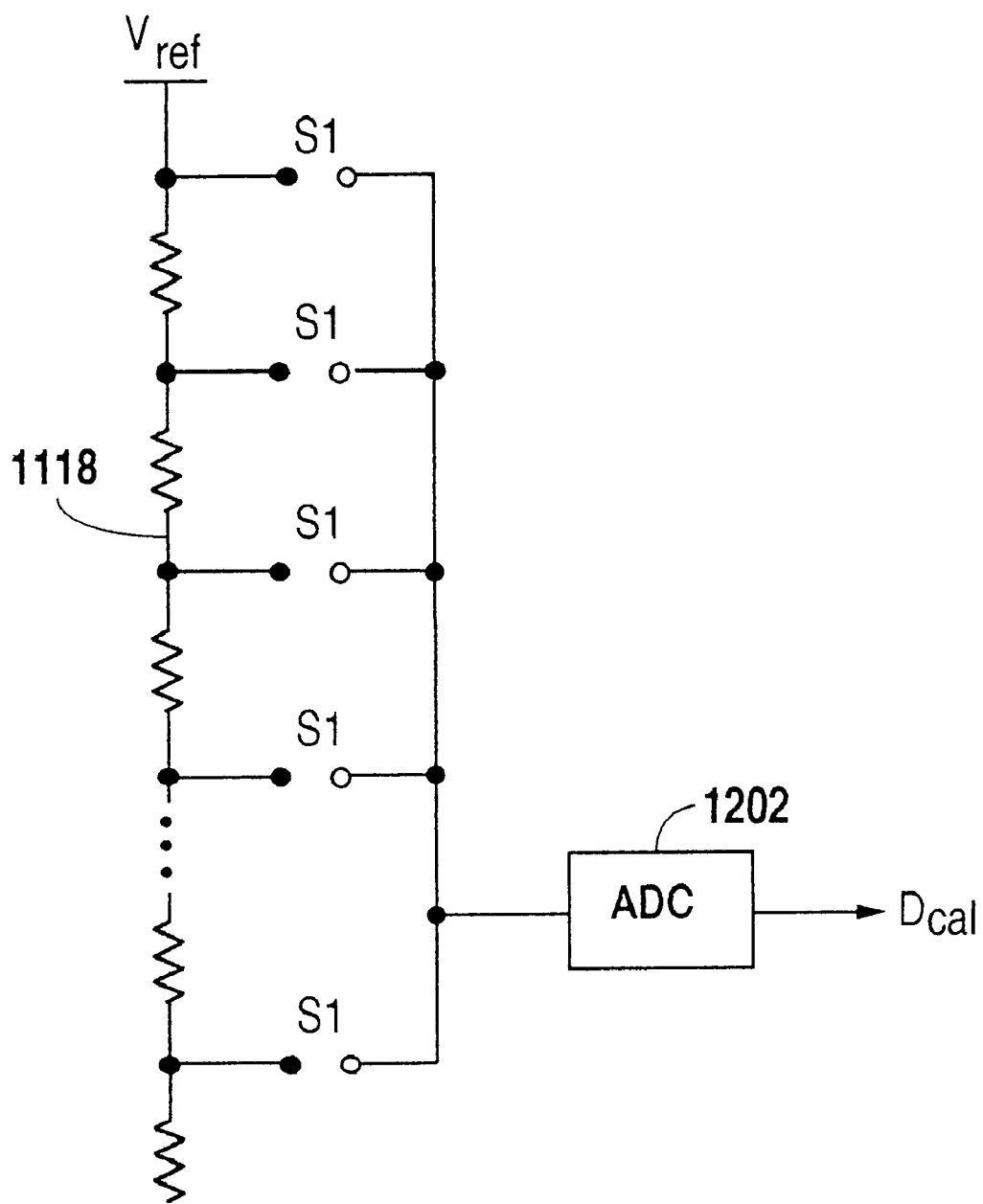
FIG. 12 illustrates a method for using a calibration ADC to calibrate a resistor string.

In one embodiment, a six bit resistor string may be accurately calibrated utilizing a 20 bit ADC. The calibration concept may be seen with reference to FIG. 12. As shown FIG. 12, the exemplary resistor string being calibrated is the resistor string 1118. The highly linear calibration ADC 1202 may sample the tap voltages at each tap of the resistor string by selectively closing one of the switches S1 to provide a digital output value Dcal corresponding to the tap voltage. The results of the calibration need not be utilized to change the actual values of the resistors of the resistor string, rather the output results of the overall system may be digitally post corrected by the knowing the calibration data. For example, if the actual voltages of the resistor strings 314 and the resistor ratios of the resistor string 316 of the programmable gain amplifier are known, then a post correction of the system output when the input signal is amplified may be accomplished since the effect of the resistor inaccuracies on the G(Ain−Ain') function may be determined. Likewise, knowing the inaccuracies of the resistor string 1118 will allow for a post conversion correction of the ADC output. In the case when the resistor strings 314 and 1118 are shared, a single calibration will therefore calibrate the resistors of the preamplifier input and the ADC resistor array. The same calibration ADC 1202 may be utilized to calibrate the each resistor string 314, 316, and/or 1118. Though the resistor string 316 may be directly calibrated by the calibration ADC 1202, the resistor ratios of the resistor string 316 may alternatively be inferred. In particular, the resistor ratios of resistor string 316 may be inferred by calibrating each tap of the resistor string 314 and measuring the OPAMP3 output when a known input is provided to the Ain 202 input (the known input may be another of the taps of the resistor string 314). Thus, a single highly accurate calibration ADC may be utilized to calibrate all of the resistor strings of the system. The gain and offset of the calibration ADC itself may be measured immediately prior to calibrating a resistor string or immediately prior to measuring the voltage of each tap of the resistor string. By using a highly linear ADC 1202 (for example a metal-metal capacitor delta sigma ADC), the ADC 1202 may be the linearity reference of the system. The ADC 1202 may compensate for both initial component errors and aging of components over time.

Though shown as a separate ADC, the ADC 1202 may be the same ADC that is used for converting the analog input signal Ain to a digital output. For example, the resistor string 314 may be calibrated with the ADC 1100 of the figures or if a capacitor array ADC is utilized for Ain data conversions, the capacitor array ADC may be utilized to calibrate the resistor string. However, using a switched R-C array ADC or a switched capacitor array ADC in place of a separate calibration ADC 1202 may result in a lower calibration performance since the switched array ADCs may have less linearity.

The resistor string may also be calibrated by providing accurately known inputs to the Ain 202 input of the ADC 1100 and coupling those inputs to the Ain/PGA line 1143 (no gain applied). The accurately known inputs may then be converted by the ADC 1100. The ADC outputs created may then be compared to ADC outputs generated when applying voltages from the resistor string 1118 to the Ain/PGA line 1143. A comparison of the ADC outputs when using the resistor string and the ADC outputs when using the accurately known voltages may then be used to create a calibration table for the resistor string that indicates the resistor value errors. This technique may also be utilized to calibrate a preamplifier resistor string such as resistor string 314. Moreover, this technique is not limited to R-C array ADCs, but rather a capacitor array ADC may be used in this manner to help calibrate a resistor string in other circuitry (such as the resistor string 314 of the preamplifier). The calibration table may then be used to post conversion correct for errors in a resistor string whether that resistor string is in a preamplifier, the ADC or both. Utilizing accurate known input voltages, may however, require periodic user recalibrations.

As mentioned above, the calibration data generated by calibrating the resistor strings may be utilized to post conversion correct the output data of the ADC 1100. Such post corrections, though may result in mapping uncorrected ADC data and corrected ADC data in a manner that generates missing digital output codes. For example, a sixteen bit ADC 1100 having a six bit resistor array and a ten bit capacitor array will segment each voltage of the resistor string into 1024 segments. A table of exemplary mapping for some resistor inaccuracies in the resistor string 1118 is shown below. The example below illustrates potential errors that may occur if two adjacent resistors Rz and Rz+1(the resistors being near midscale) have +5% and −5% errors in their resistance.

|  | $V_{in}/V_{ref}$ | Uncorrected ADC data | | Corrected data | |
| --- | --- | --- | --- | --- | --- |
|  | 0.531250 | 34816 | | 34816 | |
| Rz < | | | > 1024 | | > 1075 |
|  | 0.514844 | 33792 | | 33741 | |
| Rz + 1 < | | | > 1024 | | > 973 |
|  | 0.500000 | 32768 | | 32768 | |

In the table, ADC exemplary data for voltages in two resistor ranges, Rz and Rz+1 are shown. For inputs in the Rz range, 1024 uncorrected ADC data output values map into 973 corrected data output values. Thus no digital codes are missing in this range as at least one uncorrected value exists for each corrected value. However, in the Rz+1 range 1024 uncorrected ADC data output values map into 1075 corrected data output values leaving 51 missing codes from the corrected ADC output. The potential for missing codes may be lessened by adding one extra bit of resolution to the capacitor array (i.e. an extra capacitor). With the example ten bit capacitor resolution, an extra capacitor may therefore be utilized, however, the uncorrected data may still be mapped to 10 bit resolution (the number of digital codes per resistor segment=1024±resistor errors). This should assure that no missing codes in the corrected ADC data.

The techniques described herein simulate the use of a highly accurate and highly stable resistor string. Though the resistor strings utilized herein may not be inherently highly accurate (for example a six bit string which has resistor value errors of ±5%), the resistor string may be calibrated to a high level of accuracy (for example twenty bit accuracy). Moreover, utilizing techniques which place the resistor string contacts out of the current path provides highly stable resistor strings having very little drift. Using the calibration data for system level corrections at the output provides a system output accuracy that simulates the use of a much higher accuracy resistor string.

Because a highly stable and highly accurate resistor string may be achieved by utilizing the concepts described herein (locating contacts out the resistor string current path and calibrating the resistor string), the calibrated resistor string may be utilized to calibrate the ADC 1100 or another type of ADC used as the main ADC in place of the ADC 1100, such as for example, a capacitor array ADC. In such circumstances, the voltages at the various resistor string taps may be applied as an input to the ADC. Knowing the calibration factors for the resistor string, and thus the actual voltages at each tap, the ADC output codes may be analyzed for each voltage of the resistor string. From these output codes a calibration table may be created for the ADC itself.

The offset of the rough and fine comparators 1120 and 1122 may change as a result of overdrives the comparator experiences. This "memory" effect may result in DNL errors even if an additional capacitor is added to the capacitor array. The memory effect may be lessened by using comparators having p-channel transistor input devices rather than n-channel input devices.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed:

1. An analog to digital conversion system, comprising:
   a first analog to digital conversion path utilizing a first estimation analog signal, the first estimation analog signal being an estimate of an analog signal to be converted; and
   a second signal path providing a backup digital signal.

2. The system of claim 1, the first analog to digital conversion path using a gain that is greater than the gain used in the second signal path.

3. The system of claim 2, wherein the second signal path is utilized when an error event occurs in the first analog to digital conversion path.

4. The system of claim 3, wherein the error event is an overrange event.

5. The system of claim 1, an input to a first analog to digital converter in the first analog to digital conversion path being a function of the analog signal and the first estimation analog signal.

6. The system of claim 1, the input signal being related to a gained difference between the analog signal and the first estimation signal.

7. The system of claim 6, the second signal path utilizing a second estimation analog signal.

8. The system of claim 1, the first analog to digital converter signal path and the second signal path sharing at least a portion of an analog to digital converter.

9. An analog to digital conversion system, comprising:
   a main analog to digital converter receiving an input signal, the input signal being generated at least in part by utilizing an estimation signal; and
   a backup analog to digital conversion path.

10. The system of claim 9, further comprising a preamplifier coupled to the main analog to digital converter.

11. The system of claim 10, the preamplifier using a gain that is greater than the gain used in the backup analog to digital conversion path.

12. The system of claim 9, wherein the backup analog to digital conversion path is utilized when a main analog to digital overrange event occurs.

13. The system of claim 9, the input signal being related to a gained difference between an analog signal and the estimation signal, the estimation signal being a function of the analog signal.

14. The system of claim 9, the backup analog to digital conversion path utilizing a second estimation analog signal.

15. The system of claim 9, the backup analog to digital conversion path being unity gain.

16. An analog to digital conversion system configured to convert an analog signal, comprising:
    a main analog to digital converter;
    an estimation digital to analog converter, the estimation digital to analog converter providing an estimation signal that is a function of the analog signal, an input to the main analog to digital converter being a function of the estimation signal; and
    a backup analog to digital converter.

17. The system of claim 16, wherein at least a portion of the main analog to digital converter is shared with the backup analog to digital converter.

18. The system of claim 16, further comprising an estimation analog to digital converter, wherein at least a portion of the estimation analog to digital converter is shared with the main analog to digital converter and/or the backup analog to digital converter.

19. A method for analog to digital conversion, comprising:
    estimating an analog input;
    providing an amplified signal that is a function of the analog input signal and the estimate of the analog input;
    converting the amplified signal to produce a first conversion result; and
    providing a backup conversion path to produce a second conversion result.

20. The method of claim 19, wherein the gain value utilized to provide the amplified signal is greater than the gain value utilized in the backup conversion path.

21. The method of claim 19, further comprising utilizing the backup conversion path when the first conversion result is overranged.

22. The method of claim 19, the amplified signal being related to a gained difference between the analog signal and the first estimation signal.

23. A method for analog to digital conversion, comprising:
    estimating an analog signal to provide an estimation signal;
    generating a signal that is a function of the analog input signal and the estimate of the analog input;
    utilizing the signal when generating a main conversion result; and
    generating a backup conversion result.

24. The method of claim 23, further comprising:
    utilizing a first gain value for generating the main conversion result; and
    utilizing a second gain value for generating the backup conversion result.

25. The method of claim 24, wherein at least one of the first and second gain value is variable.

26. The method of claim 24, wherein the first gain value is greater than the second gain value.

27. The method of claim 24, wherein the second gain value is unity.

28. The method of claim 23, wherein the backup conversion result is utilized when an overrange event occurs while generating the main conversion result.

29. An analog to digital conversion system, comprising:
    an analog input node and a digital output node;
    a preamplifier;
    a first analog to digital converter, the preamplifier provided in a signal path between the analog input node and the first analog to digital converter, and the first analog to digital converter provided in a signal path between the preamplifier and the digital output node;
    an estimation signal related to an analog signal to be converted by the analog to digital conversion system, an amplified signal of the preamplifier being related to the analog signal and the estimation signal; and
    a backup analog to digital conversion path coupled to the analog input node, the backup analog to digital conversion path providing a backup digital output.

30. The system of claim 29, the backup analog to digital conversion path having a gain circuit, the gain of the gain circuit being less than or equal to the gain of preamplifier.

31. The system of claim 29, the backup analog to digital conversion path providing unity. gain.

32. The system of claim 29, further comprising a digital to analog converter, the estimation signal being converted to an analog estimation signal by the digital to analog converter.

33. An analog to digital conversion system, comprising:
    an analog input node receiving an analog input signal and a digital output node;
    an estimation signal;
    a preamplifier;
    a first analog to digital converter coupled to the preamplifier, an input to the first analog to digital converter being related to a difference between the analog input signal and the estimation signal; and
    a backup analog to digital converter, the backup analog to digital converter coupled between the analog input node and a backup digital output node.

34. The system of claim 33, further comprising a digital to analog converter, the estimation signal being a digital estimation signal, the digital to analog converter converting the digital estimation signal to an analog estimation signal.

35. The system of claim 33, the backup analog to digital converter being within a backup analog to digital conversion path, the backup analog to digital conversion path having gain less than or equal to the gain of preamplifier.

36. The system of claim 33, the backup analog to digital conversion path also receiving the estimation signal, an input to the backup analog to digital converter being related to the analog signal and the estimation signal.

37. The system of claim 33, the backup analog to digital conversion path receiving a second estimation signal, an input to the backup analog to digital converter being related to the analog input signal and the second estimation signal.

38. A method of converting an analog signal to a digital signal, comprising:
    providing the analog signal at an analog input node;
    providing an estimation signal, the estimation signal being an estimate of the analog signal;
    generating an amplified signal with a preamplifier, the amplified signal being related to a difference between the analog signal and the estimation signal;
    utilizing the amplified signal to provide an input to an analog to digital converter; and
    selectively providing a backup digital output signal, the backup digital output signal providing a digital output related to the analog signal.

39. The method of claim 38, wherein the backup digital output signal is selectively provided when an overrange event occurs.

40. A method of converting an analog signal to a digital signal, comprising:

providing the analog signal at an analog input node;

utilizing main estimation conversion circuitry to provide a first digital output signal, the main estimation conversion circuitry including an amplified version of a difference between the analog signal and an estimation signal, the estimation signal being an estimate of the analog signal; and utilizing backup conversion circuitry to provide a backup digital output signal.

41. The method of claim 40, wherein the backup conversion circuitry utilizes the estimation signal.

42. The method of claim 40, wherein the backup conversion circuitry utilizes a second estimation signal.

43. The method of claim 40, wherein a gain of the backup conversion circuitry is less than a gain of the main estimation conversion circuitry.

44. The method of claim 43, wherein the backup conversion circuitry provides the backup digital output signal when the main estimation conversion circuitry has an overrange event.

* * * * *

UNITED STATES PATENT AND TRADEMARK OFFICE
CERTIFICATE OF CORRECTION

PATENT NO. : 6,590,517 B1
DATED : July 8, 2003
INVENTOR(S) : Eric J. Swanson

It is certified that error appears in the above-identified patent and that said Letters Patent is hereby corrected as shown below:

Column 34,
Line 20, please change "unity. gain." to -- unity gain. --.

Signed and Sealed this

Seventh Day of October, 2003

JAMES E. ROGAN
*Director of the United States Patent and Trademark Office*